(12) United States Patent
Liu et al.

(10) Patent No.: US 9,800,094 B2
(45) Date of Patent: Oct. 24, 2017

(54) LOW POWER NANOELECTRONICS

(71) Applicant: The Penn State Research Foundation, University Park, PA (US)

(72) Inventors: Huichu Liu, State College, PA (US); Ramesh Vaddi, Viziangaram (IN); Vijaykrishnan Narayanan, State College, PA (US); Suman Datta, Port Matilda, PA (US); Moon Seok Kim, State College, PA (US); Xueqing Li, State College, PA (US); Alexandre Schmid, Sion (CH); Mahsa Shoaran, St-Sulpice (CH); Unsuk Heo, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 341 days.

(21) Appl. No.: 14/712,182

(22) Filed: May 14, 2015

(65) Prior Publication Data
US 2015/0333534 A1 Nov. 19, 2015

Related U.S. Application Data

(60) Provisional application No. 61/993,126, filed on May 14, 2014.

(51) Int. Cl.
*H01F 37/00* (2006.01)
*H01F 38/00* (2006.01)
*H02J 50/20* (2016.01)
*H02J 5/00* (2016.01)
*H01L 29/739* (2006.01)

(52) U.S. Cl.
CPC .......... *H02J 50/20* (2016.02); *H01L 29/7391* (2013.01); *H02J 5/005* (2013.01)

(58) Field of Classification Search
CPC ........ H01L 29/7391; H02J 5/005; H02J 50/20
USPC ......................................................... 307/104
See application file for complete search history.

(56) References Cited

U.S. PATENT DOCUMENTS

2010/0102887 A1* 4/2010 Takahashi ................. H03F 1/30
330/285

* cited by examiner

*Primary Examiner* — Rexford Barnie
*Assistant Examiner* — Toan Vu
(74) *Attorney, Agent, or Firm* — Buchanan Ingersoll & Rooney PC

(57) ABSTRACT

Disclosed are low power electronic devices configured to exploit the sub-threshold swing, unidirectional tunneling, and low-voltage operation of steep slope-tunnel tunnel field-effect transistors (TFET) to improve power-conversion efficiency and power-efficiency of electrical systems incorporating the TFET as an electrical component to perform energy harvesting, signal processing, and related operations. The devices include a HTFET-based rectifier having various topologies, a HTFET-based DC-DC charge pump converter, a HTFET-based amplifier having an amplifier circuit including a telescopic operational transconductance amplifier, and a HTFET-based SAR A/D converter having a HTFET-based transmission gate DFF. Any one of the devices may be used to generate a RF-powered system with improved power conversion efficiencies of power harvesters and power efficiencies of processing components within the system.

20 Claims, 33 Drawing Sheets

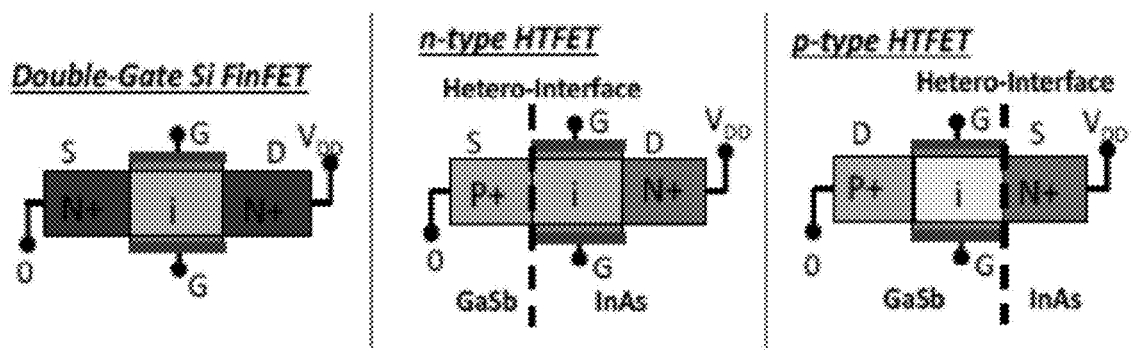
Fig. 1a
(Prior Art)
Fig. 1b
(Prior Art)
Fig. 1c
(Prior Art)
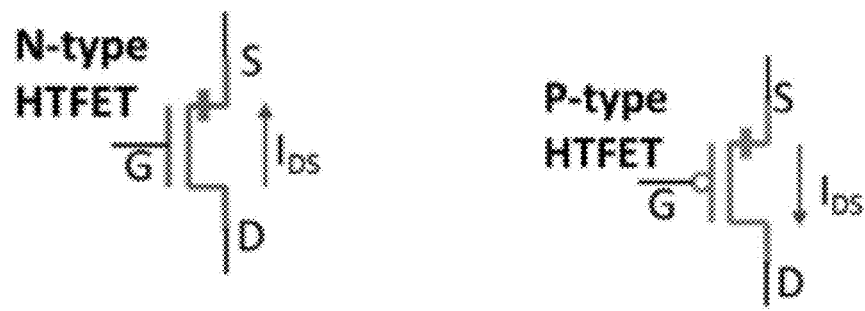
Fig. 2a
(Prior Art)
Fig. 2b
(Prior Art)

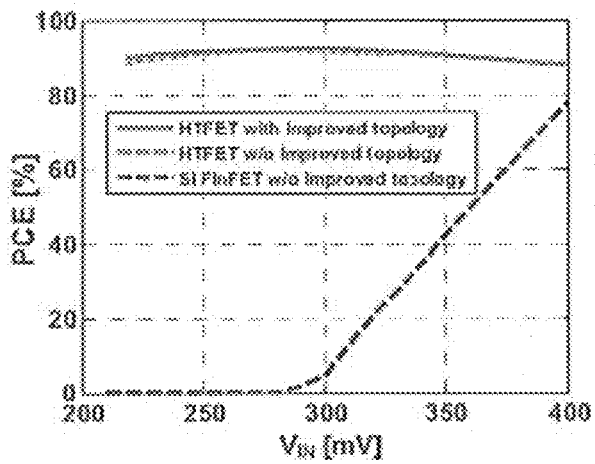
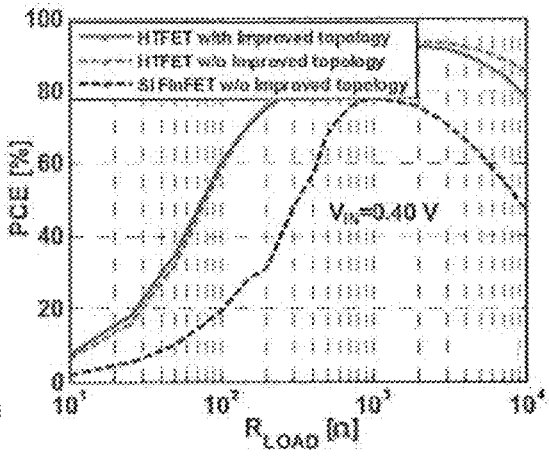
Fig. 32a
Fig. 32b
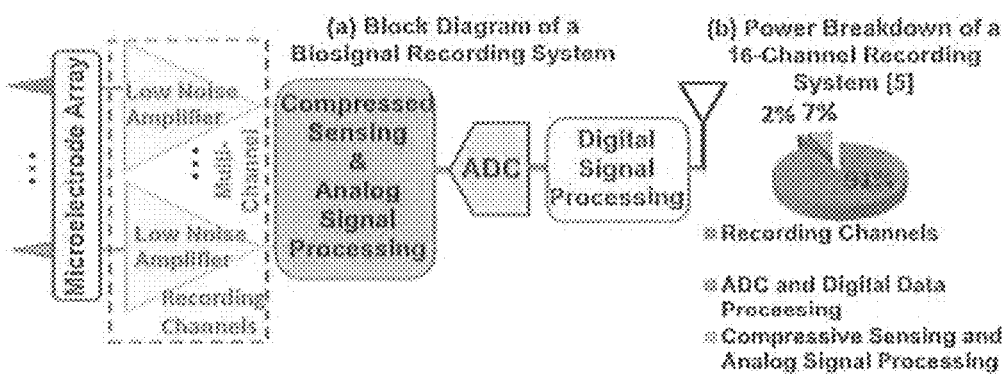
Fig. 33a
(Prior Art)
Fig. 33b
(Prior Art)

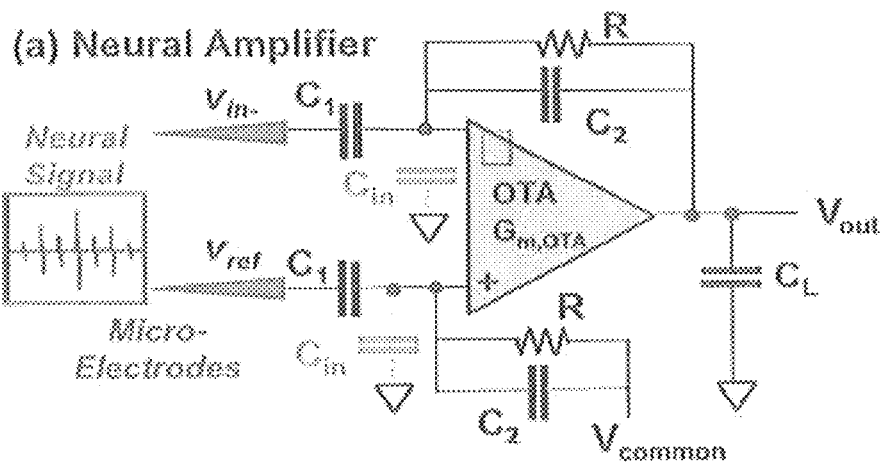
Fig. 34
(Prior Art)
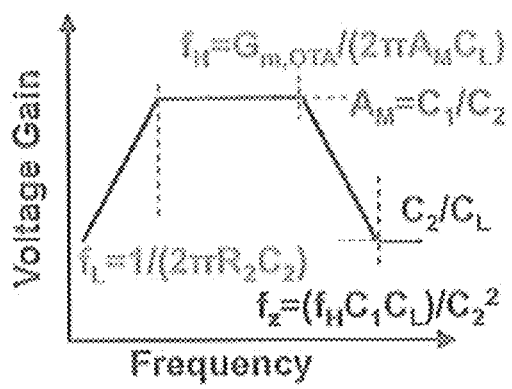
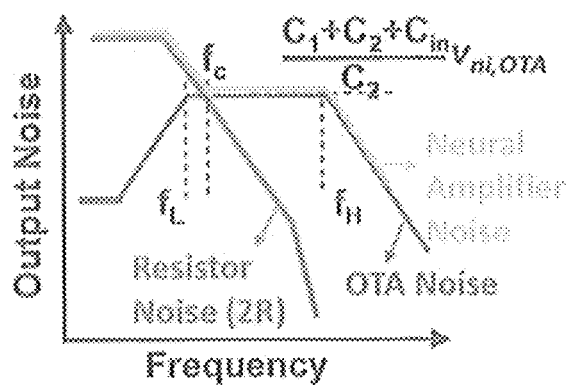
Fig. 35a                Fig. 35b

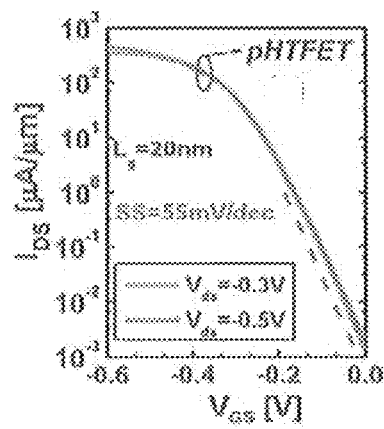 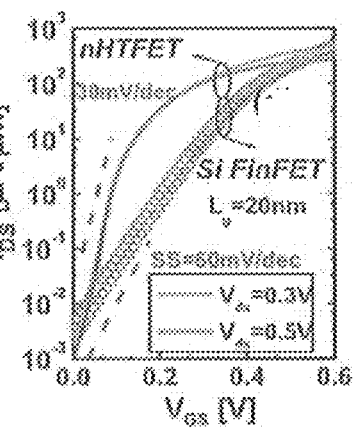 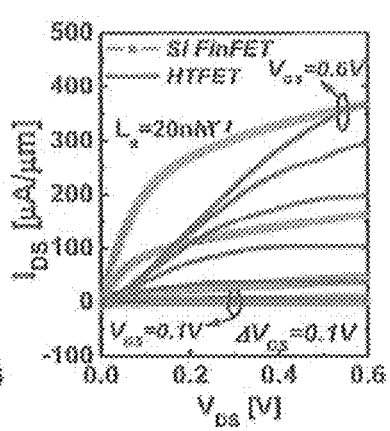
Fig. 39a            Fig. 39b            Fig. 39c
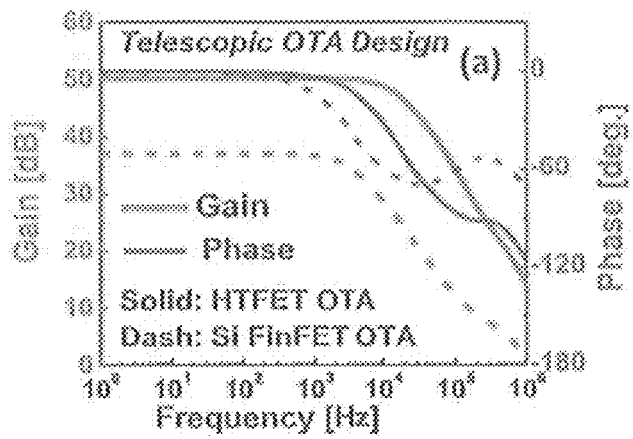
Fig. 40a

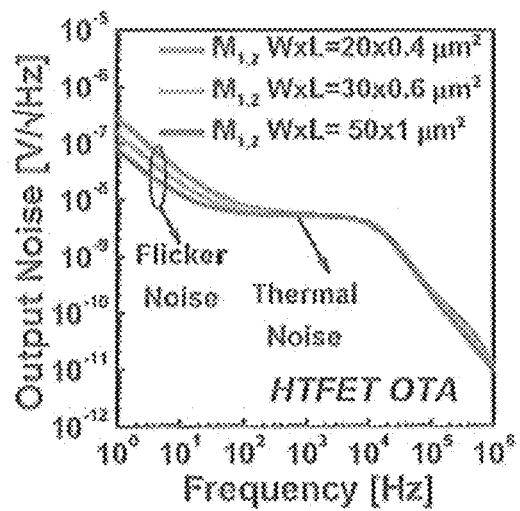 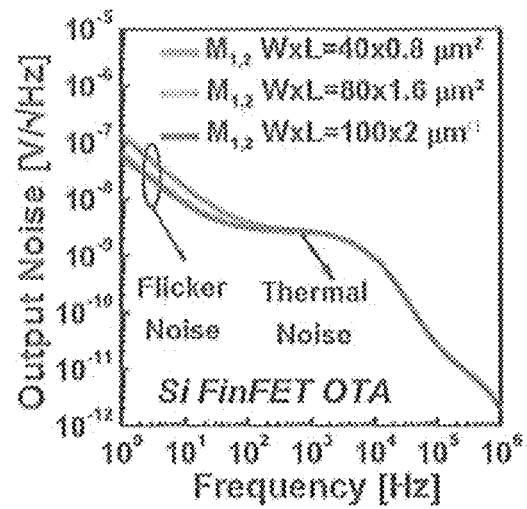
Fig. 40b             Fig. 40c
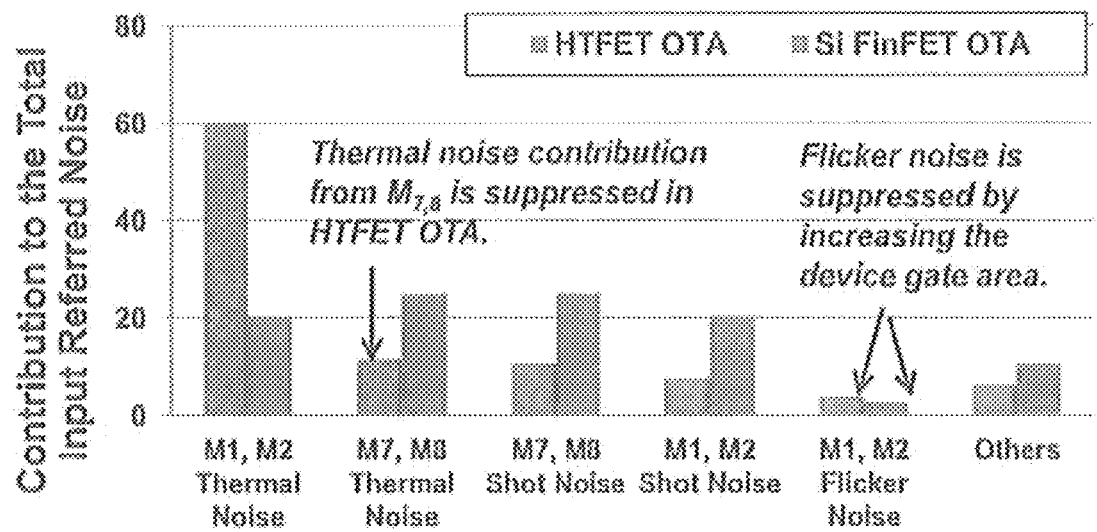
Fig. 41

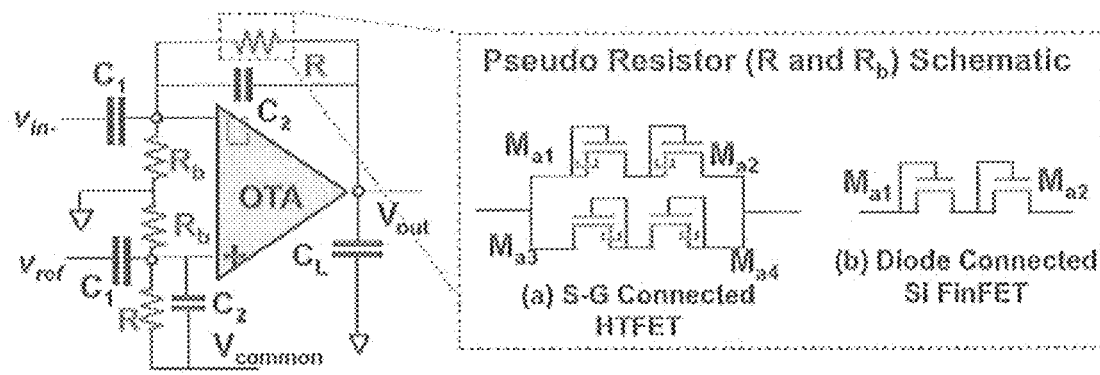
Fig. 42
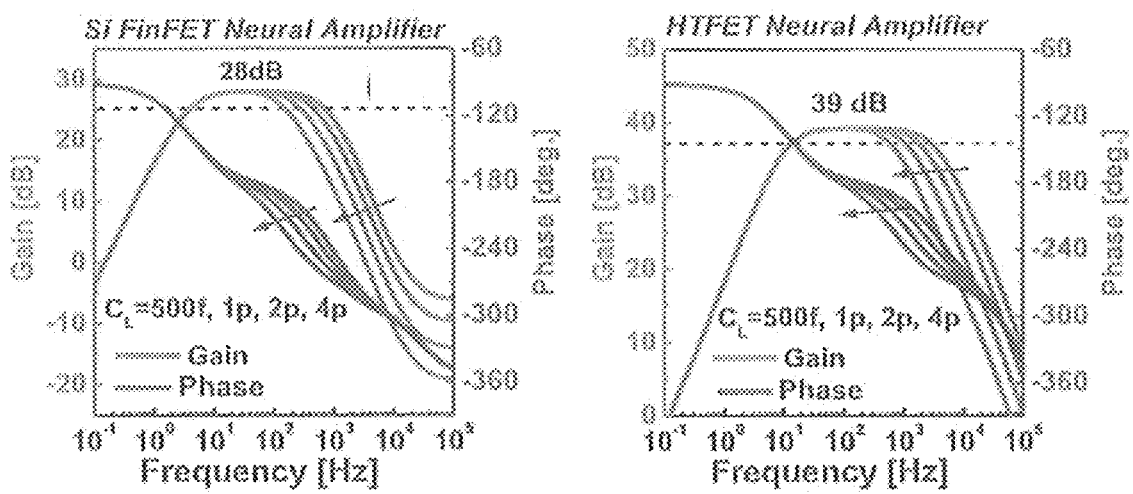
Fig. 43a
Fig. 43b

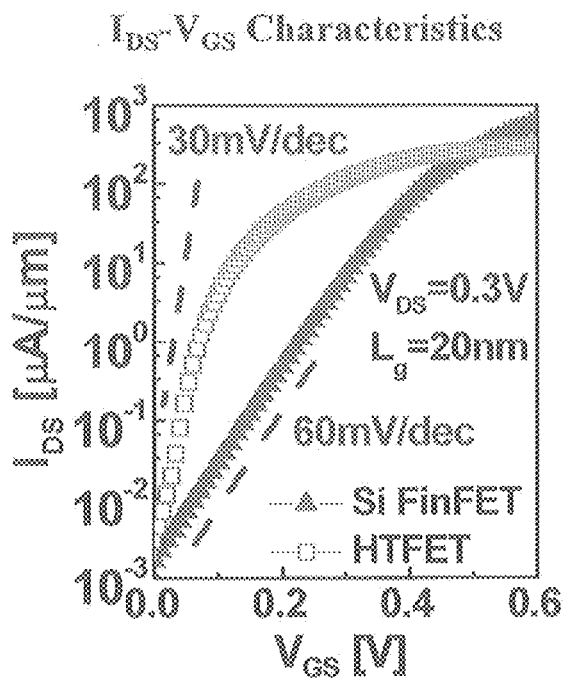
Fig. 45
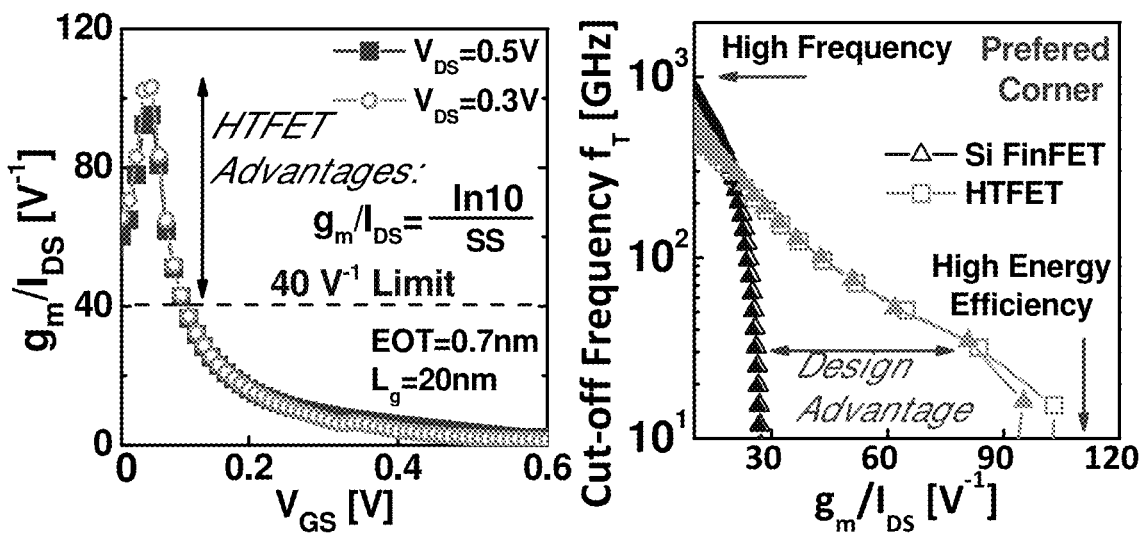
Fig. 46a
Fig. 46b

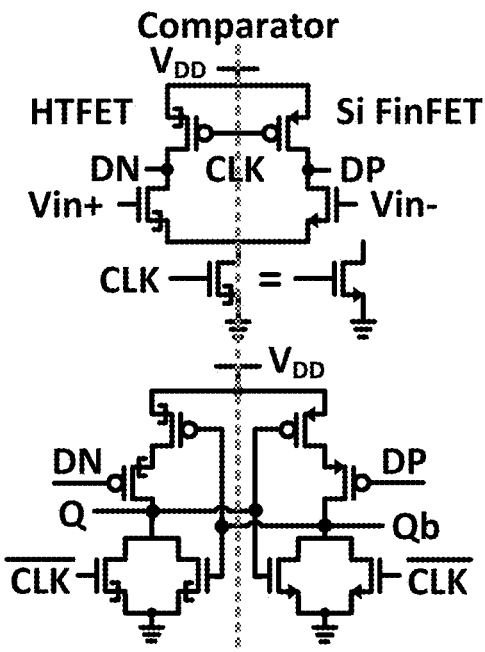
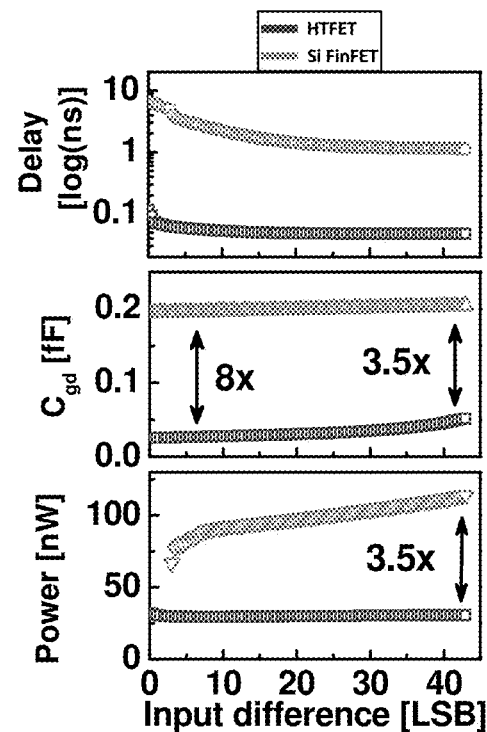
Fig. 48a
Fig. 48b
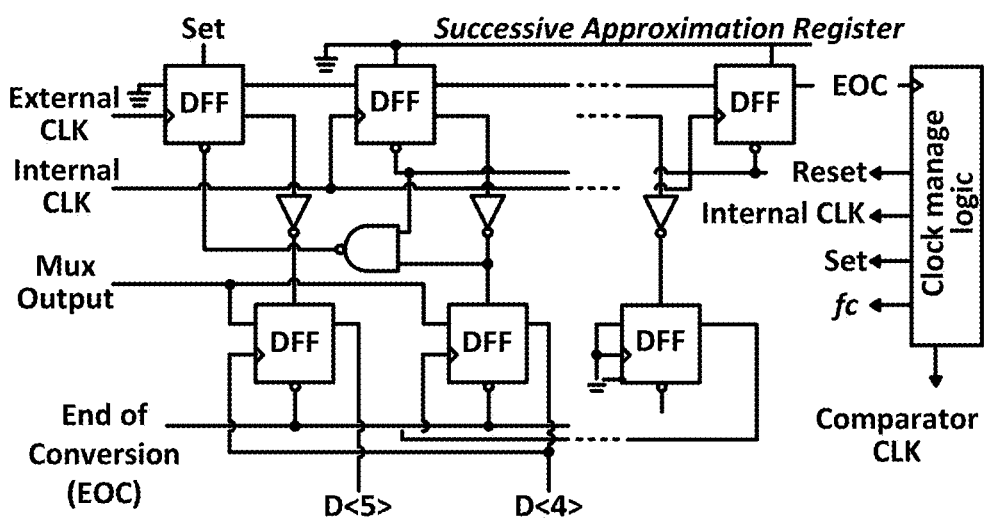
Fig. 49

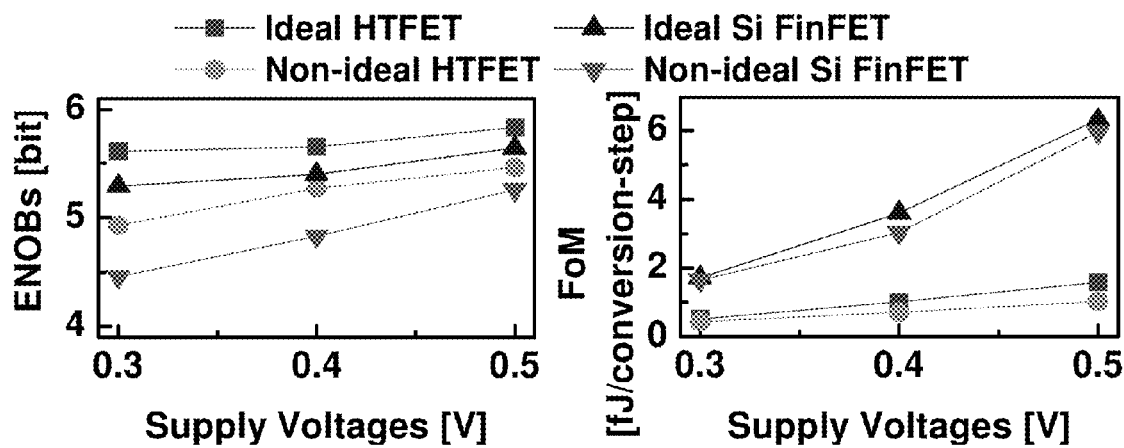
Fig. 53c
Fig. 53d
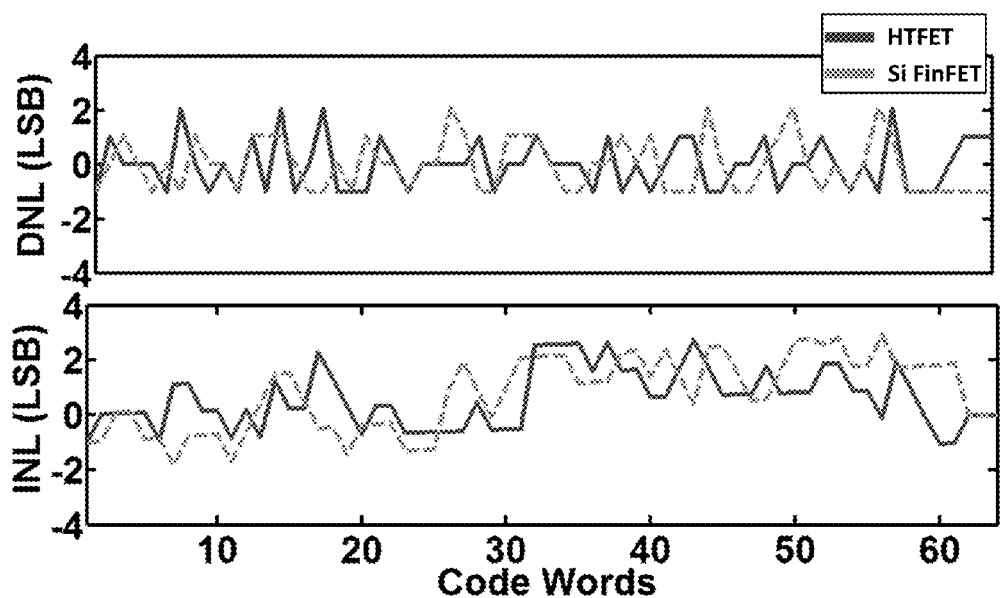
Fig. 54

LOW POWER NANOELECTRONICS

CROSS-REFERENCE TO RELATED APPLICATION

This patent application claims the benefit of U.S. Provisional Patent Application No. 61/993,126, filed on May 14, 2014, which is hereby incorporated by reference in its entirety.

STATEMENT REGARDING FEDERALLY SPONSORED RESEARCH OR DEVELOPMENT

This invention was made with government support under Grant No. EEC1160483, awarded by the National Science Foundation and under Contract No. HR0011-13-3-0002, awarded by the Defense Advanced Research Projects Agency (DARPA). The Government has certain rights in the invention.

FIELD OF THE INVENTION

The present disclosure is generally directed towards low power electronics, and in particular energy harvesting and signal processing electronic components of RF-powered electronic systems that may operate with low input power.

BACKGROUND OF THE INVENTION

RF-power harvester circuits may be used to harvest ambient radio-frequency ("RF") signals as a power source in RF-powered systems, such as passive radio frequency identification ("RFID") tags for example. With some applications, the ambient RF signal resonates with the antenna and the receiver circuits in the harvester circuit to power the RF-powered system. With an RFID tag, for example, the power may be used to enable signal-processing and wireless data transmission between a battery-free RFID tag and a tag reader that the RF-powered system may be comprise of. Use of RF-power harvester circuits, as opposed to a stored energy source (e.g., a battery), can reduce the cost and the weight associated with nano- and micro-electronic components. Use of RF-power harvester circuits may also obviate the inconvenience of charging or replacing the stored energy source. Omission of batteries may also reduce the risk posed by chemical leakage. With biomedical applications (e.g., medical implants), chemical leakage may pose an additional biological infection risk, thus omission of batteries in these systems may reduce such risk.

Typical ambient RF power sources include cellular signals, WiFi, TV broadcast signals, and RFID signals subject to the regulations of a governing body (e.g., F.C.C.), which exist with varying frequencies and power densities. Existing RF-powered systems have limited operational range and computational capability due to the limited ambient RF power that can be harvested from the ambient environment. One of the reasons for this is the low power-conversion efficiency (PCE) of energy scavenging components of the RF-powered system when attempting to harvest power from the limited ambient RF power. For example, with a wireless several-watt RF signal transmitter, existing RFID tags typically have an operational range of only a few meters. Furthermore, their sensing, identification, and/or transmission functions may have to be abridged due to the limited ambient RF power.

Components of a RF-powered system may include power harvesting components and analog/RF front end and digital processing/storage components. Power harvesting components may include rectifiers and DC-DC converters. Analog/RF front end and digital processing/storage components may include amplifiers and A/D converters. Increasing the PCE and power efficiencies of some of these components may increase the operational range and computational capabilities of the RF-powered system as a whole, thereby enabling increase usage within limited ambient RF power environments.

SUMMARY OF THE INVENTION

Tunneling Field Effect Transistor ("TFET") and Heterojunction Tunnel FET ("HTFET") for ultra-low power RF circuit design have been explored at the device and circuit level. Our evaluation of a TFET-based RF-power harvesting and signal processing components demonstrates their ability to increase PCE and power efficiencies of these components, as compared to other RF-power harvesting and signal processing components (e.g., CMOS).

Disclosed is a TFET-based rectifier configured with various topologies, wherein steep-slope switching of the HTFET may be used to reduce the $V_{CC}$ window, and the high on-current $I_{on}$ of the HTFET at low voltage may be used to reduce on-state channel resistance to achieve increased power out and power conversion efficiency. In one embodiment of a HTFET based ultra-low power high sensitivity RF rectifier, demonstrated through device-circuit simulation, a 10-stage optimized HTFET RF rectifier operates at 915 MHz with a power conversion efficiency of 98% with 0.5 nW Dc power consumption, sensitivity of −24 dBm for 9 µW of DC output power, and sensitivity of −33 dBm for 0.4 µW DC output power. The capability of obtaining a high PCE at a low RF input power range demonstrates the ability of HTFET RF rectifiers to enhance battery-less energy harvesting applications.

Also disclosed is a TFET-based DC-DC charge pump converter, wherein the steep slope switching of the HTFET may be used to convert input voltages as low as 0.20 V to output voltages as high as 0.57 V with at least a 90.4% PCE. Results show that a HTFET-based DC-DC charge pump with a 1.0 kΩ resistive load may achieve 90.4% and 91.4% power conversion efficiency, and 0.37 V and 0.57 V DC output voltage, when the input voltage is 0.20 V and 0.30 V, respectively.

Also disclosed is a TFET-based amplifier including a telescopic operational transconductance amplifier topology (OTA). The steep slope switching of a HTFET may be used to increase $g_m/I_{ds}$ to achieve an increase in gain at low supply voltage. In one embodiment, the high $g_m/I_{ds}$ characteristics may be used in a HTFET-based neural amplifier with a shared telescopic OTA topology to enable a nanowatt power-level operation, which also provides a significant voltage gain improvement and noise reduction compared to prior art. At a highly scaled bias current of 10 nA and supply voltage of 0.5 V, the HTFET-based neural amplifier may exhibit a midband gain of 40 dB, a −3 dB bandwidth from 12 Hz to 2 kHz, and an approximate 32 times power reduction over the prior art at the same input-referred noise level. The HTFET-based neural amplifier also exhibits improved power-noise efficiency, including a noise efficiency factor (NEF) of 0.64.

Also disclosed is a TFET-based successive-approximation register (SAR) analog-to-digital (A/D) converter, including a HTFET-based transmission gate flip-flop (DFF). The steep slope switching of a HTFET may be used to increase $g_m/I_{ds}$, increase signal-to-noise and distortion (SNDR), increase effective number of bits (ENOB), lower the energy per conversion step figure-of-merit (FoM), and lower the energy consumption. The HTFET-based SAR A/D converter demonstrates a 1.94 dB higher SNDR, a 0.32-bit larger ENOB, a 63% lower average power consumption, and a 35% lower energy per conversion-step (FoM) as compared to prior art. This performance advantage stems from increasing current strength due to steep slope transistor characteristics and transistor size reduction, which is desirable for ultra-low-power A/D Converters at supply voltage $V_{DD}$<0.50 V.

Also disclosed is an RF-powered system including at least one of the TFET-based devices described above. RF-powered systems including at least one of the HTFET-based devices described above may be used to improve the power conversion efficiencies of power harvesters within the power harvesting and management block of the RF-powered system and/or improve the power-efficiency of signal processing components of the analog/RF front end and digital storage/processing block of the RF-powered system.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

Further possible embodiments are shown in the drawings. The present invention is explained in the following in greater detail as an example, with reference to exemplary embodiments depicted in drawings. In the drawings:

FIGS. 1a, 1b, and 1c are representations of a Si FinFET that was used for comparison during analyses, an n-type HTFET that may be used in disclosed embodiments of the present invention, and a p-type HTFET that may be used in disclosed embodiments present invention, respectively;

FIGS. 2a and 2b are circuit element diagrams of an n-type HTFET and a p-type HTFET that may be used in disclosed embodiments of the present invention, respectively;

FIGS. 32a and 32b are graphs of PCE v. $V_{IN}$ performance comparisons and PCE v. $R_{LOAD}$ performance comparisons, respectively, between a Si FinFET charge pump and a HTFET charge pump;

FIGS. 33a and 33b are a block diagram of a multi-channel biosignal acquisition system and a power breakdown of a 16-channel recording system, respectively;

FIG. 34 is a CMOS-based neural amplifier based on a capacitive feedback network;

FIGS. 35a and 35b are graphs of voltage gain v. frequency and output noise v. frequency, respectively, of the CMOS-based neural amplifier of FIG. 34;

FIGS. 39a, 39b, and 39c are graphs of device characteristics comparing $I_{SD}$ V. $V_{SG}$ of a Si FinFET to that of a pHTFET, $I_{SD}$ V. $V_{SG}$ of a Si FinFET to that of a nHTFET, and $I_{SD}$ V. $V_{ds}$ of Si FinFET to HTFET, respectively;

FIG. 40a is a comparison of the gain v. frequency for an HTFET-OTA amplifier and a Si FinFET-OTA amplifier;

FIGS. 40b and 40c are graphs of the output noise v. frequency for the HTFET-OTA amplifier and a Si FinFET-OTA amplifier, respectively;

FIG. 41 shows the noise contributions that portions of the HTFET-OTA amplifier and a Si FinFET-OTA amplifier make to the overall input referred noise;

FIG. 42 is a closed loop HTFET neural amplifier with telescopic OTA embodying the present invention;

FIGS. 43a and 43b are graphs of gain v. frequency comparisons between a Si FinFET neural amplifier and a HTFET neural amplifier, respectively;

FIG. 45 shows $I_{ds}$-$V_{gs}$ characteristics comparing Si FinFET and HTFET at Lg=20 nm;

FIGS. 46a and 46b shows $g_m/I_{ds}$ vs. $V_{gs}$ of HTFET showing HTFET overcoming the 40 V-1 CMOS limit due to steep switching at a low $V_{gs}$, and a fT vs. $g_m/I_{ds}$ comparison of HTFET and Si FinFET, showing improved design space of HTFET considering the trade-off between high frequency and $g_m/I_{ds}$, respectively;

FIG. 48a shows HTFET and Si FinFET comparator schematic;

FIG. 48b are graphs of delay with respect to input difference (LSB), Cgd variations according to input difference (LSB), and power consumption vs. input difference (LSB);

FIG. 49 shows a SAR logic block;

FIGS. 53a, 53b, 53c, and 53d show comparisons between ideal and non-ideal HTFET ADCs and Si FinFET ADCs with respect to ENOB v. input frequency, SNDR v. input frequency, ENOB v. supply voltage, and Figure of Merit v. supply voltage, respectively;

FIG. 54 shows the differential nonlinearity (DNL) and the integral nonlinearity (INL) performance, respectively, for an HTFET ADC and Si FinFET ADC;

DETAILED DESCRIPTION OF THE INVENTION

As shown in FIGS. 1b and 1c, a Tunneling Field Effect Transistor ("TFET") can be seen as a reverse-biased, gated p-i-n tunnel diode with asymmetrical source/drain doping. The reverse biased diode leakage determines the current in the off-state, or $I_{off}$, of the TFET. The on-state is enabled by the gate-controlled band-to-band tunneling at the source-channel junction, and a sub-60 mV/decade steep-slope can be achieved in TFET with desired $I_{on}/I_{off}$ over a low power supply, or $V_{CC}$, range. Moreover, with the introduction of materials from group III and group V of the periodic table (III-V materials) and a heterojunction, a III-V Hetero-junction TFET ("HTFET") exhibits improved energy efficiency for below 0.5V $V_{CC}$ compared to the state-of-art CMOS technology. As described herein, these advantages exhibited by the TFET may be used to generate RF-power system components that not only improve the functionalities of the components themselves, but also the functionalities of the RF-system as a whole.

TFET-Based Rectifier

As disclosed herein, a stage of a power rectifier may include a first P-type TFET connected in series with a second P-type TFET and a first N-type TFET connected in series with a second N-type TFET. The first and second P-type TFETs are connected in parallel with the first and second N-type TFETs. The first P-type TFET is controlled by a source voltage of the second P-type TFET, the second P-type TFET is controlled by a source voltage of the first P-type TFET, the first N-type TFET is controlled by a source voltage of the second N-type TFET, and the second N-type TFET is controlled by a source voltage of the first N-type TFET.

Figure 3:
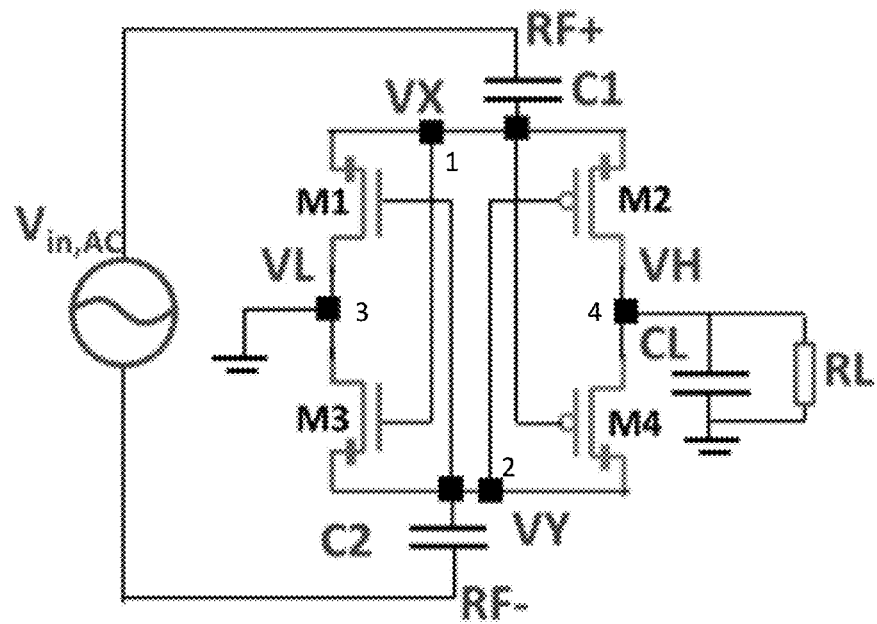
FIG. 3 is a circuit diagram of a TFET rectifier embodying the present invention.

According to the embodiment of FIG. 3, a power rectifier comprises a stage that includes a first, a second, a third, and a fourth, TFET, labeled $M_1$, $M_2$, $M_3$, and $M_4$ respectively, each having a source, a gate, and a drain. Further, the first ($M_1$) and third ($M_3$) TFETs are N-type TFETs, exemplified in FIG. 2a, and the second ($M_2$) and fourth ($M_4$) are P-type TFETs, exemplified in FIG. 2b. As shown in FIG. 3, the source of the first TFET, the source of the second TFET, the gate of the third TFET, and the gate of the fourth TFET are connected at a first node that has a reference voltage VX, the gate of the first TFET, the gate of the second TFET, the source of the third TFET and the source of the fourth TFET are connected at a second node that has a reference voltage VY, the drain of the first TFET and the drain of the third TFET are connected at a third node that has a reference voltage VL, and the drain of the second TFET and the drain of the fourth TFET are connected at a fourth node that has a reference voltage VH.

Furthermore, as demonstrated in FIG. 3, the source of the first TFET, the source of the second TFET, the gate of the third TFET, and the gate of the fourth TFET may be connected to a first capacitor, labeled $C_1$, based on the first node having reference voltage VX, and the gate of the first TFET, the gate of the second TFET, the source of the third TFET, and the source of the fourth TFET may be connected to a second capacitor, labeled $C_2$, based on the second node having a reference voltage VY.

Further, as shown in FIG. 3, the input node can be configured to receive an alternating signal and the first capacitor can be connected to the input node. In addition, the drain of the first TFET and the drain of the third TFET may be connected to ground, and the drain of the second TFET and the drain of the fourth TFET may be connected to a load resistance $R_L$. Also, a third capacitor CL may be connected in parallel to the load resistance $R_L$. Each of the first TFET, the second TFET, the third TFET, and the fourth TFET may be a HTFET.

Additionally, multi-stage configurations of a TFET rectifier can achieve large output DC voltages when serially stacked along a DC path and connected in parallel to the input RF terminals of a stage. The stage shown in FIG. 3 may be considered to be a first stage having a first reference voltage node that is also an input node RF+ and a second reference voltage node RF−. A power rectifier according another preferred embodiment may comprise a second stage that has a first reference voltage node and a second reference voltage node similar to the first stage. The second stage would comprise the same number and type of TFETs along with the same connections as the first stage. In addition, the first reference voltage node of the second stage is connected to the input node of the first stage and, similar to the first capacitor $C_1$ shown in FIG. 3, a capacitor may be connected in parallel between the input node of the first stage and the first reference voltage node of the second stage. As discussed below, a multi-stage device having 4, 10, and 15 stages connected in parallel has been shown to be a particularly effective design.

Figures 4A, 4B, 4C:
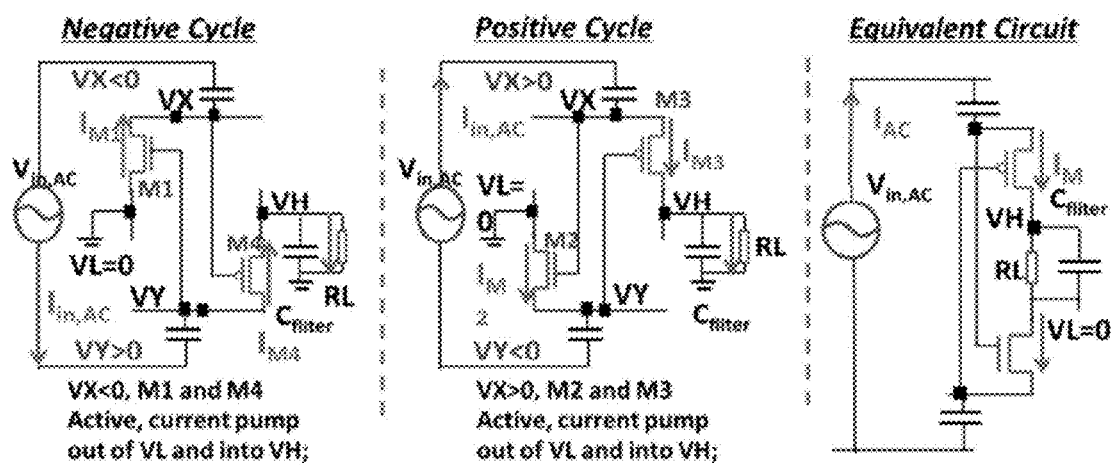
FIGS. 4a, 4b, and 4c are circuit diagrams of a TFET rectifier embodying the present invention.

FIGS. 4a-4c also show the design of the TFET based 4-transistor differential drive rectifier topology. An RF signal acts as a differential input signal $V_{IN}$, AC and is applied across reference voltage nodes RF+ and RF−. Thus a DC output voltage, $V_{out}$, DC=VH, develops across the load impedance $R_L$. With regard to FIG. 4b, during the positive half of the voltage input cycle, the reference voltage between reference voltage end RF+ and reference voltage end RF− increases beyond the rectifier device threshold. Accordingly, the second TFET, labeled $M_2$, and the third TFET, labeled $M_3$, will switch on, allowing current to flow into the load $R_L$, while the first TFET, labeled $M_1$, and the fourth TFET, labeled $M_4$, will both remain off.

In relation to FIG. 4a, continuing through the voltage input cycle, the reference voltage different between RF+ and RF− drops below the rectifier device threshold, $M_2$ and $M_3$ will turn off until the difference between RF+ and RF− becomes more negative than a negative value of the threshold voltage, $-V_{th}$. At that point, $M_1$ and $M_4$ turn on and rectify the negative half of the incoming RF signal. Since VL is ground in 1-stage rectifier, an effective ground can be introduced to get the equivalent circuit shown in FIG. 4c.

TFET-Based DC-DC Charge Pump Converter

Figure 29A:
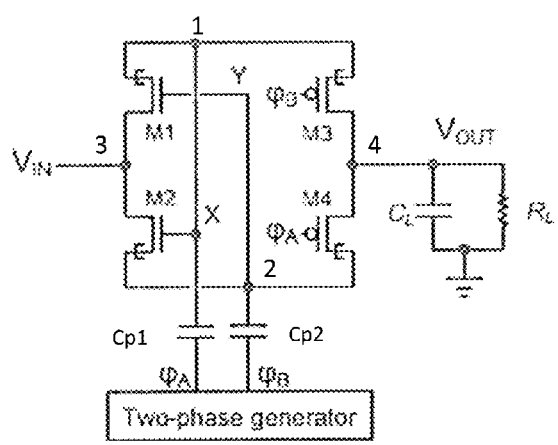
FIGS. 29a and 29b are a circuit diagram and an equivalent circuit, respectively, of a HTFET charge pump embodying the present invention.

As disclosed herein, a DC-DC charge pump converter may include a first P-type TFET connected in series with a second P-type TFET and a first N-type TFET connected in series with a second N-type TFET. The first and second P-type TFETs are connected in parallel with the first and second N-type TFETs. As shown in FIG. 29a, the DC-DC charge pump converter includes a first, a second, a third, and a fourth, TFET, labeled $M_1$, $M_2$, $M_3$, and $M_4$ respectively, each having a source, a gate, and a drain. Further, the first ($M_1$) and second ($M_2$) TFETs are N-type TFETs, and the third ($M_3$) and fourth ($M_4$) are P-type TFETs. The source of $M_1$, the gate of $M_2$, the source of $M_3$, and the top plate of a first capacitor labeled $C_P1$, are connected to a first node. The gate of $M_1$, the source of $M_4$, and the source of $M_2$ are connected to the top plate of a second capacitor labeled $C_P2$ by way of a second node. The drain of $M_1$ and the drain of $M_2$ are connected to a third node configured to receive an input voltage. The drain of $M_3$ and the drain of $M_4$ are connected to a fourth node configured to deliver the output voltage. Also, a third capacitor CL may be may be connected to the fourth node for the purpose of filtering out the voltage ripples. The bottom plates of the first and second capacitors may be configured to be connected to a two-phase generator. Furthermore, each TFET may be a HTFET. The resistor $R_L$ in FIG. 29a represents a resistive load of the DC-DC charge pump converter when used in applications.

TFET-Based Amplifier

Figure 38:
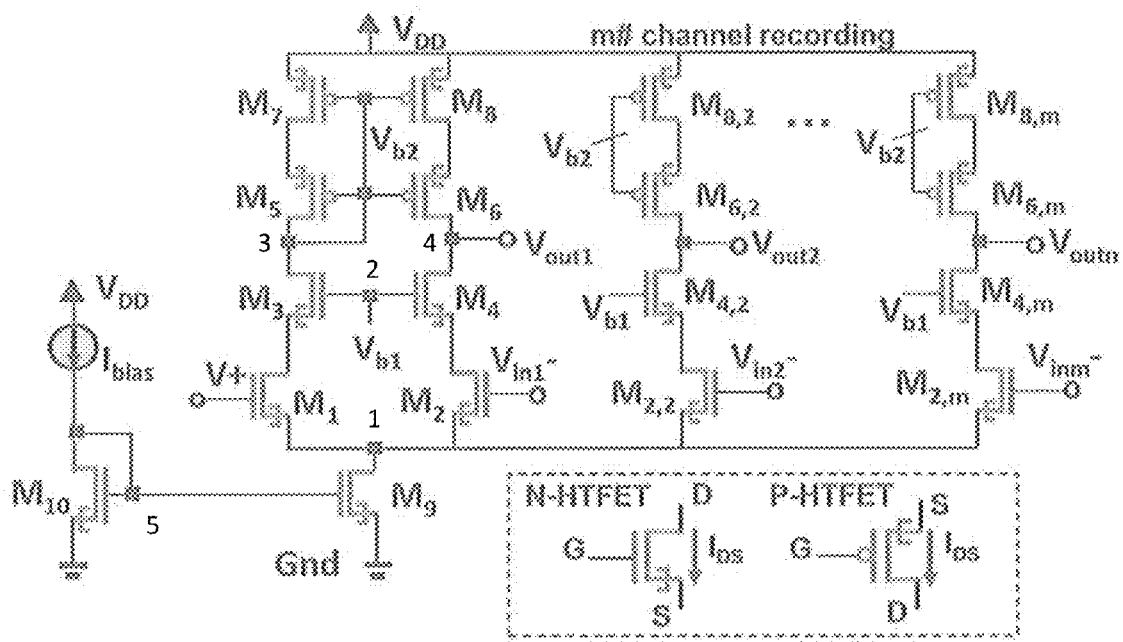
FIG. 38 is a circuit diagram of a HTFET amplifier with sharing architecture for multi-channel recording embodying the present invention.

As disclosed herein, an OTA amplifier may include a series-parallel interconnection of a first, a second, a third, and a fourth P-type TFET with a first, a second, a third, a fourth, a fifth, and a sixth N-type TFET. As shown in FIG. 38, the amplifier includes a first, second, third, fourth, fifth, sixth, seventh, eighth, ninth, and tenth TFET, labeled $M_1$, $M_2$, $M_3$, $M_4$, $M_4$, $M_5$, $M_6$, $M_7$, $M_8$, $M_9$, and $M_10$ respectively, each having a source, a gate, and a drain. Further, the first ($M_1$), second ($M_2$), third ($M_3$), fourth ($M_4$), ninth ($M_9$), and tenth ($M_{10}$) are N-type TFETs, and the fifth ($M_5$), sixth ($M_6$), seventh ($M_7$), and eighth ($M_8$) are P-type TFETs.

Sources of $M_9$ and $M_10$ are connected to ground. The gate of $M_{10}$, the drain of $M_{10}$, and the gate of $M_9$ are connected to receive a biasing current source at node 5. The sources of $M_1$ and $M_2$ and the drain of $M_9$ are connected at node 1. The gate of $M_1$ is connected to the positive input port V+. The gate of $M_2$ is connected to the negative input port V−. The gates of $M_3$ and $M_4$ are connected at node 2 with a reference voltage Vb1. The source of $M_3$ is connected to the drain of $M_1$. The source of $M_4$ is connected to the drain of $M_2$. The drains of $M_3$ and $M_5$, and the gates of $M_5$, $M_6$, $M_7$, and $M_8$ are connected at node 3. The drains of $M_6$ and $M_4$ are connected at node 4. The drain of $M_7$ is connected to the source of $M_5$. The drain of $M_8$ is connected to the source of $M_6$. The sources of $M_7$ and $M_8$ are connected to the power supply $V_{DD}$. Furthermore, each TFET can be a HTFET.

In addition, a multi-channel recording architecture may be connected to the HTFET amplifier, where each channel is connected in parallel to the amplifier. A channel may include a series connection between an eleventh TFET, twelfth TFET, thirteenth TFET, and fourteenth TFET, labeled $M_8m$, $M_6m$, $M_4m$, and $M_2m$, respectively, each having a source, a gate, and a drain. $M_8m$ and $M_6m$ may be P-type TFETs, and $M_4m$ and $M_2m$ may be N-type TFETs. Furthermore, each TFET may be a HTFET.

Each channel may include the series connection of $M_8m$, $M_6m$, $M_4m$, and $M_2m$, where the drain of $M_8m$ is connected to the source of $M_6m$, the drain of $M_6m$ is connected to the drain of $M_4m$, and the source of $M_4m$ is connected to the drain of $M_2m$. The channel may be connected to the amplifier in parallel, whereby the source of $M_8m$ is connected to the source of $M_8$ and the source of $M_2m$ is connected to the source of $M_2$. Additional channels may be added in a similar manner, where m would denote the number of each channel added.

In addition, a closed loop HTFET neural amplifier with a capacitive feedback topology based on the above HTFET-based OTA amplifier is disclosed. As shown in FIG. 42, the pseudo resistor of the closed loop HTFET neural amplifier may include a first, a second, a third, and a fourth TFET, labeled Ma1, Ma2, Ma3, and Ma4, respectively, each having a source, a gate, and a drain. Each TFET may be an N-type TFET. Further, each TFET may be a HTFET. Ma1 is connected in series with Ma2, and Ma3 is connected in series with Ma4. Ma1 and Ma2 are connected in parallel with Ma3 and Ma4. The source of Ma1 is connected to the drain of Ma3. The drain of Ma1 is connected to the source of Ma2. The drain of Ma2 is connected to the source of Ma4. The drain of Ma4 is connected to the source of Ma3. Each TFET is configured to exhibit a shorted source-gate connection.

TFET-Based SAR A/D Converter

As disclosed herein, a TFET-based SAR A/D converter having a logical circuit may include a TFET-based D Flip-Flop. As shown in FIG. 50, the TFTET-based logic circuit may include a master stage and a slave stage. The master stage may include a first transmission gate, a second transmission gate, a first Nor gate, a second Nor gate, a third transmission gate, and a fourth transmission gate. The slave stage may include a fifth transmission gate, a sixth transmission gate, a third Nor gate, a fourth Nor gate, a seventh transmission gate, and an eighth transmission gate.

The first transmission gate comprises an N-type TFET in parallel with a P-type TFET, the first transmission gate having an input for D-data-input, an input for clock, an input for clock-bar, and an output coupled to node 1. The second transmission gate comprises an N-type TFET in parallel with a P-type TFET, the second transmission gate having discharging path for node 1, an input for clock, an input for clock-bar, and an input coupled to node 1. The first Nor gate has a first input coupled to node 1, a second input with a master-set-input, and an output coupled to node 2. The second Nor gate has a first input coupled to node 2, a second input coupled to an output of a master inverter, and an output coupled to node 3, wherein the master inverter has an input for a slave reset-input-bar. The third transmission gate comprises an N-type TFET in parallel with a P-type TFET, the third transmission gate having an input coupled to node 3, an input for clock, an input for clock-bar, and an output coupled to node 1. The fourth transmission gate comprises an N-type TFET in parallel with a P-type TFET, the fourth transmission gate having an input coupled to node 1, an input for clock, an input for clock-bar, and an output coupled to node 3.

The fifth transmission gate comprises an N-type TFET in parallel with a P-type TFET, the fifth transmission gate having an input coupled to node 2, an input for clock, an input for clock-bar, and an output coupled to node 4. The sixth transmission gate comprises an N-type TFET in parallel with a P-type TFET, the sixth transmission gate having input coupled to node 4 (discharging path), an input for clock, an input for clock-bar, and an output coupled to node 2. The third Nor gate has a first input coupled to Q-output, a second input with a slave-set-input, and an output coupled to node 5. The fourth Nor gate has a first input coupled to node 4, a second input coupled to an output of a slave inverter, and an output coupled to Q-output, wherein the slave inverter has an input for a slave reset-input-bar. The seventh transmission gate comprises an N-type TFET in parallel with a P-type TFET, the seventh transmission gate having an input coupled to node 5, an input for clock, an input for clock-bar, and an output coupled to node 4. The eighth transmission gate comprises an N-type TFET in parallel with a P-type TFET, the eighth transmission gate having an input coupled to node 1 (discharging path for node 1), an input for clock, an input for clock-bar, and an output coupled to node 5.

Within the logical circuit, each TFET may be a HTFET.

RF-Powered System

As disclosed herein, an RF-powered system includes at least one of the TFET devices described above to improve the power conversion efficiencies of power harvesters within the power harvesting and management block of the RF-powered system and/or to improve the power-efficiency of signal processing components of the analog/RF front end digital storage/processing block of the RF-powered system.

Figure 57:
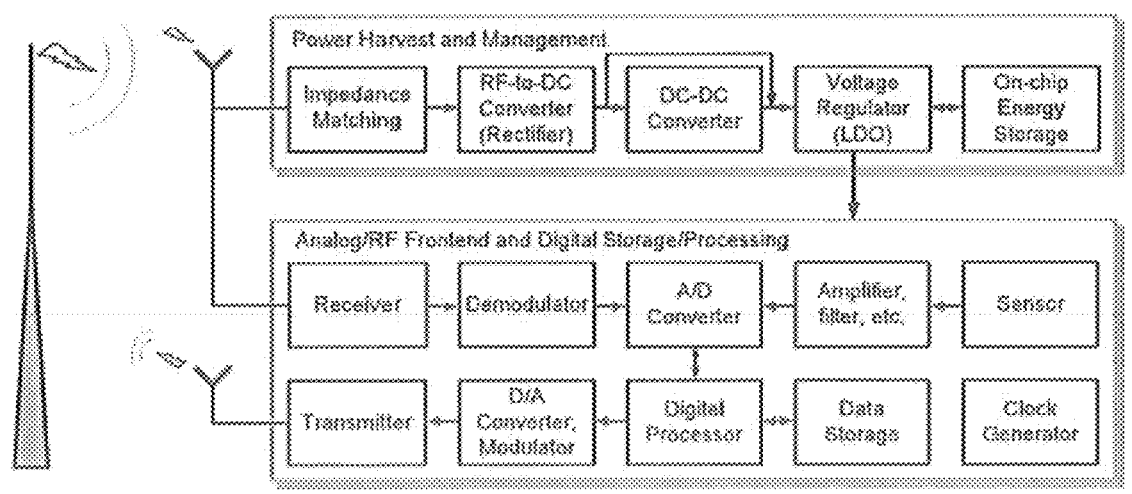
FIG. 57 is a block diagram of an RF-powered system that may be used in accordance with an embodiment of the present invention; and, FIG. 58 shows ambient RF power compared with typical circuit power consumptions.

As shown in FIG. 57, the RF-powered system may include a power harvesting and management block, an analog/RF front end and digital storage/processing block, and at least one sensor. The power harvesting and management block may include an impedance matching component, a rectifier component, a DC-DC converter component, a voltage regulator component, and an on-chip energy storage component. The impedance matching component may include capacitive and inductive circuitry configured to provide maximum power transfer from an RF energy source and to reduce reflected power. The rectifier component may be used to convert alternating current generated from the RF signal to direct current. The DC-DC converter may be used to boost the output voltage of the rectifier. The low drop out regulator may include transistor and differential amplifier circuitry to regulate supply voltage to an energy storage component and/or to an analog and digital processing block.

Components of the analog/RF front end and digital storage/processing block may include a receiver, a demodulator, an A/D converter, an amplifier, and a sensor. Additional components may include a digital processor component, a digital storage component, a D/A converter, a transmitter, and a clock generator.

As disclosed herein, the present invention describes improvements made to the rectifier, DC-DC converter, A/D converter, and amplifier components of the RF-powered system. The other components may include conventional RF-power components that are commonly used in the art. Thus, a powerful RF-system may include a power harvesting and management block configured to receive an RF signal, including an impedance matching component configured to maximize power transfer from the received RF signal, a rectifier component configured to convert alternating current generated by the RF signal to direct current, a DC-DC converter component configured to boost output voltage of the rectifier component, and a voltage regulator configured to provide a constant output voltage. The rectifier component may include a TFET-based rectifier, and the DC-DC converter component may include the TFET-based DC-DC charge pump converter.

The powerful RF-system may include an analog/RF front end and digital storage/processing block configured to receive at least one of the RF signal via a receiver and sensor signal from a sensor, process at least one of the RF signal and the sensor signal, and transmit the at least one processed RF signal and sensor signal via a transmitter, wherein the analog/RF front end and digital storage/processing block includes an amplifier component and a SAR D/C converter component. The amplifier component may include the TFET-based amplifier, and the SAR D/C converter component may include the TFET-based SAR A/D converter. Further, the analog/RF front end and digital storage/processing block may be configured to receive the constant output voltage from the voltage regulator as a supply voltage.

Exemplary embodiments of the TFET-based rectifier, TFET-based DC-DC charge pump, TFET-based amplifier, and TFET-based SAR A/D converter are provided in comparison to a baseline, for which a Si FinFET-based device is used. The comparisons were made using a Verilog-A model in a TCAD Sentauraus modeling environment in which counterpart Si FinFET-based devices were used to compare performance and design results against the TFET-based devices.

Simulation results show that the HTFET charge pump with a 1.0 kΩ resistive load may achieve 90.4% and 91.4% power conversion efficiencies, and 0.37 V and 0.57 V DC output voltage, when the input voltage is 0.20 V and 0.30 V, respectively. Simulation results show that the HTFET amplifier exhibits a midband gain of 39 dB, a gain bandwidth of 12 Hz-2.1 kHz, and an input-referred noise of 6.27 µVrms, consuming 5 nW of power at a 0.5 V supply voltage. Using the HTFET amplifier, a noise efficiency factor (NEF) of 0.64 may be achieved, which is significantly lower than the CMOS-based theoretical limit. Simulation results show that the HTFET energy efficient 6-bit SAR ADC exhibits significant improvement in energy efficiency compared with the Si FinFET ADC design baseline. We demonstrate the HTFET SAR ADC exhibiting 1.94 dB higher SNDR, 0.32-bit larger ENOB, 63% lower average power consumption, and 35% lower energy per conversion-step (FoM) as compared to a Si FinFET ADC design. This performance advantage stems from increasing current strength due to steep slope transistor characteristics and transistor size reduction, which is desirable for ultra-low-power ADCs at $V_{DD}$<0.50 V.

Theoretical Analyses

TFET-Based Rectifier

Figure 5:
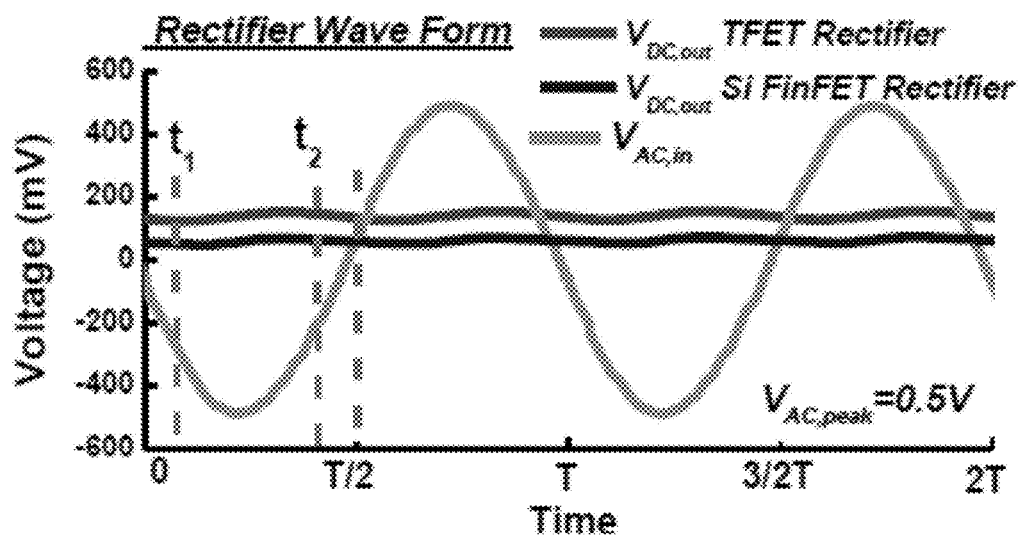
FIG. 5 is a graph of a rectifier input signal during a period of [0, T]

FIG. 5 shows a rectifier input signal $V_{AC, in}$, the DC output voltage $V_{DC, out}$ during [0, T] for a Si FinFET and a TFET. At times t1 and t2, the device is on. In addition, t1, t2 are illustrated at $V_{AC, in}$ is equal to the threshold voltage of a Si FinFET device, $V_{th, Si FinFET}$. The full-wave range of the AC input signal is utilized and essentially works as a charge pump to the load resistance, $R_L$ in FIGS. 3-4c. As the net charge Q transfer to the load determines $V_{DC, out}$, that effect is illustrated based on the formula below:

$$Q_{VRF+<0} = Q_{M1,Frd} - Q_{M1,Rev} = Q_{M4,Frd} - Q_{M4,Rev} \quad (1)$$

$$Q_{VRF+>0} = Q_{M2,Frd} - Q_{M2,Rev} = Q_{M3,Frd} - Q_{M3,Rev} \quad (2)$$

$$Q_{VRF+<0} + Q_{VRF+>0} = \frac{V_{DC,out}}{R_L} T \quad (3)$$

QVRF+<0 and QVRF+>0 are the net charge transferred to the load at the negative cycle and positive cycle of $V_{IN}$, AC, respectively. $QM_1$, Frd and $QM_1$, Rev are the forward (when $V_{gs}$>0) and reverse operations (when $V_{gs}$<0) induced charge transfer due to the first TFET $M_1$ of FIG. 3, respectively, and similar terms are applied to the other TFETs $M_2$, $M_3$ and $M_4$, shown in FIG. 3. T is the period of the input RF signal. To analyze $V_{DC, out}$ and PCE of the TFET rectifier shown in FIG. 3, $M_1$'s operation during 1 signal cycle, [0,T], is compared with the operation of an Si FinFET rectifier in the same configuration as FIG. 3. The terminal voltages $V_{gs}$, $M_1$ and $V_{ds, M1}$ can be expressed for both Si FinFET and TFET rectifiers as:

$$V_{GS,M1} = V_Y - V_X = -V_{in,AC} \quad (4)$$

$$V_{DS,M1} = -V_X = -\frac{1}{2}V_{in,AC} = \frac{1}{2}V_{GS,M1} \quad (5)$$

With the formulas and functions described above, $M_1$ is considered to be a first TFET in a TFET rectifier and $M_1$ is also used as a first Si FinFET in a Si FinFET rectifier that is configured as in FIG. 3. The device operates at linear region due to the equation (5) at the on-state. Since a p-type FET with the same drive strength is assumed, the matched $V_{th}$ of a p-type FET and n-type FET eliminates the operation region differences of $M_1$, $M_4$ pair as well as $M_2$, $M_3$ pair. Taking the Si FinFET rectifier as baseline, $M_1$ operation in [0, T], as associated with the rectifier waveforms shown in FIG. 5, can be divided into four categories; subthreshold [0, t1], linear region [t1, t2], subthreshold [t2, T/2], off-state [T/2, T].

For $-V_{IN}$, AC<$V_{th, Si FinFET}$, a formula representing subthreshold operation is as follows:

$$I_{M1,FinFET} = I_{sub,Vth} \approx I_0 * 10^{\frac{V_{GS,M1}}{n*2.3*V_t}} = I_0 * 10^{\frac{-V_{in,AC}}{SS_{FinFET}}} \quad (6)$$

$$I_{M1,TFET} \approx I_1 * 10^{\frac{-V_{in,AC}}{SS_{FinFET}}} \quad (7)$$

$V_t$ is approximately equal to a 26 mV thermal voltage, n is the body factor, and $I_0$ represents the zero-bias leakage for each of the Si FinFET and TFET devices respectively, and $I_{sub, Vth}$ is the subthreshold current. Since $SS_{FinFET}$>60 mV/decade and the average of $SS_{TFET}$ is nearly 30 mV/decade, |IM$_1$, TFET|>|M$_1$, Si FinFET| when $-V_{IN}$, AC< $V_{th, Si FinFET}$. A similar analysis is applied to [t2, T/2].

Since $V_{gs}$, $M_1$=2$V_{ds}$, $M_1$, when $-V_{IN}$, AC>$V_{th, Si FinFET}$, a formula representing linear operation is as follows:

$$I_{M1,Si FinFET}=I_{Linear}<I_{M1,TFET} \text{ when } |V_{in,AC}|<0.5V \quad (8)$$

$$I_{M1,Si FinFET}=I_{Linear}>I_{M1,TFET} \text{ when } |V_{in,AC}|>0.5V \quad (9)$$

ILinear is the device current at the linear region (triode mode).

In the period section [T/2, T], VX>0, and ideally $M_1$ is off initially with only leakage power loss caused by the off-state current, $I_{off}$. As the $V_{DC, out}$ increases until a state to state output is formed, a common voltage will be developed for VX and VY, shown as a DC component in FIG. 5. For Si FinFET, VGD, $M_1$ can be positive, then $M_1$ is turned on when VSD, $M_1$>0. Since MOSFET is symmetrical, a reverse leakage exists in the Si FinFET device but is eliminated in a TFET.

To estimate the net charge transfer, first the current of TFET, IM$_1$, is integrated over [0, T/2]:

$$Q_{M1,Frd} = \int_0^{T/2} I_{M1}(t)V_{in}(t)dt \quad (10)$$

$$= \int_0^{t1} I_{Sub,Vth}(t)V_{in}dt + \int_{t1}^{t2} I_{Linear}(t)V_{in}(t)dt + \int_{t2}^{T/2} I_{Sub,Vth}(t)V_{in}dt$$

According to formulas shown above as (6) and (7), the steep switching of TFET leads to significant improvement of IM$_1$ at low values of the input voltage $V_{IN}$, AC compared to subthreshold Si FinFET voltage as well as an improvement of both input power utilization and charge transfer in period sections of [0, t1] and [t2, T/2]. According to the formulas shown above as (8) and (9), in [t1, t2], $M_1$ is turned on and operating in the linear region for Si FinFET. At this point, the TFET rectifier shows higher on-state current, Ion, compared to Si FinFET at $V_{CC}$<0.5V, but loses the energy efficiency at high $V_{CC}$ due to tunneling process limitation. Therefore, at low input voltage $V_{IN}$, AC, a TFET rectifier can achieve higher peak current $IM_1$, but has lower peak $IM_1$ at high $V_{IN}$, AC compared to a Si FinFET rectifier.

Figure 6A:
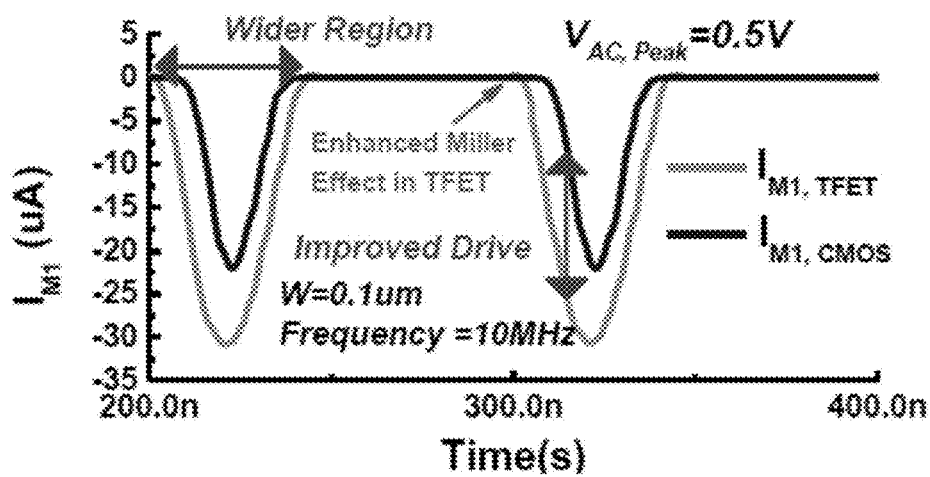
FIGS. 6a and 6b are graphs of a comparison of the current through device $M_1$ at an input voltage of 0.5V AC and 0.6V AC, respectively, for a TFET rectifier embodying the present invention and a Si FinFET rectifier.
Figure 6B:
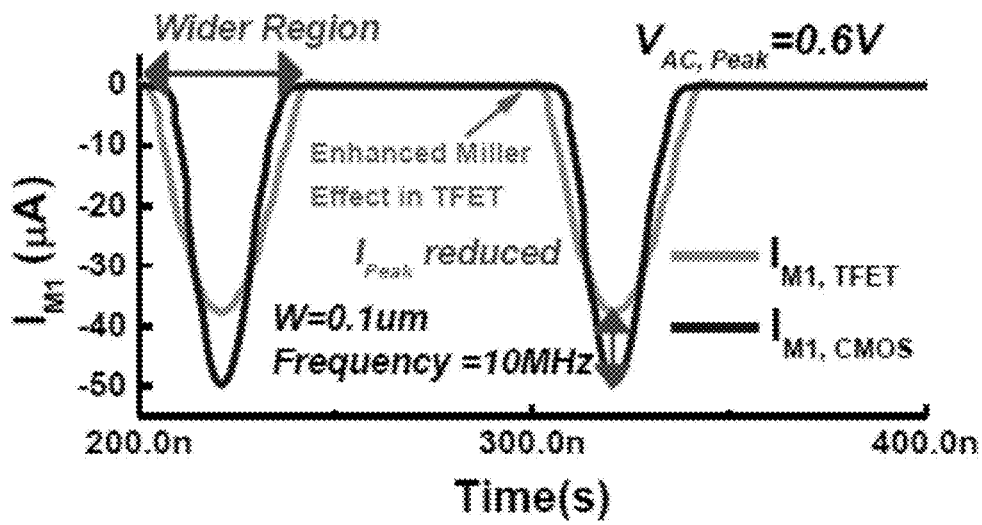

FIGS. 6a and 6b show the comparison $IM_1$ (in µA) of a Si FinFET and an HTFET for input voltages having amplitudes of 0.5V and 0.6V, respectively. FIGS. 6a and 6b show the comparison $IM_1$ of Si FinFET and HTFET where the channel width ("W") of both the Si FinFET and HTFET is 0.1 µm and the input signal has a frequency of 10 MHz. For both 0.5V and 0.6V operation, an HTFET show earlier "turn-on" compared to Si FinFET due to steep-slope with improved utilization of the input signal. At 0.5V input, HTFET shows improved $IM_1$, and reduced peak $IM_1$ at 0.6V input. As a result, in the half-cycle input, $Q_{M1, Forward}$ in HTFET will be higher at low $V_{IN, AC}$, but will be reduced at high $V_{IN, AC}$ due to a low $I_{on}$ compared to Si FinFET.

In the period section [T/2, T], $M_1$ is at the off-state, the $I_{off}$ and reverse conduction $I_{Rev(t)}$ induced charge transfer is represented by the formula:

$$Q_{M1,Rev} = \int_{T/2}^{T} (I_{Rev}(t) + I_{off}) V_{in}(t) dt \quad (11)$$

IRev(t) in the Si FinFET rectifier can be eliminated with the replacement of TFET because of the uni-directional conduction aspect of the TFET. With the fixed $I_{off}$ of the TFET, $QM_1$, Rev is thus reduced or nearly eliminated in a TFET.

Assuming $M_1$ and $M_3$, and $M_2$ and $M_4$ are identical, using the formula represented as (3) above, $V_{DC, out}$ becomes:

$$V_{DC,out} = \frac{R_L}{T} * 2 * (Q_{M1,Frd} - Q_{M1,Rev}) \quad (12)$$
$$= (2V_{RF} - V_{drop})$$

$V_{RF}$ is the RMS value of the input signal and $V_{drop}$ is the voltage loss across the rectifier. With the same load and signal frequency, $V_{drop}$ due to the inefficient utilization of the input is reduced in a TFET rectifier, leading to the improved $V_{DC, out}$ at low VIN, AC compared to a Si FinFET rectifier.

PCE of the rectifier discussed above can be expressed as:

$$PCE = \frac{P_{DC,out}}{P_{RF,in}} \quad (13)$$
$$= \frac{I_{DC,out} V_{DC,out}}{\frac{1}{T}\int_0^T I_{in,AC}(t) V_{in,AC}(t) dt}$$
$$= \frac{\frac{V_{DC,out}^2}{R_L}}{\frac{V_{DC,out}^2}{R_L} + P_{Loss}}$$

$$P_{Loss} = P_{Leakage} + P_{Reverse} + P_{switching} + P_{Ron} \quad (14)$$

$$P_{switching} = 1/T(W_{M1}C_{gg,M1} + W_{M4}C_{gg,M4})V_{DC,out}^2 \quad (15)$$

$$P_{Ron} = 2*(I_{M1}^2 R_{on,M1} + I_{M4}^2 R_{on,M4}) \quad (16)$$

PDC, out, PRF, in and $P_{Loss}$ represent the output DC power, input RF power and the power loss, respectively. And $I_{in}$, AC is the current flowing through a branch. The power loss sources considered in the following analysis are leakage power, $P_{Leakage}$, reverse conduction power, PReverse, device capacitance switching induced dynamic power, $P_{Switching}$, and the on resistance induced thermal power loss, $P_{Ron}$. $WM_1$ and $WM_4$ represent the device width, and $C_{gg}$, $M_1$ and $C_{gg}$, $M_4$ represent the total capacitance of $M_1$ and $M_4$.

Due to the fixed $I_{off}$ for a TFET and Si FinFET, $P_{Leakage}$ in [T/2, T] are comparable. However, a TFET's uni-directional conduction characteristic can significantly reduce the reverse conduction induced leakage and power loss $P_{Reverse}$, hence improving the PCE. The improved power utilization and reduced power loss can improve the $V_{DC, out}$ for TFET rectifier at low $V_{IN}$, AC. A TFET also shows an enhanced Miller capacitance effect, which can be described as a higher gate-drain $C_{gd}$ component and suppressed gate-source $C_{gs}$ in total gate capacitance $C_{gg}$. This effect can cause a transient current "spike" during switching, which induces an increased $P_{Switching}$. In the following evaluation of a simulated TFET rectifier, PCE is compared with $V_{IN}$, AC to evaluate the rectifier's performance.

Figure 7:
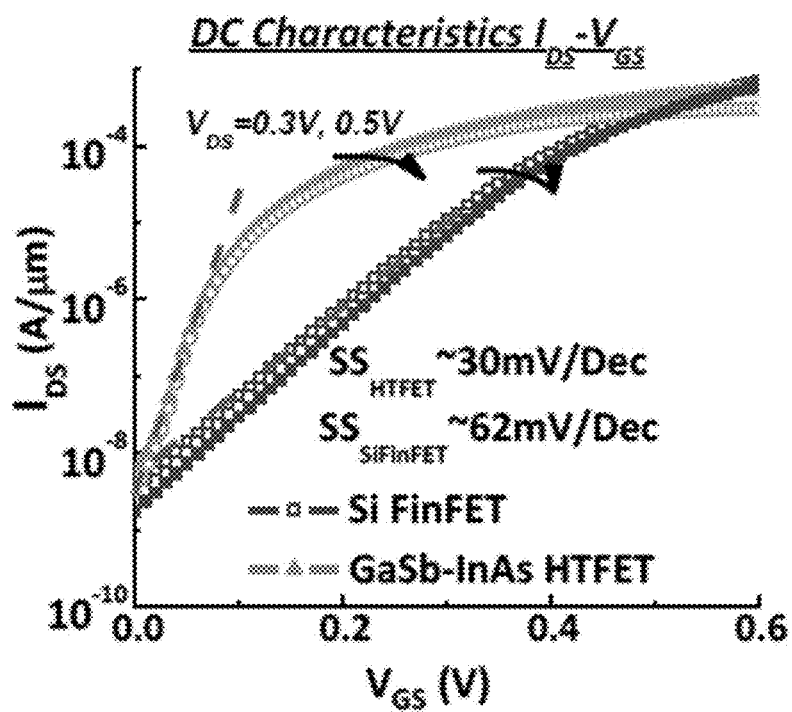
FIG. 7 is graph of a comparison of drain to source current, $I_{ds}$, and gate to source voltage, $V_{gs}$, for a HTFET used in preferred embodiments of the present invention and an Si FinFET.

An exemplary embodiment of the present invention is provided in comparison to a baseline of a Si FinFET device. Again, the comparison was made using a Verilog-A model in a TCAD Sentauraus modeling environment. As shown in FIG. 7, for Low Operating Power ("LOP") operation, a HTFET with a gate-length of 20 nm shows 7 times on-current improvement over an Si FinFET at $V_{CC}$=0.3V with an average Subthreshold Swing ("SS") of 30 mV/decade over 2 decades of the current change. Off-state current, $I_{off}$, for both the HTFET and Si FinFET, is 5 nA/µm. In the models tested, the TFET and Si FinFET models were tuned to have a fixed $I_{off}$ at $V_{ds}$=0.5 V. Since the p-type TFET solution is still in development, symmetrical p-type device performance with the same drive strength was assumed for both the Si FinFET device and the HTFET device.

PCE is the ratio of the average output power at a load to the average real input power to a rectifier. It has been found that a transistors' on-resistance, Ron, and reverse conduction induce a voltage drop, $V_{drop}$, as well as a power loss across a rectifier. Thus, a higher Ron value and higher reverse conduction value will reduce the output voltage range and the power delivered to a load.

Figure 8A:
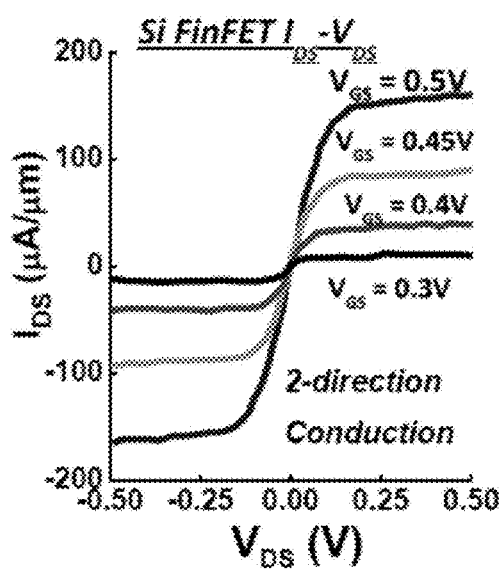
FIGS. 8a and 8b are graphs of the drain to source current, $I_{ds}$, and drain to source voltage, $V_{ds}$, for an Si FinFET and for an HTFET, respectively.
Figure 8B:
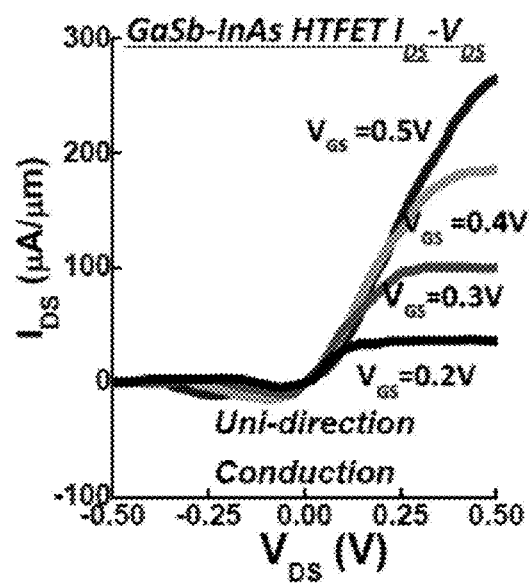
Figure 9A:
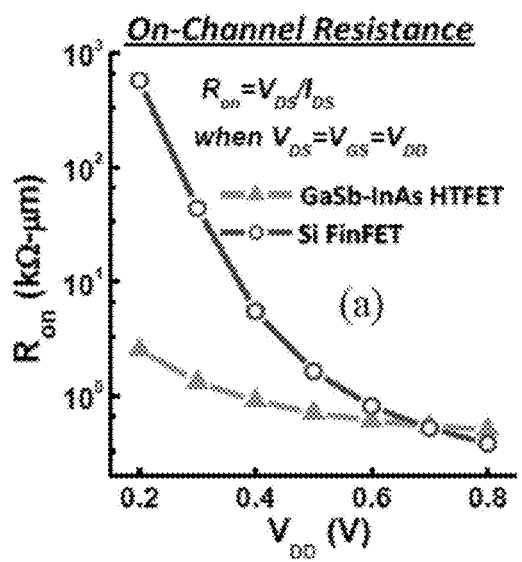
FIG. 9a is graph of a comparison of on-channel resistance versus supply voltage comparing a Si FinFET and an HTFET used in preferred embodiments of the present invention.
Figure 9B:
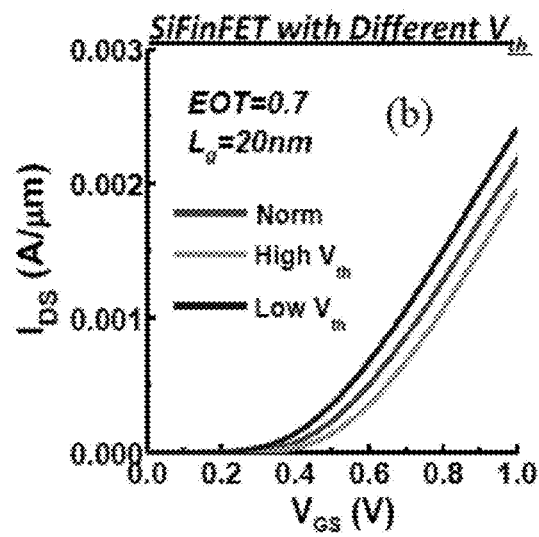
FIG. 9b is graph of drain to source current, $I_{ds}$, and gate to source voltage, $V_{gs}$, for Si FinFET models with different threshold voltages, $V_{th}$.

As shown in FIG. 8b, an HTFET exhibits uni-directional conduction characteristics due to the p-i-n device structure when compared to a Si FinFET. The uni-directional conduction characteristics reduce reverse-conduction induced power loss. Additionally, FIG. 9a shows that an HTFET has lower Ron compared to an Si FinFET (shown in FIG. 9b) due to the steep slope switching, i.e. a high current drive at low $V_{CC}$. The steep slope switching can improve the PCE of a rectifier for a fixed load. Another benefit from the steep slope switching is the reduced "turn-on" voltage, which can lead to the improved output voltage $V_{DC, out}$. It should be noted that since a threshold voltage, $V_{th}$, definition for TFET varies due to the tunneling mechanism, the term, "turn-on" voltage is used herein.

Figure 10A:
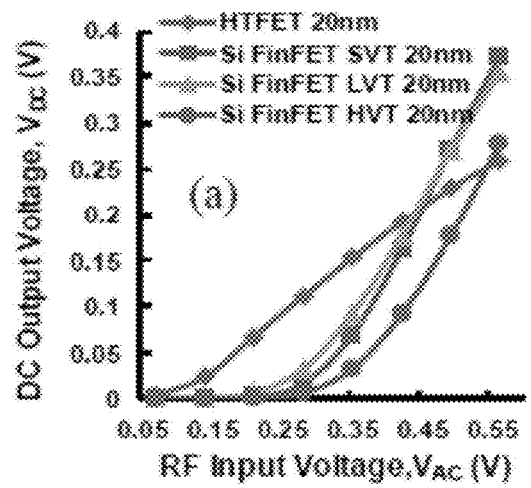
FIGS. 10a and 10b are graphs of a comparison of DC output voltages and DC output power responses, respectively, of an HTFET rectifier embodying the present invention and various Si FinFET rectifiers with different threshold voltages, $V_{th}$.
Figure 10B:
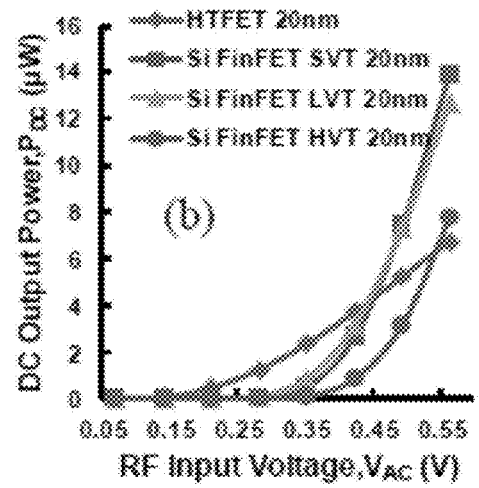

As seen in FIGS. 10a and 10b, the low turn-on voltage and leakage power trade-off of TFET design was compared with multiple Si FinFET models with different values of $V_{th}$. With regard to FIGS. 10a and 10b, a high-$V_{th}$ and low-$V_{th}$ represent a +0.05V and −0.05V $V_{th}$ shift, respectively, compared to a nominal Si FinFET case, where the Equivalent Oxide Thickness ("EOT") and Channel Length, Lg, are 0.7 and 20 nm, respectively. Further, device simulation parameters for the comparison described herein are shown below in Table 1:

TABLE 1

| | |
|---|---|
| Channel Length ($L_g$) | 20 nm |
| EOT (HfO$_2$) | 0.7 |
| HTFET Device Body Thickness ($t_{Body}$) | 7 nm |
| Si FinFET Fin Width ($W_{Fin}$) | 10 nm |
| n-type HTFET Source (GaSb) Doping | $4 \times 10^{19}$ cm$^{-3}$ |
| n-type HTFET Drain (InAs) Doping | $2 \times 10^{17}$ cm$^{-3}$ |
| Si FinFET Source/DrainDoping | $1 \times 10^{20}$ cm$^{-3}$ |
| HTFET Material Bandgap ($E_g$) and Hetero-Interface Band Alignment ($\Delta E_c$): $E_{g,GaSb}$ = 0.804 eV, $E_{g,InAs}$ = 0.44 eV, $\Delta E_c$ = 0.796 eV | |

The simulation parameters used for the baseline rectifier design are $C_1$, $C_2$, CL equal to 10 picofarads, the load resistance $R_L$ equals 10 kΩ, $W_n$=0.1 μm, $W_p$=0.2 μm, for a single stage. The rectifier topology was analyzed under the condition that perfect impedance matching is obtained in order to evaluate the intrinsic performance of the rectifier designs. FIGS. 10a and 10b demonstrate the DC output voltage performance comparison of HTFET rectifier with a Si FinFET rectifier having a standard threshold voltage, labeled as SVT, having a low threshold voltage, labeled LVT, and high threshold voltage, labeled HVT.

As seen in FIG. 10a, an HTFET rectifier has a larger DC output voltage than the Si FinFET options at input voltage ranges up to around 0.4V. At an input voltage of 0.1 V, the DC output voltage of the HTFET rectifier is approximately 95 times that of the LVT Si FinFET, approximately 488 times to that of the SVT Si FinFET, and approximately 1587 times that of the HVT Si FinFET. In spite of tuning the threshold voltage of a Si FinFET rectifier, the HTFET rectifier has better performance for weak RF input signals. It is observed that the performance of an HTFET rectifier is superior until around an input voltage of 0.4V. Beyond that point, Si FinFET rectifiers typically have better performance with increasing RF input levels. This is because tunneling currents that are effective in an HTFET are limited above input voltages around 0.4V.

FIG. 10b shows the DC output power performance comparison of an HTFET rectifier with Si FinFET rectifier with the three different Si FinFET device options discussed above. Since the DC output voltage of an HTFET rectifier is large for a given load, DC output power is also higher compared to using a Si FINFET for most of the range of RF input voltages, VAC, considered. At an input voltage of roughly 0.4V amplitude, a single stage HTFET rectifier can provide a DC output power of approximately 3.5 μW, whereas the LVT Si FinFET rectifier will provide approximately 2.2 μW, the SVT Si FinFET rectifier will provide approximately 1.8 μW, and the HVT FinFET rectifier will provide approximately 0.4 μW.

In addition to the size of the coupling capacitors, the size of transistor elements, and the number of stages of a rectifier, the frequency of an RF input signal will also affect the performance of a TFET rectifier. At 100 MHz, TFET rectifier circuit performance is almost similar to that at 10 MHz. With the further increase in frequency up to 1 GHz, the TFET rectifier performance slightly degrades due to the increase in $P_{Switching}$. Thus, using TFETs one can design Ultra-High Frequency ("UHF") RFID rectifiers for increased communication range with a slightly reduced performance. In addition, the load resistance of a TFET rectifier will affect performance. With an increase in the load resistance, the rectified DC output voltage increases slightly. Since the load current also reduces for greater values of load resistance, the rectified DC output power is nearly the same and has similar PCE values. At an RF input voltage of 0.4V, for a load resistance equal to 10 kΩ, the DC output voltage is around 0.111, while at a load resistance of 100 kΩ, the DC output voltage is 0.232V. Further, at a load resistance of 1,000 kΩ, the DC output voltage is 0.264V for a TFET rectifier according to the parameters above.

Figure 11A:
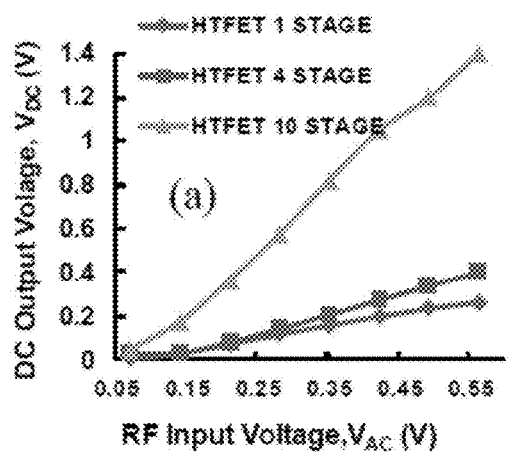
FIGS. 11a and 11b are graphs of DC output voltage and DC output power, respectively, of a TFET Rectifier Topology in multi-stage configuration embodying the present invention.
Figure 11B:
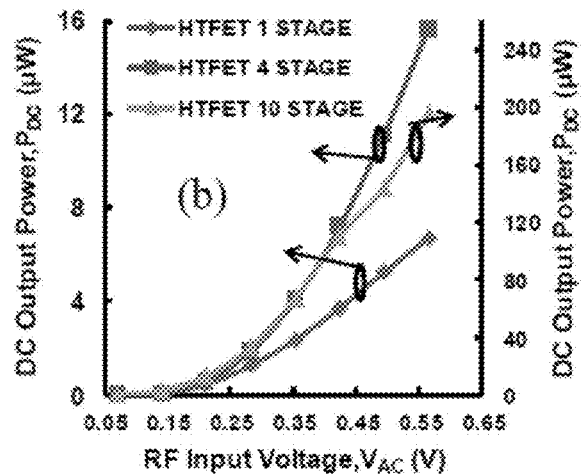

Additionally, multi-stage configurations of a TFET rectifier can achieve large output DC voltages when serially stacked along a DC path and connected in parallel to the input RF terminals. FIGS. 11a and 11b present the DC output voltage and DC output power of a TFET rectifier with 1, 4 and 10 stages, respectively, where the topology of a single rectifier stage is shown in FIG. 3. Multi-stage topology significantly increases the DC output of TFET rectifier. According to design analysis, a 4 stage TFET rectifier demonstrates an improvement of 1.3 times the DC output voltage of a single stage device at an input voltage of VRF=0.35V AC and a 10 stage TFET rectifier demonstrates an improvement of 5.3 times the DC output voltage of single stage device at an input voltage of VRF=0.35V AC.

DC output power also improved for a multi-stage rectifier design compared to a single stage design. A 4 stage TFET rectifier saw an improvement of 1.7 times the DC output power at an input voltage of VRF=0.35 VAC compared to a single stage device and a 10 stage TFET rectifier saw an improvement of 28.6 times the DC output power at an input voltage of VRF=0.35V AC compared to a single stage device. However, due to increased losses, the PCE for a 10 stage TFET rectifier decreased from 98% to 93% when compared to a single stage device. Similarly, a significant improvement in the DC output power of 10-stage TFET rectifier was observed in comparison to single and 4-stage TFET rectifier. Similar analysis was carried out for a 15 stage device, but the improvement is not as drastic.

The capacitors $C_1$ and $C_2$ shown in FIG. 3 may be considered to be coupling capacitors and they strongly affect the rectifier input impedance and thus rectifier output. With the increase of coupling capacitance, the rectifier input impedance is reduced and thus more input current flows through the TFET devices. And, while the on-resistance induced thermal power loss, $P_{Ron}$ increases conduction losses, the DC output voltage and power also increase. The device capacitance switching induced dynamic power, $P_{Switching}$, also increases with larger coupling capacitors. However, once $P_{Switching}$ becomes comparable with $P_{Ron}$, the performance of the rectifier based on DC power output characteristics goes down. In a preferred embodiment, the first and second capacitors $C_1$ and $C_2$ have a value of 10 femtofarads.

Transistor component sizing also plays a role in a rectifier design. A larger width to length device ratio leads to larger device capacitances, because of larger device capacitance switching induced dynamic power, $P_{Switching}$, and smaller on-resistance, Ron. By increasing transistor sizing, DC output voltage and power increases, as long as switching losses are a small fraction of the on-channel conduction losses. Once the switching losses become comparable to conduction losses, increases in transistor sizing offer little to no improvement on the DC output characteristics.

Figure 12:
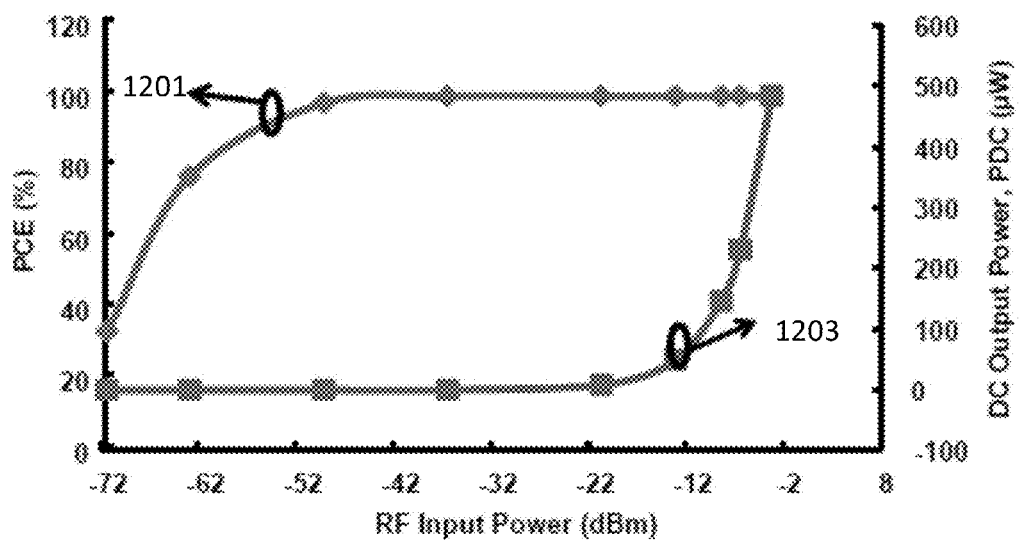
FIG. 12 is graph of a comparison of Power Conversion Efficiency ("PCE") and DC output power variation of a 10 stage TFET Rectifier embodying the present invention and a 4 stage TFET embodying the present invention under optimal conditions.

Design optimization has been performed for a 10 stage TFET rectifier at 915 MHz with a ratio of $W_p$ to $W_n$ equal to 1; $W_p$ and $W_n$ equal to 0.75 μm; $C_1$, $C_2$, and CL all equal 10 femtofarads; and the load resistance, $R_L$, equal to 10 KΩ based on design exploration according to the analysis described above. FIG. 12 demonstrates the variation of PCE and DC output power of a 10-stage TFET rectifier for varying RF input power levels. The top line 1201 in FIG. 12 represents PCE vs. RF input power, and the bottom line 1203 represents DC output power v. RF input power. The PCE values and DC output power both vary with the RF input power. Thus, for RF input power levels of −72 dBm to −36 dBm, the DC output power level varies from 73 pW to 0.2 µW with significant improvement in PCE. From −36 dBm to −13 dBm input levels, there has been a significant increase in output power, from 0.2 µW to 50 µW. This shows one can achieve good communication range of approximately 10-100 meters with increased sensitivity values using a multi-stage TFET rectifier.

As shown in Table 2, using the 10-stage rectifier for $V_{IN}$, AC=0.1V, the optimized TFET rectifier has 8.4 times larger DC output voltage than a baseline TFET rectifier. The baseline TFET rectifier ("Non-Optimized" in Table 2) refers to a 10-stage TFET rectifier with transistor size that has a ratio of $W_p$ to $W_n$ equal to 2; $W_p$ and $W_n$ equal to 0.1 µm; $C_1$, $C_2$, and CL all equal 10 picofarads; and the load resistance, $R_L$, equal to 10 KΩ. The baseline TFET rectifier operates at a frequency of 915 MHz.

TABLE 2

| Case | $V_{DC}$ (V) ($V_m$ = 0.1 V) | $P_{DC}$ (µW) | PCE (%) | 0.3 $V_{DC}$ Sensitivity (dBm) | RF Range (m) |
|---|---|---|---|---|---|
| Non-Optimized | 0.042 | 0.18 | 93 | −20 | 20 |
| Optimized | 0.354 | 12.5 | 98 | −24 | 30 |

For the same conditions, the optimized TFET rectifier has 69.5 times larger DC output power than un-optimized one. Also, the power consumption of the un-optimized TFET rectifier is approximately 13.4 nW and that of the optimized one is approximately 0.46 nW. For the rectifier that can produce a DC output voltage of 0.3V, driving a load of 10 KΩ (with a load current of 30 µA), minimum DC output power will be around 9 µW. The optimized rectifier is able to achieve this with a sensitivity of −24 dBm and the non-optimized rectifier has a sensitivity of −20 dBm. This means the optimized TFET rectifier can have the similar performance at around 30 m RF communication range in comparison to the un-optimized one operating at around 20 m communication range.

The communication range using a TFET rectifier for passive RFIDS can be further increased using more rectifier stages and following the optimization procedure described above. Table 3 summarizes the performance and benchmarking of optimized TFET rectifier with published data. The Friis equation was used to estimate communication range. With the 10-stage optimized TFET rectifier, 98% of PCE with 0.5 nW of power consumption, sensitivity of −24 dBm for 9 µW $P_{DC}$ (which corresponds to a free-space communication range of around 30 m) and sensitivity of −33 dBm for 0.4 µW $P_{DC}$ (which corresponds to a free-space communication range of around 90 m) was achieved.

TABLE 3

| | [1] | [2] | [3] | [4] | [5] | This work |
|---|---|---|---|---|---|---|
| Technology | 0.18 µm CMOS | 0.5 µm CMOS | 0.25 µm CMOS | 0.18 µm CMOS | 0.13 µm CMOS | 20 nm HTFETs |
| Device $V_{th}$ (V) | 0.437/−0.450 | 0.75/−0.9 | 0.4/−0.4 | 0.1/−0.29 | LVT, ZVT, ZVTDG | ~0.110 |
| Year | 2009 | 2013 | 2010 | 2007 | 2012 | 2013 |
| Rectifier Topology | 4-T Differential drive | Active Voltage doubler | 4-T Modified differential-drive | 4-T Modified differential-drive | 2-T Dickson multiplier | 4-T Differential Drive |
| RF input power (µm) | 114 | 7300 | ~91 | 10-200 | 0.1-2.5 | 7 pW-500 µW |
| $V_{RF}$(V) | — | 1.46 | 0-1.8 V | — | — | 0.010-0.5 V |
| DC output voltage (V) | 0.8 | 2.4 | (0-2.6 V) 1.4 V | 0.5 | 0.2-2.6 | 0.5 m V-2.2 V |
| DC output power (µw) | 64 | 5800 | ~65 | 5 | ~100 | 25 pW-484 µW |
| RF Frequency (MHz) | 953 | 13.56 | 915 | 900 | 915 | 915 |
| $R_L$ (kΩ) | 10 | 1 | 30 | 1000 | 1000 | 10 |
| $C_{in}$ and $C_L$ | 1.13 pF/1.13 pF | 1 µF/1 µF | Nil/0.5 pF | —/1.19 pF | 1 pF/1 pF | 10 fF/10 fF |
| Power Consumption (µw) | 1 stage (38 µW) | 800 | ~25 | — | — | 0.5 nW |
| Number of stages | 1.3 | — | — | 2 | 30, 50, 70 | 10 |
| Peak PCE (%) | 67.5 | 79 | 71.5 | — | — | 98 |
| Sensitivity (dBm) | −12.5 | ~+8.6 | −4 | −24.7 | −32 with 50 stages | −24 for 9 µW $P_{DC}$ −33 for 0.4 µW $P_{DC}$ |
| RF range (m) (For 4W EIRP) | 8.7 | ~0.0007 | ~3 | 26 | 66 with 50 stages | 30 for 9 µW $P_{DC}$ 90 for 0.4 µW $P_{DC}$ |

TABLE 3-continued

|  | [1] | [2] | [3] | [4] | [5] | This work |
|---|---|---|---|---|---|---|
| Charging Time (s) | — | — | — | — | 155 ms for 50 stages | 0.4-0.6 µs for 1 stage and few µs for 10 stages |

[1]: K. Kotani et al., "High-efficiency differential-drive CMOS rectifier for UHF RFIDs," *IEEE JSSC*, 44(11), pp. 3011-3018, Nov. 2009.
[2]: P. Theilmann, et. al, "Near zero turn-on voltage high-efficiency UHF RFID rectifier in silicon-on-sapphire cmos," in *IEEE RFIC*, pp. 105-108, May 2010.
[3]: S. Oh et al, "A −32 dbm sensitivity RF power harvester in 130 nm CMOS," *IEEE RFIC*, pp. 483-486, Jun. 2012.
[4]: S. Mandal et al, "Low-power CMOS rectifier design for RFID Applications," *IEEE Trans. on Circ. and Syst. I*, vol. 54, no. 6, pp. 1177-1188, Jul., 2007.
[5]: S. Y. Wong, and C. Chen, "Power efficient multi-stage CMOS rectifier design for UHF RFID tags," *Integration, the VLSI Journal*, vol. 44, iss. 3 pp. 242-255, Jun. 2011.

Further information about the power rectifier of the present invention is disclosed in our article "Tunnel FET based ultra-low power, high sensitivity UF RID rectifier," published in 2013 *IEEE International Symposium on Low Power Electronics and Design (ISPLED)*, pp 157-162, September 2013, which is incorporated herein by reference.

Figure 13:
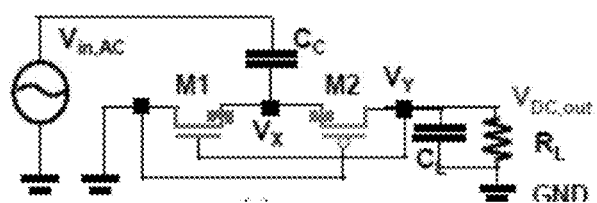
FIG. 13 is a circuit diagram of another TFET rectifier embodying the present invention.

FIG. 13 is a diagram of a second present preferred HTFET RF rectifier and shows the H2T SVC rectifier using HTFETs which employs a known CMOS design. This topology is derived from the conventional diode-connected rectifier, except that it uses the DC output voltage $V_{DC,out}$ to statically "cancel" the threshold voltages of the transistors. The gates of N-HTFET $M_1$ and P-HTFET $M_2$ are statically biased to the $V_{DC,out}$ and the ground, respectively. During the negative half of the cycle (when the input voltage amplitude $V_{RF,in}$<0V), $M_1$ switches on as $V_{gs},M_1=V_{DC,out}+|V_{RF,in}|>V_{th}$, $M_1$ ($V_{th},M_1$ is the turn-on voltage of the $M_1$), while $M_2$ is off. The current flows from VY to VX through the load resistor $R_L$ and the virtual ground. Similar operation is applied to the positive half of the cycle for P-HTFET switching-on. Compared to the diode-connected rectifier design, this static bias boosts the $V_{gs}$ of the transistors with $|V_{DC,out}|$ to improve the sensitivity of the weak incoming RF signal, which also effectively reduces the on-state channel resistance Ron power loss accordingly. Note that with the same input voltage amplitude $V_{RF,in}$, the H2T rectifier has a larger $V_{DC,out}$ than the designs using the differential-drive signals (e.g. the first embodiment H4T rectifiers). A main drawback in this design is the static voltage bias remains at the transistor off-state, causing an increase of the leakage current and the power loss and hence a relatively low PCE.

Figure 14:
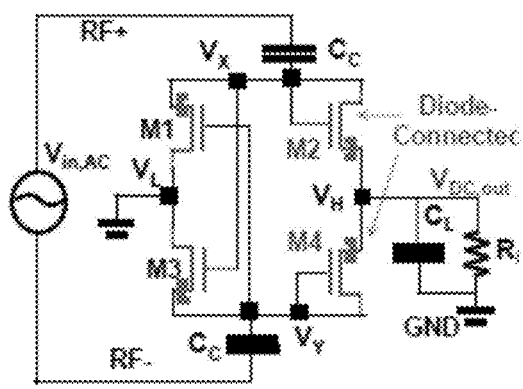
FIG. 14 is a current diagram of yet another TFET rectifier embodying the present invention.
Figure 15:
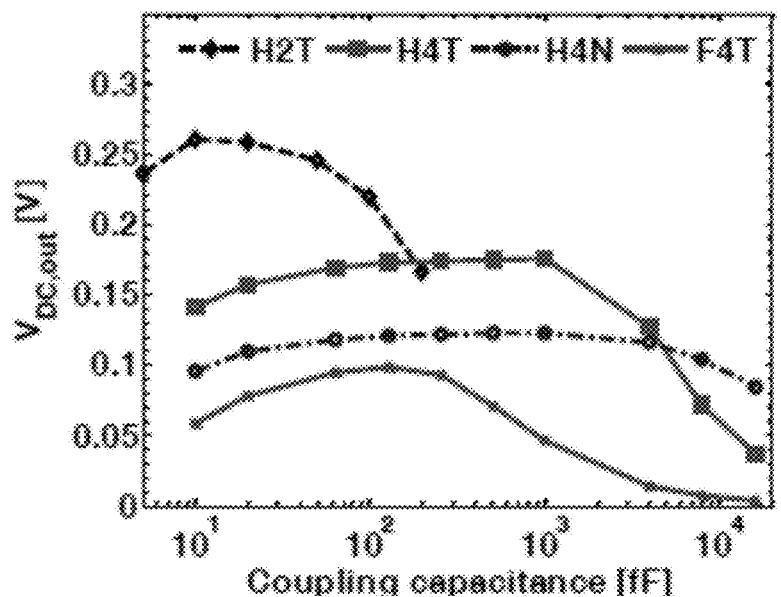
FIG. 15 is a graph of output voltage versus coupling capacitance at 2.0 V input amplitude with 1.0 MΩ $R_L$, 60 nm transistor width for H2T, and 1.5 μm transistor size for others.
Figure 16:
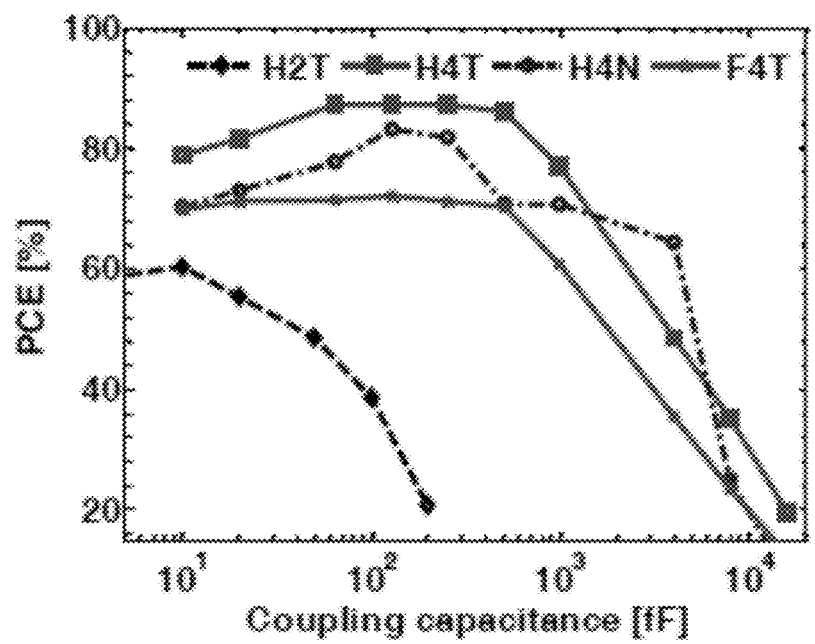
FIG. 16 is a graph of power conversion efficiency (PCE) versus coupling capacitance with 1.0 MΩ $R_L$, 60 nm transistor width for H2T, and 1.5 μm transistor width for others.

FIG. 14 shows a third present preferred HTFET circuit. Given the existing challenges of p-type III-V HTFET development and the degraded SS of P-HTFET, we present an N-HTFET-only RF rectifier by replacing the P-HTFETs with the diode-connected N-HTFETs as shown in FIG. 14. Such an N-HTFET-only design potentially further improves the performance of the H4T rectifier. The operation of the H4N rectifier is similar as the H4T rectifier, except that the rectifying operation of the P-HTFET in H4T design is completed by the diode-connected N-HTFET. Benefiting from its steep SS characteristics, the reduced turn-on voltage of the N-HTFET also contributes to a smaller turn-on voltage of the diode-connected N-HTFETs and higher sensitivity than the rectifiers using conventional diode-connected MOSFETs. We evaluated the performance of our circuits using DC output voltage $V_{DC,out}$ and PCE with regard to input RF We determined performance evaluation including DC output voltage $V_{DC,out}$ and PCE with regards to the input RF power level for different HTFET rectifier designs, and compare with the baseline F4T Si FinFET rectifier. We focused on examining the design parameters including transistor sizing, coupling capacitance, and their impacts on the peak PCE, $V_{DC,out}$ to seek for the optimal PCE and sensitivity range for energy harvesting applications.

In our simulations, the load resistance $R_L$ is set to be 1.0 MΩ, unless specified otherwise. In addition, the load capacitance CL is set to be the same as the input coupling capacitance CC for simulation simplicity.

Figure 17:
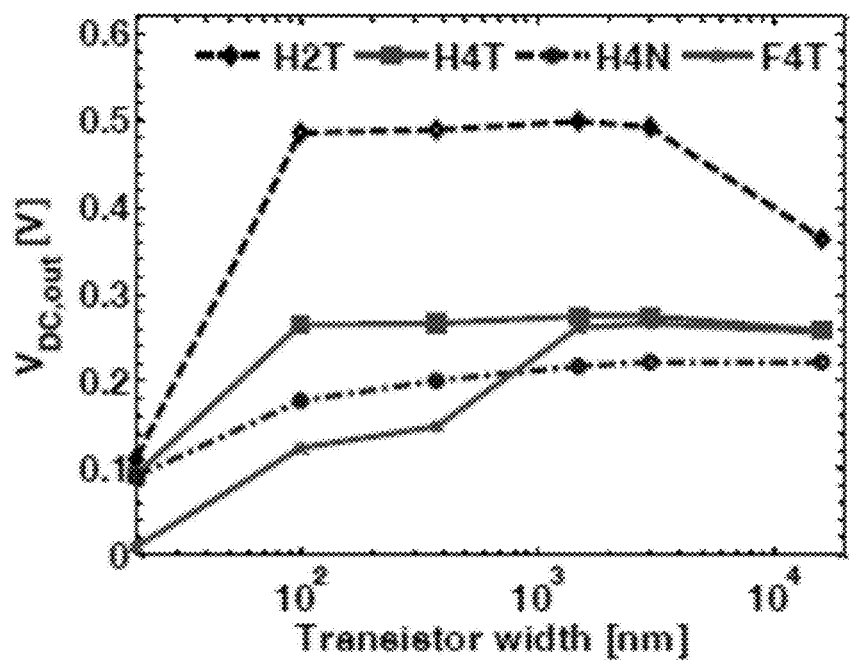
FIG. 17 is a graph of voltage output compared to transistor width at 0.30 V input amplitude with $C_C$=1.0 pF, $R_L$=1.0 MΩ.
Figure 18:
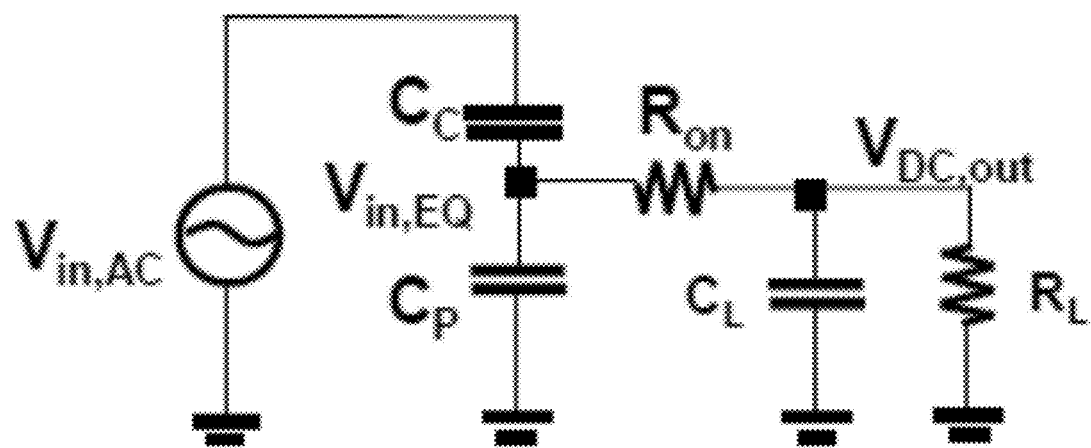
FIG. 18 is a circuit diagram of a capacitive divider model with the rectifier transistor capacitance $C_P$.

The transistor sizing has a strong impact on both the $V_{DC,out}$ and the PCE. The main tradeoff exists between a resistive power loss $P_{Resistive}$ due to non-zero on-state channel resistance Ron (decreases with transistor width W) and the other power losses in Eq. (14) due to the transistor capacitance (increases with W). FIG. 17 shows the simulated $V_{DC,out}$ at 0.3 V input versus W for H2T, H4T, H4N, and F4T (the previous art of 4-T Si FinFET cross-coupled rectifier) designs. When W increases, less Ron results in a higher $V_{DC,out}$ with less $V_{drop}$, until the transistor capacitance is prominent which limits the equivalent input voltage $V_{IN},EQ$. As illustrated in FIG. 18, the equivalent total transistor capacitance $C_P$ forms as an AC voltage divider in series with the input coupling capacitance $C_C$, and affects $V_{IN},EQ$ in the ways of:

$$V_{IN,EQ} = V_{RF,in} \times \frac{(j\omega C_P)^{-1} \| Z_L}{(j\omega C_C)^{-1} + (j\omega C_P)^{-1} \| Z_L}, \quad (17)$$

$$Z_L = R_{ON} + R_L \| (j\omega C_L)^{-1}. \quad (18)$$

As a result, a large W results in excessive $C_P$, which can lower the $V_{IN},EQ$ of the rectifier.

Figure 19:
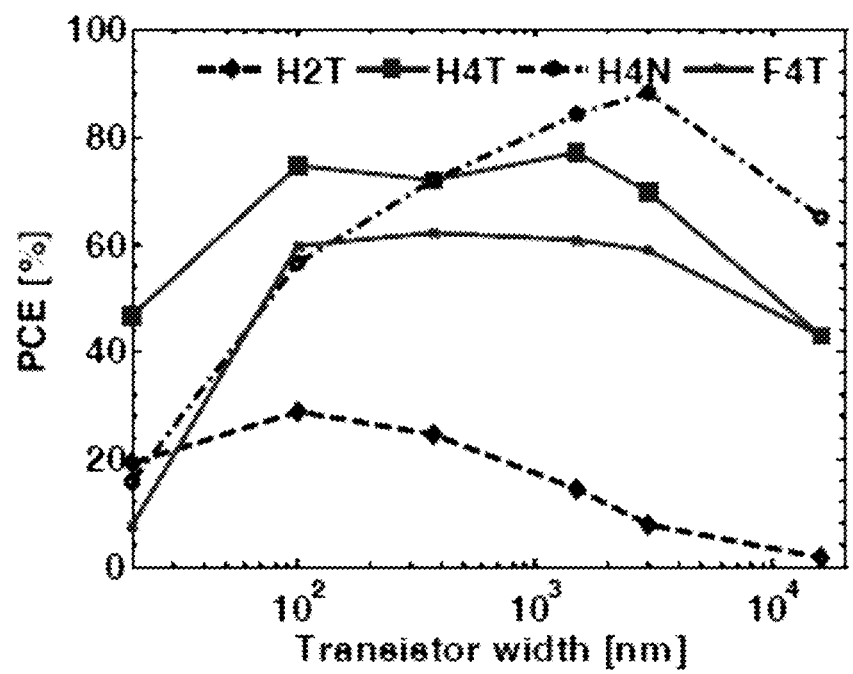
FIG. 19 is a graph of peak power conversion efficiency (PCE) versus the transistor width with $C_C$=1.0 pF, $R_L$=1.0 MΩ.

FIG. 19 shows the impact of W on the PCE. Each point in the PCE curves represents the peak PCE with different RF input power to obtain the optimized transistor width $W_{OPT}$ where the highest PCE occurs. For example, when W is smaller than $W_{OPT}$, $P_{Resistive}$ dominates; and when W is larger than $W_{OPT}$, the other power losses in Eq. (14) increase and degrade the PCE. As shown in FIG. 19, the optimum $W_{OPT}$ for the H4T rectifier is smaller than of the H4N rectifier. This is mainly because (1) the H4N rectifier needs a larger transistor W than that of the H4T rectifier to reduce the $V_{drop}$ across the diode-connected N-HTFETs, and (2) the diode-connected N-HTFET has less capacitance than the transistor connected N-HTFET arising from the dominant $C_{GD}$ in HTFET. When shorting the gate and the drain terminals, $C_{GD}=0$ reduces the total capacitance, leading to less $P_{Switching}$ and $P_{Resistribute}$. This allows us to choose a larger transistor size in the H4N rectifier design to compensate the increased $P_{Resistive}$ from the diode-connected transistor and achieve a comparable PCE with H4T designs at low RF input power.

Figure 20:
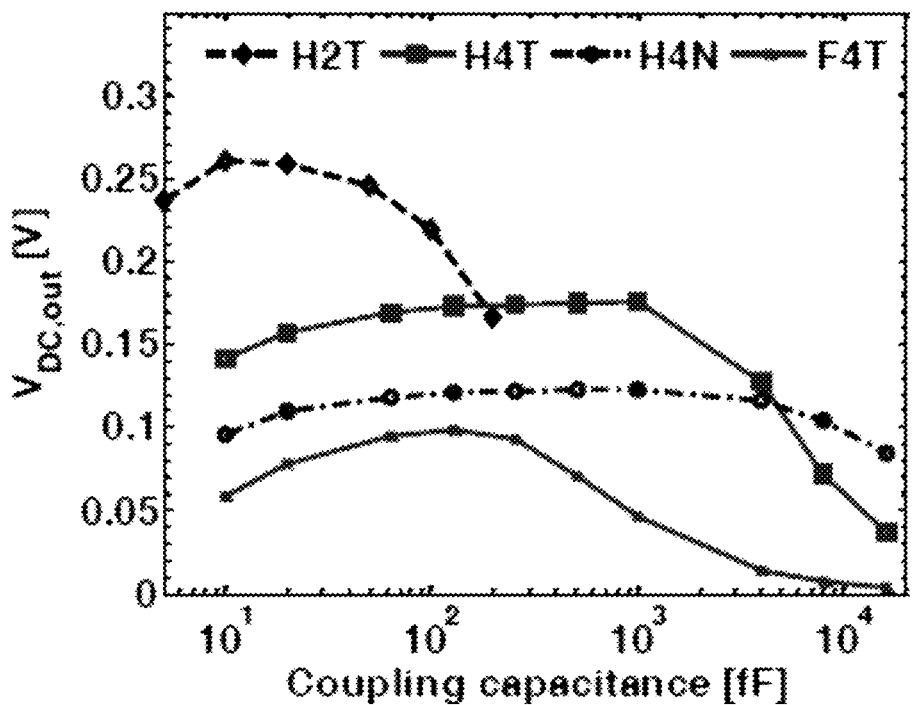
FIG. 20 is a graph of output voltage compared to coupling capacitance at 0.20 V input amplitude with 1.0 MΩ $R_L$, 60 nm transistor width for H2T, and 1.5 μm transistor size for others.
Figure 21:
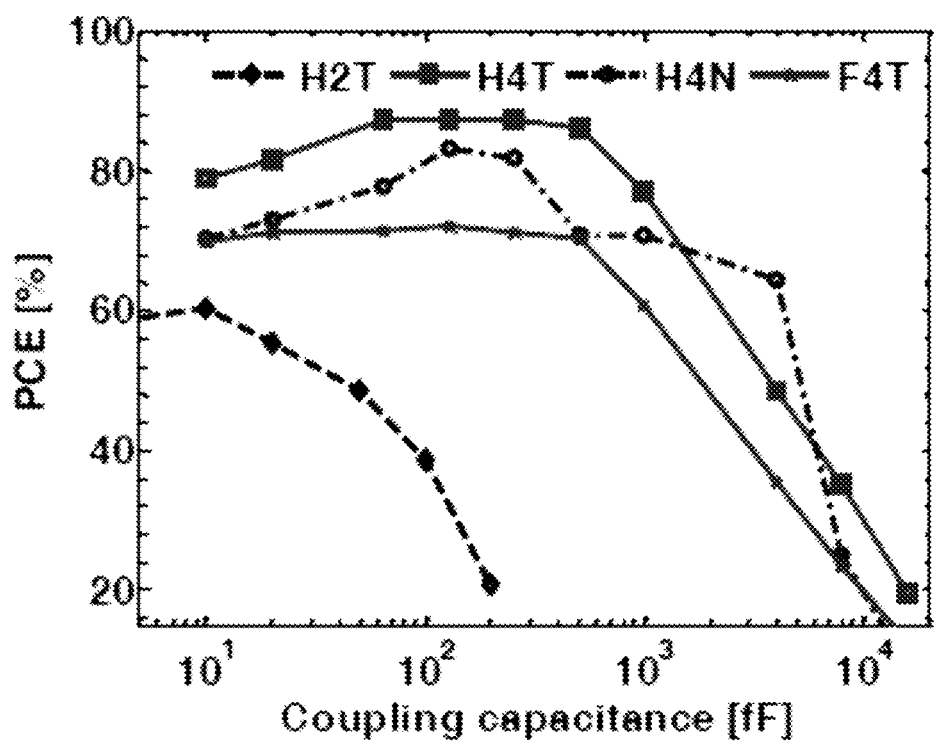
FIG. 21 is a graph of power conversion efficiency (PCE) compared to coupling capacitance with 1.0 MΩ $R_L$, 60 nm transistor width for H2T and 1.5 μm transistor size for others.

FIG. 20 and FIG. 21 illustrate the $V_{DC,out}$ and PCE dependence on the coupling capacitance $C_C$, respectively. The impact of $C_C$ on the rectifier can also be related to Eq. (17). When $C_C$ is small, $V_{IN,EQ}$ decreases resulting in a low $V_{DC,out}$ and PCE. On the other hand, when the $V_{RF,in}$ becomes dominant as $C_C$ increases both $V_{DC,out}$ and PCE decrease which degrade the performance. This analysis agrees with the simulation results in FIG. 20 and FIG. 21 for all evaluated topologies. Note that at a given $V_{RF,in}$, the H2T rectifier design exhibits a relatively large $V_{DC,out}$ and a degraded PCE compared to the other 4-T designs, which is expected.

Figure 22:
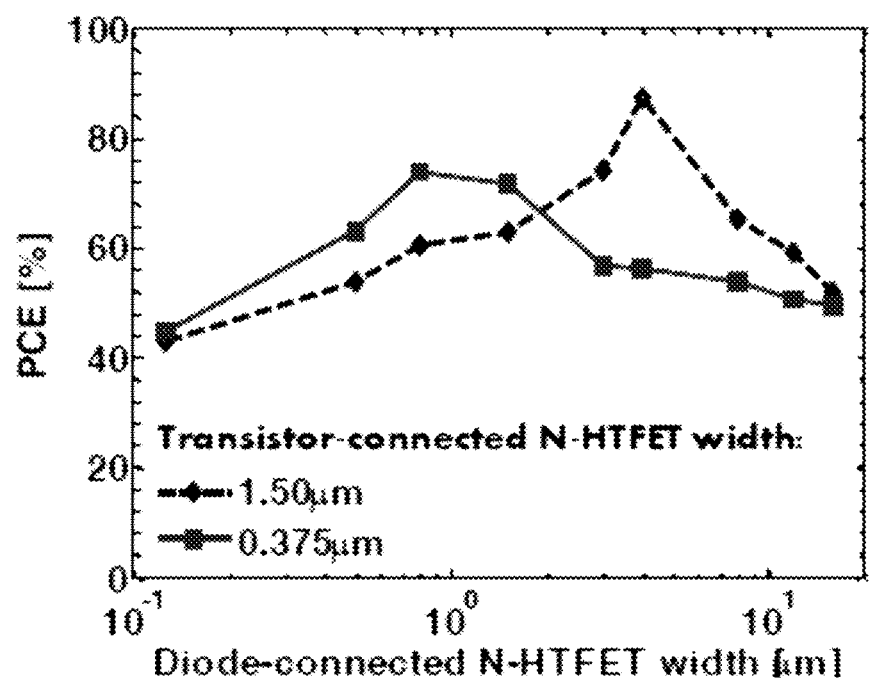
FIG. 22 is a graph of power conversion efficiency (PCE) compared to diode width with $C_C$=1.0 pF, $R_L$=1.0 MΩ.

Given that the H4N rectifier has two diode-connected N-HTFETs, the transistor size of the diode-connected and transistor-connected N-HTFETs should be optimized simultaneously to obtain the highest PCE. FIG. 22 illustrates the maximum PCE when varying the width of the diode-connected N-HTFET (WD) in the H4N rectifier. Hence, a WT/WD ratio of 1.5 µW/4 µm is applied for the optimal performance.

Based on the evaluations of the transistor sizing and coupling capacitance effects, we use the following design parameters for each rectifier topology for optimized performance: For H2T, $C_C$=0.2 pF, W=0.5 µm. For H4T, $C_C$=1.28 pF, W=5 µm; For H4N, $C_C$=2.56 pF, WT=15 µm, $W_D$=40 µm; For F4T, $C_C$=5.12 pF, W=5 µm. $R_L$=100 kΩ is used in the following evaluations.

Figure 23:
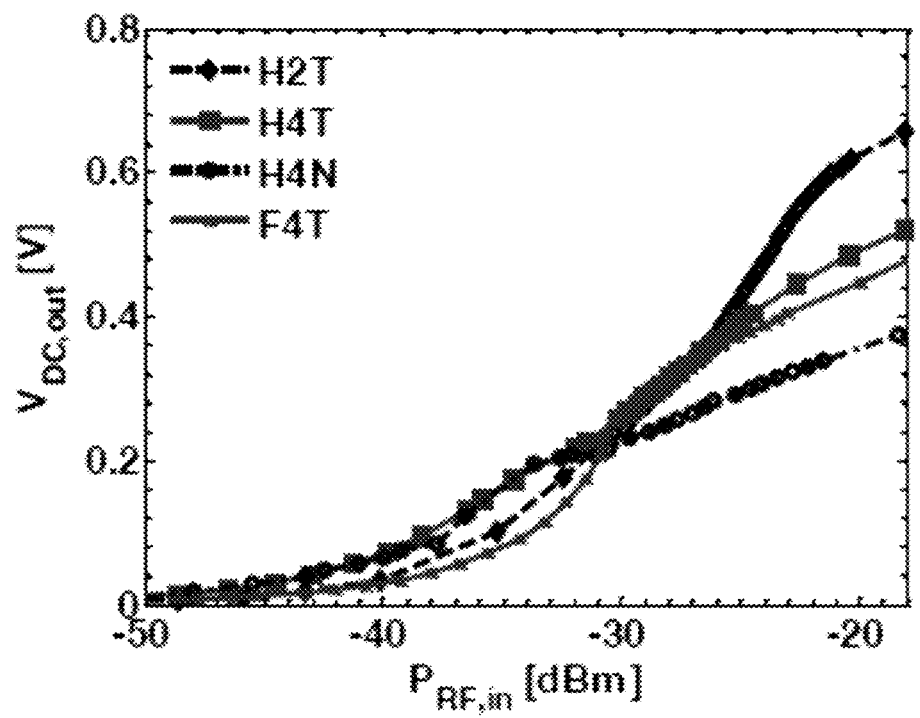
FIG. 23 is a graph of output voltage compared to RF input power for optimized single-stage rectifiers with 100 kΩ $R_L$.
Figure 24:
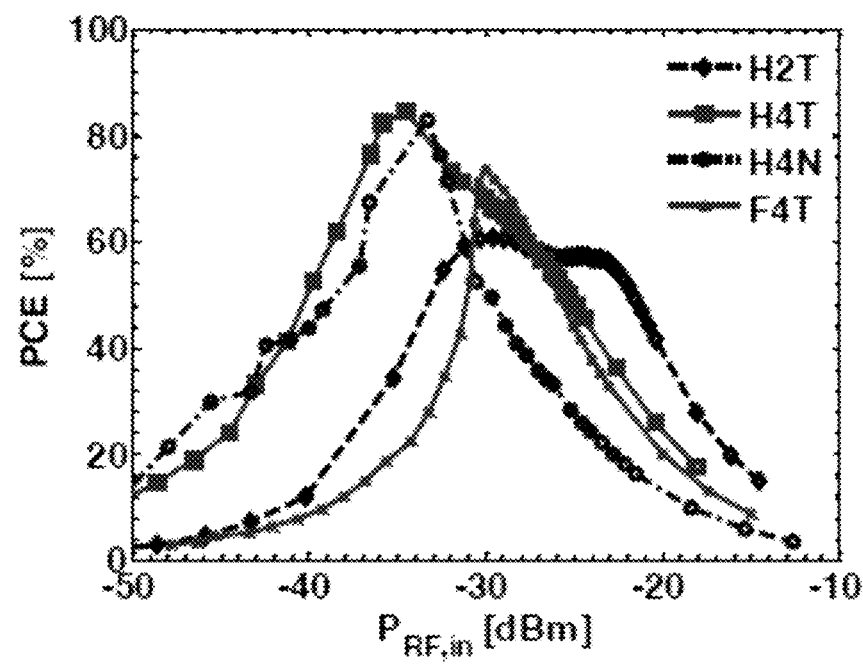
FIG. 24 is a graph of power conversion efficiency (PCE) compared to RF input power for optimized single-stage rectifiers with 100 kΩ $R_L$.

The $V_{DC,out}$ and PCE comparisons between the optimized rectifiers with different topologies are shown in FIG. 23 and FIG. 24 (with $R_L$=100 kΩ), respectively. When the input power $P_{RF,in}$ is lower than −30 dBm, the H4T and H4N rectifiers show higher $V_{DC,out}$ than the F4T rectifier. As $P_{RF,in}$ increases, a cross-over of the $V_{DC,out}$ occurs, where F4T rectifier shows a comparable $V_{DC,out}$ with H4T but higher than H4N. This is consistent with the analysis above. With a low $P_{RF,in}$, the reduced turn-on voltage and reduced Ron of the HTFET results in a higher $V_{DC,out}$ in the HTFET rectifier than that in the Si FinFET rectifier. As $P_{RF,in}$ increases, $V_{DC,out}$ of F4T is comparable with that of H4T and H4N due to improved on-state current of Si FinFET at higher input voltages, but also increases the reverse conduction induced power loss. As a result, $V_{DC,out}$ of H4T is comparable or even higher than that of F4T, benefited from its uni-directional conduction. Comparing the H4T and H4N designs, the optimized H4N shows a comparable $V_{DC,out}$ at lower $P_{RF,in}$, but a lower $V_{DC,out}$ than the optimized H4T at higher $P_{RF,in}$. This result is expected given the large transistor sizing of H4N as discussed in Section V.A, which complies with our design goal of optimal PCE at a low $P_{RF,in}$.

For the H2T rectifier, a lower $V_{DC,out}$ is observed when the given $P_{RF,in}$ is low compared to the H4T and H4N rectifiers, due to the inherent leakage power loss from the static gate-bias. As $P_{RF,in}$ increases to above −25 dBm, H2T rectifier shows a substantial increase of $V_{DC,out}$ compared to the others. This is because of the power loss reductions (including $P_{Switching}$ and $V_{RF,in}$) benefited from less and smaller transistors. At a high $P_{RF,in}$, the $P_{Resistive}$ contribution is reduced due to the increased $V_{RF,in}$, while the other power losses (see Eq. (3)) become dominant. Thus, the reduced power losses in the optimized H2T rectifier leads to a higher $V_{DC,out}$ for H2T in the high $P_{RF,in}$ range.

Similarly to $V_{DC,out}$ the PCE of the H4T and H4N rectifiers is significantly improved compared to that of the F4T rectifier, especially when $P_{RF,in}$ is lower than −31 dBm (FIG. 24). For the F4T rectifier, the peak PCE of 73.5% is achieved at −30 dBm $P_{RF,in}$, but drops significantly as $P_{RF,in}$ approaches to the lower range. When $P_{RF,in}$ is −35 dBm (0.32 µW), the PCE of the F4T rectifier drops below 21% (PDC,out of 0.067 µW), where the H4T and H4N rectifiers reach the peak PCE of 85% and 84% (PDC,out of 0.27 µW), respectively, which is desired for the ambient RF power harvesting applications. The H2T rectifier shows a degraded peak PCE (61%) compared to the other designs, but still outperforms the F4N at the lower $P_{RF,in}$ (following the $V_{DC,out}$ trend). At $P_{RF,in}$ above −25 dBm, the reduced capacitive loss continues to benefit the PCE of the H2T rectifier with a highest upper $P_{RF,in}$ limit to −22 dBm.

Figure 25:
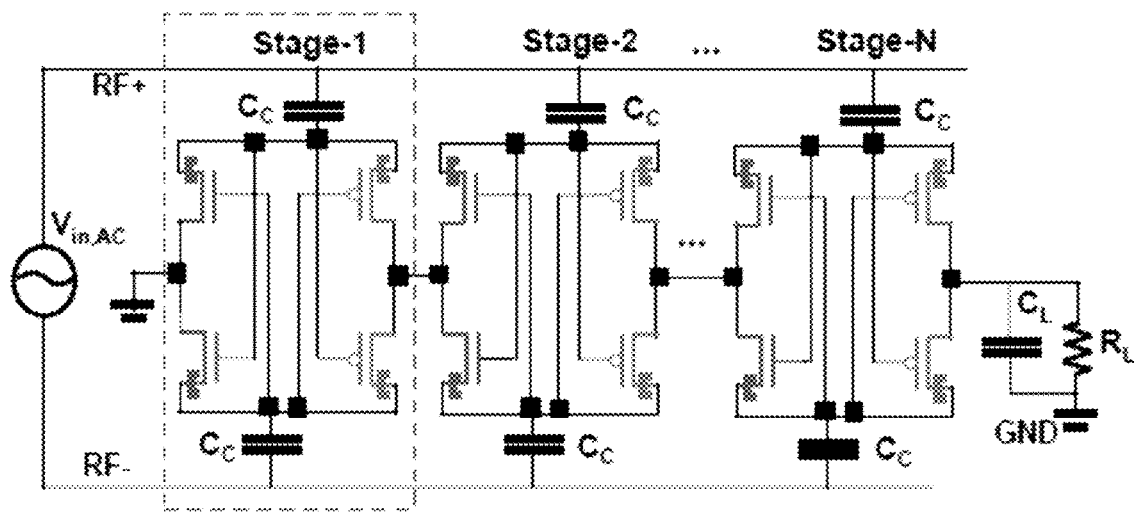
FIG. 25 is a circuit diagram of a multiple-stage rectifier using H4T design in accordance with the present invention.

For higher $V_{DC,out}$ multiple-stage rectifiers are usually employed at the cost of PCE degradation due to extra power loss from additional stages. FIG. 25 illustrates a multiple-stage rectifier configuration using the H4T. Similar connections can be applied to the other topologies. A coupling capacitor (CC) is required for each stage for DC blocking. It is important to note that the input capacitance of a multiple-stage rectifier is N-times that of a single-stage rectifier, where N represents the number of stages. This is because the input coupling capacitors CC of all stages are all connected to the RF input ports. As a result, the input impedance of the multi-stage rectifier strongly depends on the coupling capacitors CC.

Figure 26:
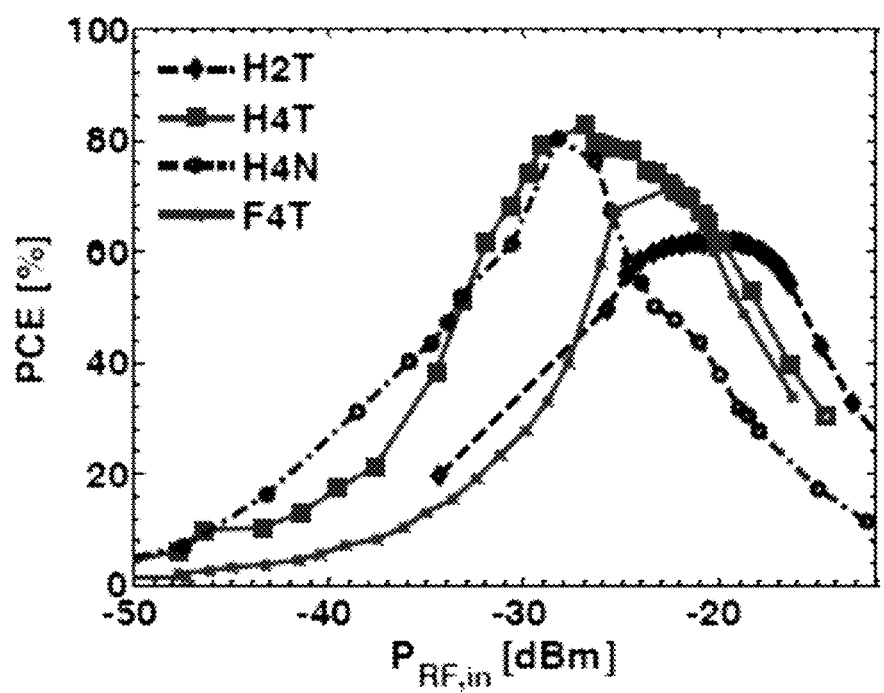
FIG. 26 is a graph of power conversion efficiency (PCE) for 2-stage optimized rectifier with 100 kΩ $R_L$.
Figure 27A:
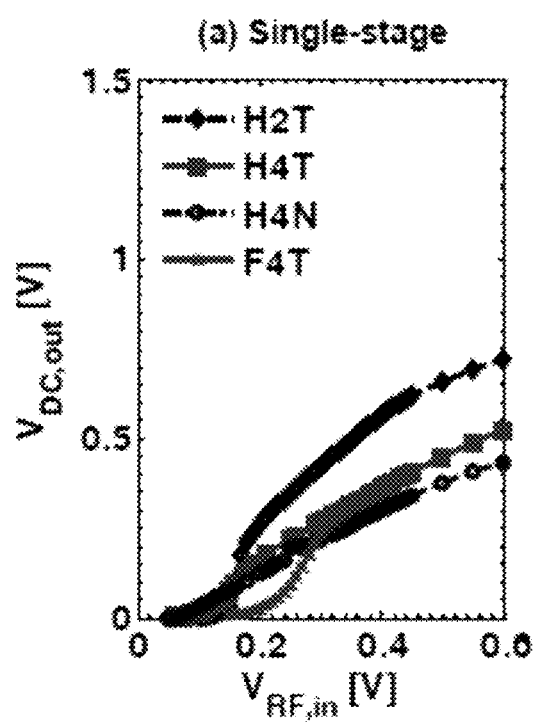
FIGS. 27a and 27b are graphs of voltage output compared to RF voltage input for a single stage rectifier with 100 kΩ $R_L$ and for 2-stage optimized rectifiers with 100 kΩ $R_L$, respectively.
Figure 27B:
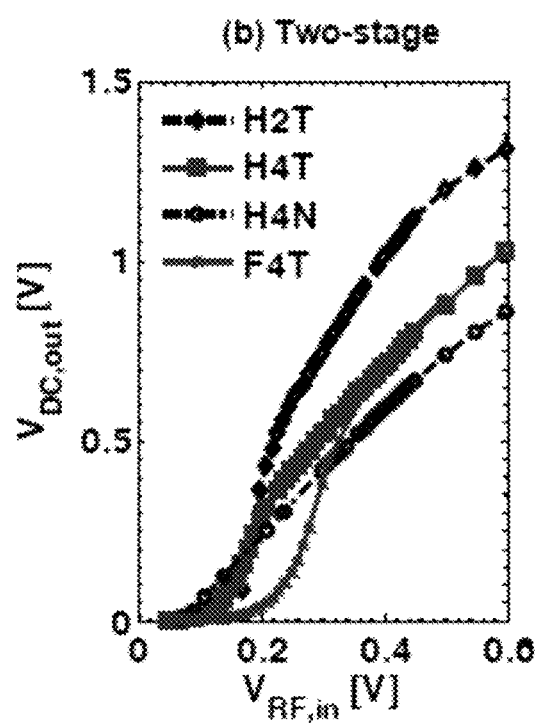

FIGS. 26, 27a and 27b show the $V_{DC,out}$ and PCE comparisons for the 2-stage rectifiers using different topologies. The same design parameters as the optimized single-stage rectifiers above are employed with the same $R_L$ of 100 kΩ. Peak PCE of 82% and 80% are obtained in the H4T and H4N rectifiers at −27 dBm and −28 dBm $P_{RF,in}$, respectively, while the 71% peak PCE is achieved in the F4T rectifier at −22 dBm $P_{RF,in}$. The degraded sensitivity of the 2-stage rectifier designs is due to the effective load change from the rectifier cascading. The advantage of a higher PCE for H4T and H4N preserves for the $P_{RF,in}$ below −26 dBm. Benefiting from the multiple-stage connection, at $V_{RF,in}$=0.3V, improved $V_{DC,out}$ of 0.5 V, 0.43 V and 0.75 V are achieved for the 2-stage H4T, H4N and H2T rectifiers, showing approximately 1.92×, 1.86× and 1.78× improvement than that of the single-stage cases, respectively, comparing to the 0.4 V $V_{DC,out}$ with 1.6× improvement obtained for the F4T rectifier. Since the $V_{DC,out}$ of the presented two-stage HTFET rectifier with over −26 dBm $P_{RF,in}$ is already higher than 0.4 V, which is sufficient for the supply voltage requirement for the HTFET circuits, multiple-stage rectifier designs with more than two stages.

TABLE 4

RF RECTIFIER PERFORMANCE BENCHMARKING*

| Rectifier topology | F4T | H2T | H4T | H4N |
|---|---|---|---|---|
| Process Technology | 20 nm Si FinFET | 20 nm HTFET | 20 nm HTFET | 20 nm HTFET |
| Transistor $V_{th,NFET}$, $V_{th,PFET}$ (V) | 0.21, −0.21 | 0.1, −0.12 | 0.1, −0.12 | 0.1, −0.12 |

TABLE 4-continued

| RF RECTIFIER PERFORMANCE BENCHMARKING* | | | | |
|---|---|---|---|---|
| Single-stage $P_{RF}$, in range (dBm) @ PCE > 50% | −31~−26 | −33~−22 | −40~−25 | −38.5~−30 |
| 2-stage $V_{DC,out}$ (V) @ $V_{RF,in}$ = 0.25 V | 0.13 | 0.61 | 0.41 | 0.32 |
| Single-stage $P_{DC, out}$ (µW) @ $P_{RF, IN}$ = −35 dBm | 0.06 | 0.12 | 0.27 | 0.16 |
| Single-stage peak PCE % @ $P_{RF, IN}$ (dBm) | 73.5 @ −30 | 61 @ −29.6 | 85 @ −34.5 | 84 @ −33.5 |
| Single-stage sensitivity (dBm) PCE > 50% | −31 | −33 | −40 | −38.5 |

*Data are obtained from simulations with 100 kΩ $R_L$ at 915 MHz RF input.

Table 4 summarizes the performance of the presented HTFET rectifiers, and the Si FinFET rectifier. Benefited from the reduced threshold voltages of the 20 nm technology, both Si FinFET and HTFET based designs show desired sensitivity down to −31 dBm input power with over 50% PCE, where the 4T HTFET rectifiers (H4T and H4N) exhibit even further improved the sensitivity range compared to the 4-T Si FinFET rectifier. For the single-stage designs, over 50% PCE can be achieved for H4T and H4N designs at the input RF power ranging from −40 dBm to −25 dBm and −38.5 dBm to −30 dBm, respectively, whereas the PCE of the optimized Si FinFET rectifier is less than 50% and drops fast for below −31 dBm input RF power. Although the H2T rectifier shows a degraded peak PCE of 61% compared to the other designs, a wider RF input power range from −33 dBm to −22 dBm for over 50% PCE is still achieved as compared to the F4T design. The significantly boost of the $V_{DC,out}$ can be achieved using the 2-stage configurations. This high PCE of the HTFET rectifiers also leads to an improved DC output power and desired DC output voltage in the low RF input power range, which is appealing to various energy harvesting applications.

The data presented here shows that by taking advantages of the turn-on voltage reduction and drive current improvement at low voltages enabled by the steep subthreshold slope, as well as the uni-directional conduction owing to its asymmetrical source/drain structure, HTFET exhibits superior performance advantages in terms of improving both PCE and sensitivity of the rectifiers to mitigate the technology limitations of conventional CMOS in ambient RF power scavenging. We have presented different HTFET RF rectifier topologies and design optimizations including the 2-T SVC (H2T), 4-T cross-coupled (H4T), and the 4-T N-HTFET-only (H4N) rectifier inspired from the 4-T cross-coupled topology. Evaluations of the optimized single-stage rectifiers have shown that a >50% PCE could be achieved in the H4T rectifier with an RF input power ranging from −40 dBm to −25 dBm, while the PCE of the baseline 4-T cross-coupled FinFET rectifier drops significantly for below −31 dBm input. A maximum PCE of 84% and 85% could be achieved in the presented H4N at −33.7 dBm input power and H4T at −34.5 dBm input power, respectively. Such superior PCE and sensitivity improvement of the HTFET rectifiers stems from optimizations based on the unique device characteristics, which highlights the steep-slope HTFET as a promising candidate in applications with RF-energy harvesting.

TFET-Based DC-DC Charge Pump Converter

Power supply is a primary issue in sensors to support a long stand-by time. To obtain a voltage supply that is high enough for circuit operations from low-voltage energy sources, such as wearable thermoelectric cells and solar cells in a dark office for example, DC-DC step-up charge pumps may be used to boost the voltage. For these charge pumps, the PCE is one of the key performance specifications because it determines the total power budget.

Figure 28A:
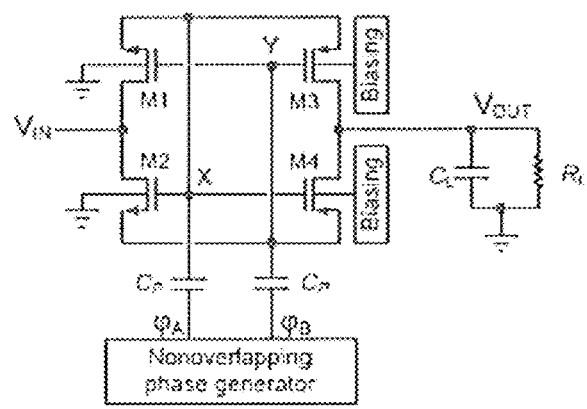
FIGS. 28a and 28b are a circuit diagram and the operation waveforms, respectively, of a conventional cross-coupled switched-capacitance charge pump.

The challenge is how to obtain a high PCE with a low input voltage, e.g. as low as 200 mV, which is much lower than the threshold voltage of most standard CMOS technologies. FIG. 28a illustrates a conventional cross-coupled switched-capacitance charge pump, behaving as a DC-DC voltage doubler with non-overlapping phase control signals. With a low input voltage, it cannot work with a high PCE because of the large turn-on voltage, or equally, large on-resistance of the switches in the sub-threshold region. Start-up mechanisms could be employed to kick-start the system using an extra charge pump, external voltage, or mechanical switch, but they also increase the system complexity significantly. Yet, TFET technology gives rise to possibility of a higher PCE for low-input-voltage applications.

Figure 28B:
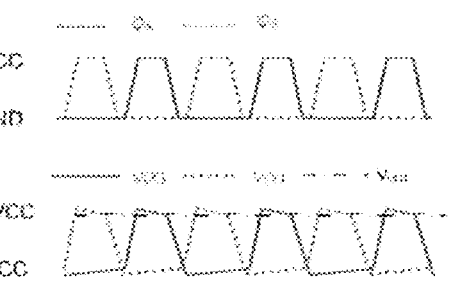

FIG. 28b illustrates the operation waveforms of the conventional cross-coupled voltage doubler in FIG. 28a. φA and φB are two non-overlapped phase control signals ranging from GND to $V_{CC}$. V(X) and V(Y) are the voltage on the top plate of the pump capacitor $C_P$. When φA goes low and φB goes high, V(X) drops to below $V_{CC}$ and V(Y) increases to $2V_{CC}$. Also, $M_1$ and $M_4$ are turned on while $M_2$ and $M_3$ are turned off. As a result, the top plate of capacitor is charged to $V_{CC}$ through $M_1$, and the output node is connected to the node Y through $M_4$. In the opposite phase, the charge pump operations are similar.

PCE is defined as the ratio of delivered energy to the output load $E_{OUT}$ to the input energy $E_{IN}$:

$$PCE = E_{OUT}/E_{IN} = E_{OUT}/(E_{OUT}+E_{LOSS}) \times 100\%, \quad (19)$$

where $E_{LOSS}$ represents the energy loss by the charge pump itself. For a resistive load $R_L$, the $E_{OUT}$ within a clock cycle T is:

$$E_{OUT} = P_{OUT}T = \overline{V_{OUT}^2}/f_{CLK}R_L, \quad (20)$$

where $f_{CLK}$ represents the clock frequency. For the charge pump in FIG. 28a, the energy loss $E_{Loss}$ could be described as:

$$E_{LOSS} \approx E_{DRIVER} + E_{REDIS} + E_{SW} + E_{REVERS} + E_{COND} \quad (21)$$

where $E_{DRIVER}$ represents the energy consumed by the nonoverlapping phase control driver, $E_{REDIS}$ represents the energy loss due to the charge redistribution of capacitors when switching occurs, $E_{SW}$ represents the switching loss due to charge and discharge of parasitic stray capacitance, $E_{REVERS}$ represents the energy loss due to reverse current conduction through the switches, and $E_{COND}$ represents the energy loss due to on-resistance of the switches and parasitic equivalent series resistance (ESR) of the capacitors. With a lowered input voltage, the major challenge is how to overcome the large on-resistance to obtain a small $E_{COND}$ and $E_{SW}$ at the same time. Increasing the switch size to reduce the on-resistance makes the switching loss $E_{SW}$ a new bottleneck.

For a TFET, the off-state current $I_{off}$ is controlled by the reverse biased diode leakage, and the on-state current $I_{on}$ is determined by the band-to-band tunneling at the source-channel junction under the gate control. And, two HTFET features that have essential impact on the PCE of a charge pump include the steep-slope and uni-directional conduction characteristics.

Thanks to the asymmetrical p-i-n structure and reduced drain doping to restrain the ambipolar transport, HTFET exhibits unique uni-directional tunnel current. As was illustrated in FIG. 8, when the p-i-n diode is forward-biased within $-0.6$ V<$V_{ds}$=$V_{neg}$<0 V, the drain-source current is negligible compared with the $V_{ds}$>0 V region. Furthermore, the subthreshold slope (SS) of TFET is not limited to 60 mV/decade, and with III-V material and heterojunction, the energy efficiency of III-V HTFET is higher than state-of-the-art CMOS technologies with a power supply lower than 0.5 V. With 5 nA/um off-state leakage for low-power applications, the HTFET has an average SS of 30 mV/decade over two decades of current, and seven times improvement of on-state current over 20 nm Si FinFETs at 0.30 V power supply.

Figure 29B:
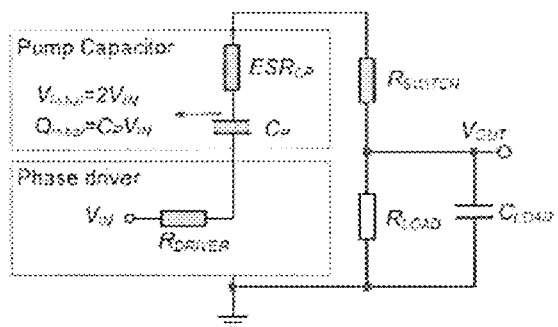
Figure 30A:
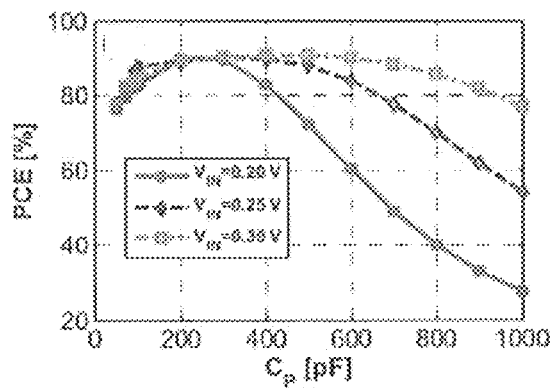
FIGS. 30a and 30b are graphs of $C_P$ optimization of a HTFET charge pump with 250 μm switch width as compared with respect to PCE and $V_{out}$, respectively.
Figure 30B:
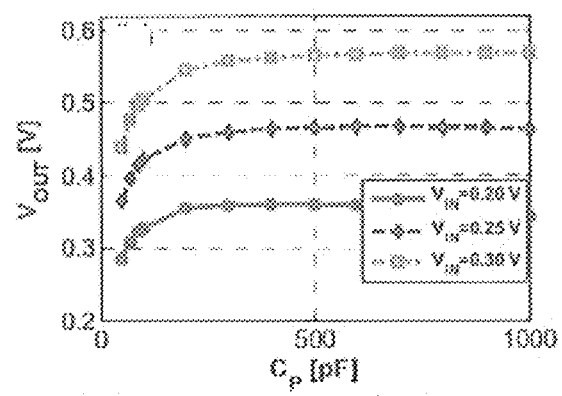
Figure 31A:
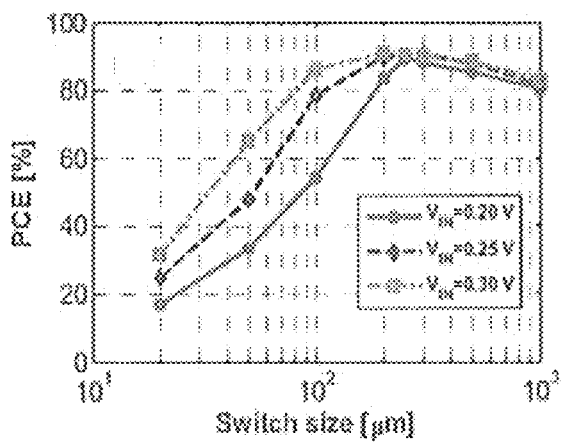
FIGS. 31a and 31b are graphs of switch width optimizations of a HTFTET charge pump with 300 pF $C_P$ with respect to PCE and $V_{out}$, respectively.
Figure 31B:
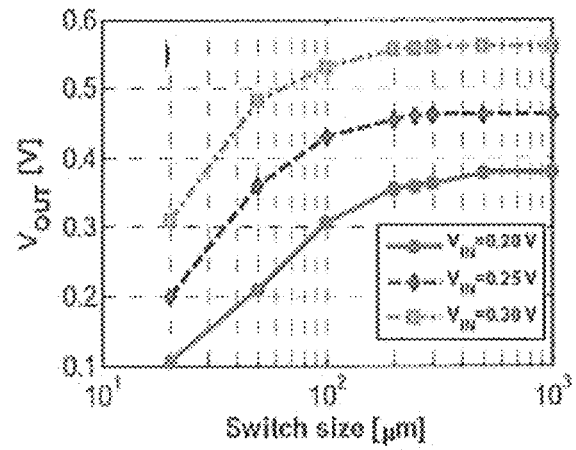
Figure 36A:
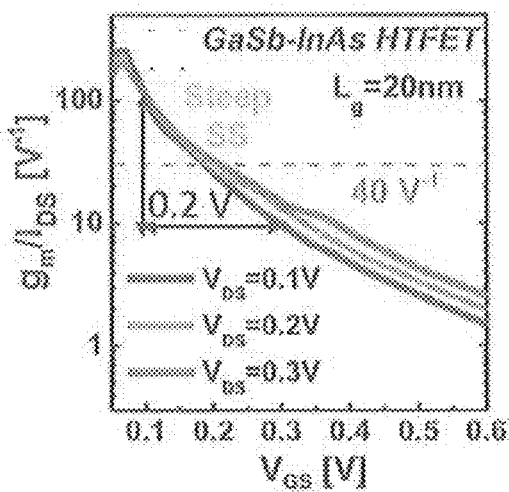
FIGS. 36a and 36b are graphs of $g_m/I_{ds}$ characteristics of HTFET.
Figure 36B:
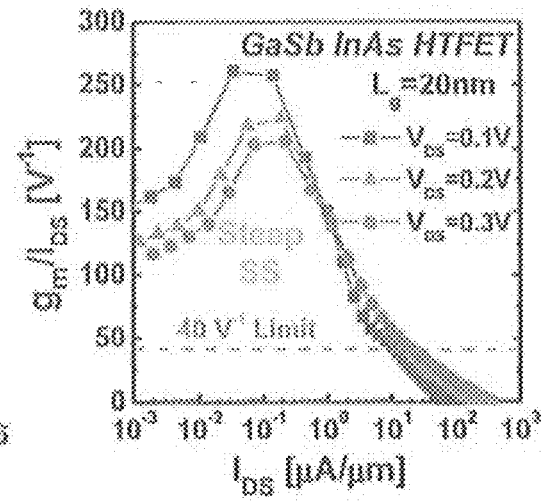
Figure 36C:
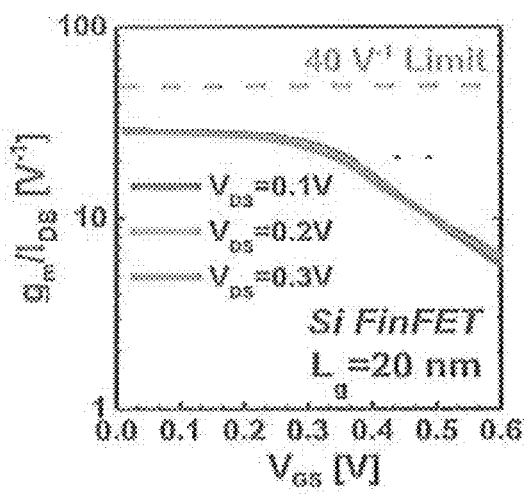
FIGS. 36c and 36d are graphs of $g_m/I_{ds}$ characteristics of Si FinFET.
Figure 36D:
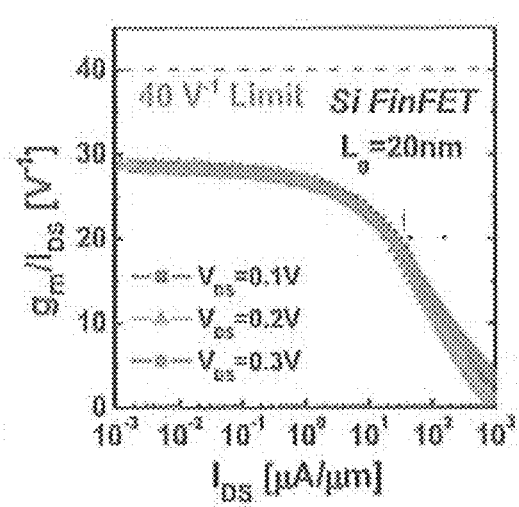

FIG. 29a shows the HTFET cross-coupled charge pump, and FIG. 29b shows an equivalent circuit of a HTFET cross-coupled charge pump, where $ESRC_P$ is the ESR of the capacitor $C_P$, $R_{DRIVER}$ is the output resistance of the phase control generator, and $R_{on}$ is the on-resistance of the turned-on switches. In the charging path, the conduction energy loss $E_{COND}$ within a clock cycle is:

$$E_{COND}=\int_0^{1/fCLK}(I_D(t))^2(ESR_{CP}+R_{ON}(t)+R_{DRIVER}(t))dt, \quad (22)$$

where $I_{D(t)}$ represents the instantaneous current flowing through the turned-on switch in the charging path. From Eq. (22), a higher $R_{on}$ results in higher conduction energy loss $E_{COND}$. Therefore, due to the steep-slope switching and a lower turn-on resistance with a low input voltage than the Si FinFET, the HTFET enables the DC-DC conversion with a low input voltage by a much lower $E_{COND}$.

In conventional CMOS charge pumps (See FIG. 28a), the two phase control signals are non-overlapping so as not to turn on $M_1$ and $M_3$ (or $M_2$ and $M_4$) at the same time. Otherwise, the $V_{out}$ would be connected to the $V_{CC}$ through $M_1$ and $M_3$ (or $M_2$ and $M_4$) directly, affecting the voltage boosting function. It is also noticed that the non-overlapping phase control does not eliminate all reverse energy loss. When both ϕA and ϕB are low in the non-overlapping phase, the two p-type switches are turned on, and a transient current flows from $V_{out}$ to X and Y, resulting in energy loss. In contrast, in the HTFET cross-coupled charge pump, such reverse current becomes negligible because of the uni-directional tunneling conduction. Therefore, the reverse energy loss is significantly reduced. Further, there is no need for non-overlapping phase control, which simplifies the circuit design and saves power.

Different from conventional cross-coupled charge pumps in FIG. 28a, the HTFET charge pump shown in FIG. 29a redirects the gate control signals of the two output p-type switches, (i.e. $M_3$ and $M_4$), to the bottom of the two capacitors $C_{P1}$ and $C_{P2}$. As a result, the gate-source voltage difference $|V_{gs}|$ of $M_3$ and $M_4$ is 0 in the OFF region, and $2V_{CC}$ in the ON region. With HTFET uni-directional tunneling, the OFF-state reverse current is negligible, which is impossible for CMOS designs without uni-directional current conduction. Compared with FIG. 28a, the $M_3/M_4$ in FIG. 29a have similar ON-OFF behavior, but twice gate-source voltage $|V_{gs}|$ when turned on. In other words, the on-resistance of $M_3$ and $M_4$ is significantly reduced. With a CMOS design, a level shifter boosting the phase control swing from 0~$V_{CC}$ to 0~$2V_{CC}$ may be employed to control PMOS switches, reaching the same on-resistance reduction. In contrast, the HTFET charge pump topology needs no level-shifters and thus saves area and power.

Optimizations of the switch size and the pump capacitor are presented for a high PCE. In the simulations, the phase control driver has the same transistor size as the switches in the charge pump. This setting is based on the fact that $R_{DRIVER}$ of the phase driver and $R_{SWITCH}$ of the switch are in series and affect the output in the same way, as illustrated in FIG. 29b. The phase control clock frequency $f_{CLK}$ and the load resistance $R_L$ are set to be 30 MHz and 1.0 kΩ, respectively.

FIGS. 30a, 30b, 31a, and 31b show the simulated PCE and DC output voltage $V_{out}$ versus the pump capacitor $C_P$ and the switch size, respectively. When $C_P$ is less than 100 pF, the pumped charge through $C_P$ is insufficient to drive the load, resulting in a low $V_{out}$ and PCE. However, when $C_P$ is too large, the PCE turns to drop due to two facts: (a) the delivered power to the load is not further increased even if $C_P$ is further increased; (b) much larger phase generator power is consumed to drive such a larger Cp. In the applications with a certain input voltage, a trade-off between the capacitor area and optimum PCE can thus be made accordingly.

As for the switch size optimization, because a larger switch size has lower on-resistance, the $V_{out}$ increases with the switch size. Similarly, to reduce the dominating conduction energy loss $E_{COND}$ and obtain a high PCE, the transistor width needs to be large enough to make its on-resistance negligible. However, the PCE can be degraded by an excessively large transistor width which consumes more switching energy $E_{SW}$. When the input voltage $V_{IN}$ is larger, this becomes more significant because $E_{SW}$ is generally proportional to the square of $V_{IN}$.

After optimizations, the highest achieved PCE is larger than 90% for $V_{IN}$ ranging from 0.20 V to 0.30 V. The maximum DC output voltage $V_{out}$ is 0.37 V and 0.57 V, for a $V_{IN}$ of 0.20 V and 0.30 V, respectively.

FIGS. 32a and 32b show the simulated performance comparisons between the Si FinFET charge pump and the presented HTFET charge pump. The switch size, $R_{LOAD}$, $C_P$, and $f_{CLK}$ are set to be 250 μm, 1.0 kΩ, 300 pF, and 30 MHz, respectively. FIG. 32a shows the PCE versus $V_{IN}$. For $V_{IN}$<0.34 V, the conventional Si FinFET charge pump has a PCE less than 40% and $V_{out}$ is in fact lower than the input due to too large on-resistance of the switches. In contrast, the HTFET charge pump has a >90% PCE when $V_{IN}$ is as low as 0.20 V. FIG. 32b shows the PCE versus $R_{LOAD}$. When $R_{LOAD}$ increases, the PCE gradually increases to its peak because a larger $R_{LOAD}$ gathers more percentage of power with a size-fixed switch (See FIG. 29b). Then PCE drops when $R_{LOAD}$ further increases, because the output power turns to decrease with further increasing $R_{LOAD}$, while the input power is not decreasing. Within the simulated $R_{LOAD}$ range 200Ω to 10 kΩ, the HTFET charge pump has a higher PCE than the Si FinFET counterpart. FIGS. 32a and 32b also show the performance comparison between the two HTFET charge pumps and the Si FinFET counterpart. When $V_{IN}$ is small, the PCE improvement by the presented charge pump is more significant than that of a high $V_{IN}$. This is because the on-resistance of the switches is larger and $E_{COND}$ has more influence on the PCE. Similarly, when $R_{LOAD}$ is smaller, the impact of $E_{COND}$ is comparatively more significant. In this case, the presented HTFET topology reduces the on-resistance and $E_{COND}$, and finally helps to increase the PCE, as shown in FIG. 32b.

Table 5 gives the comparisons with currently fabricated voltage boosters. Extra start-up assistance is required for devices disclosed in references [6] and [7] when the input voltage is low. In contrast, the presented HTFET charge pump can operate with $V_{IN}$ as low as 0.17 V without the need for start-up assistance. Compared with devices disclosed in references [9][12][13], the presented HTFET supports much lower input voltage with a much higher PCE. With an input voltage range of 0.20~0.30 V, the presented charge-pump has an output voltage range of 0.37~0.57 V, which is fair enough for steep slope TFET and sub-threshold CMOS devices. The presented charge-pump can also be cascaded, if a higher $V_{out}$ is required.

TABLE 5

|  | 6 | 7 | 8 | 9 | 10 | this work |
|---|---|---|---|---|---|---|
| Process | 130 nm CMOS | 65 nm CMOS | 130 nm CMOS | 350 nm CMOS | 32 nm CMOS | 20 nm HTFET |
| Start-up mechanism | external voltage | charge pump | none | none | none | none |
| Input voltage (V) | 0.10 (0.02 min.) | 0.18 | 1.0 | 0.6 (0.5 min.) | 0.60 | 0.20 |
| PCE | 75% | / | 82% | 70% | 75% | 90.4% |
| Output voltage (V) | 1.0 | 0.74 | 1.8 | 2.0 | 1.0 | 0.37 |

This work uses simulation data and the others experimentally messured.

[6]: E. Carlson, K. Stunz, and B. Otis, "A 20 mV input boost converter for thermoelectric energy harvesting," IEEE J. Solid-State Circuits, vol. 45, no. 4, pp. 774-750, Apr. 2010.
[7]: P. Chen et al, "0.18-V input charge pump with forward body biasing in startup circuit using 65 nm CMOS," In IEEE Custom Intergrate Circuit Conference (CICC), pp. 1-4, Sept. 2010.
[8]: Tom Van Breussegem, and Michiel Steyaert, "A 82% efficiency 0.5% ripple 16-phase fully integrated capacitive voltage doubler," In IEEE Symp. VLSI Circuit, pp. 198-199, Jun. 2009.
[9]: I. Doms et al, "Integrated capacitive power-management circuit for thermal harvesters with output power 10 to 1000 μW," In IEEE ISSCC, pp. 300-301, Feb. 2009.
[10]: Ayan Paul, Dong Jiao, Sachin Sapatnekar and Chris H. Kim, "Deep trench capacitor based step-up and step-down DC/DC converters in 32 nm SOI with opportunistic current borrowing and fast DVFS capabilities," In IEEE ASSCC, pp. 49-52, Nov. 2013.

TFET-Based Amplifier

Ultra-low power circuit design techniques have enabled rapid progress in biosignal acquisition and neural activity recording for a wide range of clinical and scientific applications. The design of a multi-channel biosignal recording system is a challenging task, considering the low amplitude of neural signals and limited power budget of an implantable system. The front-end low-noise amplifier of such a neural acquisition system is a critical component with respect to overall power consumption and noise of the system.

We present a new design of III-V HTFET-based neural amplifier employing a telescopic operational transconductance amplifier (OTA) for multi-channel neural spike recording. An exemplary embodiment is provided with design tradeoffs related to gain, power, and noise requirements are investigated, based on a comprehensive electrical noise model of HTFET and compared with a baseline Si FinFET design.

FIGS. 33a and 33b illustrate a block diagram of a typical neural signal recording system known in the art. The system may include an electrode array for multichannel signal acquisition, an analog front-end for signal conditioning, and a data processing unit that enables reducing the data rate of the following transmitter unit. Biosignals associated with neural activities are classified into different categories, based on their characteristics in terms of amplitude, bandwidth (BW), and also the spatial resolution and invasiveness of the electrodes: electroencephalographic (EEG) (amplitude: 10~20 μV, BW<100 Hz), electrocorticographic (ECoG) (amplitude<100 μV, BW: 0.5~200 Hz), local field potential (LFP) (amplitude<5 mV, BW<1 Hz), extracellular action potential or neural spikes (amplitude <500 μV, BW: 100 Hz~7 kHz), etc. Thus, the design objectives of biosignal acquisition systems strongly depend on the application. In general, due to the microvolt range of neural signals and the stringent heat dissipation limit of implantable devices (<1° C. temperature increase to avoid tissue damage), the system power consumption should be sufficiently low for battery-less and multi-channel operation while minimizing the device area for implantation purpose.

A critical building block in a biosignal acquisition microsystem is the front-end low-power, low-noise amplifier. For spike acquisition, an input-referred noise of <10 μVrms (lower than the background noise) and a power dissipation of <10 μW/channel is generally required. The large dc offsets at the issue-electrode interface should be rejected and the pass band should cover a range from hundreds of hertz to several kilohertz, while providing a high input impedance (~MΩ) to prevent the signal attenuation at the sensor. A gain of 40 dB with sufficient common-mode rejection ratio (CMRR) and power-supply rejection ratio (PSRR) should also be ensured in practical applications. In CMOS-based design, the noise efficiency factor (NEF) is a widely accepted metric that reveals the design challenge due to the tradeoff between the input-referred thermal noise and the power reduction. Many works have explored the design techniques to reduce the NEF. Among the presented methods, the subthreshold operation provides significant benefits, by ensuring a high transconductance (gm) at a low bias current ($I_{ds}$) to reduce the input-referred thermal noise of the amplifier. However, due to the $g_m/I_{ds}$ limit set by the 60 mV/dec switching in CMOS, further reduction of the power consumption and the noise of the amplifier is inherently difficult in CMOS-based neural recording systems.

Steep subthreshold slope TFETs have emerged as a prominent candidate for energy efficient low-voltage applications, taking benefit of the sub-thermal energy switching characteristics. The steep SS induced high $g_m/I_{ds}$ may be used to scale the bias current and achieved ultra-low power operation of a TFET neural amplifier with a degraded gain of 25 dB. To overcome the energy efficiency challenge for biomedical applications, it is of great interest to further explore the power-noise tradeoff and design optimization in TFET-based neural recording systems.

We present a new design of a III-V HTFET neural amplifier based on a shared telescopic OTA through circuit simulation to achieve significant gain improvement and simultaneous power and noise reduction beyond the CMOS limit, which is highly beneficial for ultra-low power, multi-channel neural spike recording. To analyze the design tradeoffs related to power and noise performance using HTFETs, we apply a comprehensive noise model, and explore the unique device characteristics of HTFETs in neural amplifier design compared to Si FinFETs.

FIG. 34 shows a CMOS-based neural amplifier based on a capacitive feedback network, which has been widely adopted due to its superior area and power efficiency at a given input-referred noise. It employs the capacitive feedback network ($C_1$, $C_2$), pseudo-resistor elements (R) and an OTA with a voltage gain of $G_{m,OTA}$. The voltage gain AM of the neural amplifier is AM=$C_1/C_2$ (See FIG. 35a). The capacitive coupling rejects the Dc offset from the electrode-tissue interface. The pseudo-resistor is diode-connected MOSFETs with resistance over $10^{12}\Omega$. The low cutoff frequency is defined by $f_L=1/2\pi RC_2$, and the high cutoff frequency is defined by $f_H=G_{m,OTA}/2\pi A_M C_L$, where $C_L$ is the load capacitance. $C2 \ll \sqrt{C1CL}$ must be satisfied to ensure that the half-plane-zero fz is much higher than the operation bandwidth. Due to the wide frequency range of neural signals, the minimization of low frequency flicker and thermal noise is critical. The most effective technique for flicker noise reduction consists of increasing the transistor gate area. The thermal noise reduction, however, is constrained by the power requirement, known as power-noise tradeoff.

FIG. 35b shows the output thermal noise spectrum of the CMOS-based neural amplifier and illustrates the noise contributions from the OTA and pseudo-resistor (in blue and red respectively). By ensuring the corner frequency fc $f_H$, the contribution of the pseudo-resistor thermal noise is minimized. The input-referred thermal noise spectral density expresses as:

$$\overline{v_{ni,amp}^2} = [(C_1+C_2+C_{in})/C_1]^2 \cdot \overline{v_{ni,OTA}^2} \quad (23)$$

where $C_{in}$ is the OTA input capacitance and related to the gate area of the input pair in the OTA. $v_{ni,OTA}^2$ represents the OTA input-referred noise. A general expression for $v_{ni,OTA}^2$ over a $-3$ dB bandwidth of BW is approximated as:

$$v_{ni,OTA}^2 = \left[ \frac{4k_B T}{g_{m,input}} \left( \frac{1}{\kappa} + \beta \frac{g_{m,load}}{g_{m,input}} \right) \right] \cdot \frac{\pi}{2} \cdot BW \quad (24)$$

where $g_{m,input}$ and $g_{m,load}$ are the transconductances of the input pair and load transistors in the neural amplifier, respectively. $\beta$ relates to different OTA topologies and has a value larger than 1. $\kappa$ is the subthreshold gate coupling factor: $SS=V_t/\kappa(\ln 10)$, where $V_t$ is the thermal voltage (kBT/q) and kB is Boltzmann constant. According to Eq. (23) and (24), to minimize $\overline{v_{ni,amp}^2}$ we must size the transistors to maximize $g_{m,input}$ and $g_{m,input}/g_{m,load}$. Hence, at a fixed bias current, the input and load transistors are sized to operate in weak inversion (high $g_m/I_{ds}$) and strong inversion (low $g_m/I_{ds}$), respectively. However, a severely downscaled $I_{ds}$ is required to reduce the power dissipation for multi-channel recording, which in turn reduces $g_{m,input}$ due to the 40 V$^{-1}$ limit of $g_m/I_{ds}$ in CMOS. Furthermore, the reduced voltage headroom at low-$V_{DD}$ also degrades the $g_{m,input}/g_{m,load}$. The essence of the power-noise tradeoff is indicated by the NEF, which may be expressed as:

$$NEF = v_{ni,rms}\sqrt{I_{OTA}/(\pi/2 \cdot V_t \cdot 4k_B T \cdot BW)} \quad (25)$$

where $I_{OTA}$ is the total bias current of the OTA, $v_{ni,rms}$ is the rms value of the input-referred noise. Assuming $(C_1+C_2+C_{in})/C_1 \approx 1$, $(\beta)(g_{m,load}/g_{m,input}) \ll 1$, and substituting Eq. (23) and (24) into (25):

$$NEF \approx I_{OTA}/\theta \cdot V_t \cdot g_{m,input}) \quad (26)$$

NEF=1 is the theoretical limit in an ideal single-stage bipolar amplifier with only thermal noise considered, while NEF>1 is applied to all CMOS-based circuits. The minimum NEF is calculated as 2.02 (assuming $I_{OTA}=2I_{ds}$ and $\kappa=0.7$ for the input pair) for any CMOS neural amplifier using a differential input pair, which can be moderately reduced through reference branch sharing in multi-channel designs. Thus, the power-noise tradeoff in CMOS neural amplifiers inherently limits the design of large-scale multi-channel biosignal acquisition systems.

The fundamental limit of $g_m/I_{ds}$ in CMOS originates from the thermal energy slope of kBT, which results in an over 60 mV/dec SS. In TFETs, the inteR$_b$ and tunneling induced carrier injection mechanism overcomes the thermal energy limitation, leading to a sub-60 mV/dec SS. Thus, a significant improvement of the $g_m/I_{ds}$ can be achieved in TFETs with SS reduction (Eq. (27)).

$$\frac{g_m}{I_{DS}} = \frac{\partial I_{DS}}{\partial V_{GS}} \frac{1}{I_{DS}} = \frac{\partial \ln I_{DS}}{\partial V_{GS}} = \frac{\ln 10 \partial \log I_{DS}}{\partial V_{GS}} = \frac{\ln 10}{SS} = \frac{\kappa}{V_t} \quad (27)$$

The device characteristics of $g_m/I_{ds}$ vs. $I_{ds}$ and $g_m/I_{ds}$ vs. $V_{gs}$ are shown in FIGS. 36a, 36b, 36c, and 36d, comparing HTFETs and Si FinFETs. The improved $g_m/I_{ds}$ at low voltage bias and low $I_{ds}$ provides advantages in HTFET-based neural amplifier design.

With a HTFET-based neural amplifier design, it is possible to avoid $G_{m,OTA}$ degradation at low bias current ($I_{ds}$). A high $G_{m,OTA}$ is required to ensure a low-noise stable operation of a neural amplifier. As a benefit of the high $g_m/I_{ds}$ of HTFETs, $g_{m,input}$ can be significantly improved compared to Si FinFET at severely scaled $I_{ds}$. Thus, a desired $G_{m,OTA}$ can be maintained without increasing the circuit complexity using HTFETs.

With a HTFET-based neural amplifier design, it is possible to reduce $v_{ni,OTA}^2$ with increased $g_{m,input}$ and $g_{m,load}/g_{m,input}$ ratio at low $I_{ds}$. In addition to the improved $g_{m,input}$, the steep SS leads to a reduced bias voltage difference to obtain a high $g_{m,load}/g_{m,input}$ ratio. For example, one order reduction of $g_m/I_{ds}$ is achieved within a 0.2 V window, which reduces the overdrive voltage and hence is suitable for low $V_{DD}$ operation. Thus, with a HTFET-based neural amplifier design, it is possible to enable $V_{DD}$ scaling to reduce the power consumption ($V_{DD} I_{OTA}$) benefitted from the low-$V_{DD}$ operation of HTFETs, as well as reduce the NEF by suppressing the thermal energy slope.

Figures 37A, 37B, 37C:
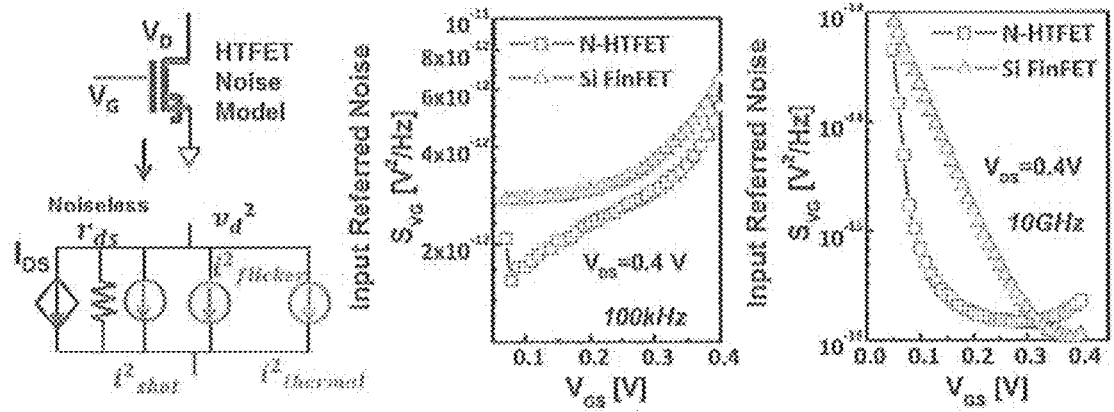
FIGS. 37a, 37b, and 37c show noise characteristics comparing HTFETs and Si FinFETs, showing the HTFET noise model, the input referred noise v. $V_{gs}$, and the input referred noise v. $V_{gs}$, respectively.

To explore the power-noise tradeoff of the HTFET neural amplifier design, we applied the calibrated Verilog-A device models incorporated with the electrical noise model for HTFETs, and compare the results with the baseline Si FinFET design. The electrical noise model is derived from experimentally validated analytical models, which includes thermal, shot noise and low frequency flicker noise. The noise characteristics comparing HTFETs and Si FinFETs are shown in FIGS. 37a-c, where HTFETs exhibit a competitive input-referred noise in the kHz and MHz frequency range compared to Si FinFETs at a nominal operation voltage of 0.3 V, and meet the bandwidth requirements of ultralow voltage sensor applications.

In an exemplary embodiment, a modified telescopic OTA topology is employed by the HTFET-based OTA (See FIG. 38), which utilizes a partial OTA sharing architecture for multi-channel recording. A N-HTFET input pair is used due to its steeper SS (See FIGS. 39a, 39b, 39c) induced larger $g_m/I_{ds}$. Cascoded $M_3$-$M_6$ may be used as gain booster without increasing the input-referred noise-level. Table 6 shows the bias conditions of each transistor in the HTFET OTA.

TABLE 6

Transistor Sizing of the HTFET Telescopic OTA

| | W/L [μm/μm] | $g_m/I_{ds}$ [V$^{-1}$] | $V_{ds}$ [mV] | $V_{gs}$ [mV] |
|---|---|---|---|---|
| $M_{1,2}$ | 50/1 | 253 | 67 | 50 |
| $M_{3,4}$ | 1/50 | 202 | 150 | 73 |
| $M_{5,6}$ | 1/10 | 40 | −92 | −92 |

TABLE 6-continued

Transistor Sizing of the HTFET Telescopic OTA

|  | W/L [µm/µm] | $g_m/I_{ds}$ [$V^{-1}$] | $V_{ds}$ [mV] | $V_{gs}$ [mV] |
|---|---|---|---|---|
| $M_{7,8}$ | 0.2/40 | 35 | −81 | −179 |
| $M_{9,10}$ | 0.2/10 | 169 | 109 | 82 |

TABLE 7

Transistor Sizing of the Si FinFET Telescopic OTA

|  | W/L [µm/µm] | $g_m/I_{ds}$ [$V^{-1}$] | $V_{ds}$ [mV] | $V_{gs}$ [mV] |
|---|---|---|---|---|
| $M_{1,2}$ | 100/2 | 28.7 | 220 | 40 |
| $M_{3,4}$ | 30/0.2 | 28.6 | 79 | 21 |
| $M_{5,6}$ | 8/0.2 | 28.55 | −68.4 | −68.4 |
| $M_{7,8}$ | 0.1/80 | 9.8 | −423 | −492 |
| $M_{9,10}$ | 2/2 | 27 | 209 | 205 |

The bias current is 10 nA at $V_{DD}$=0.5 V, providing a 5 nA bias current for $M_1$-$M_8$. As discussed, to maximize the $gm_1$, $gm_2$ of the input differential pair M1, M2, a large W/L ratio is used to achieve high $g_m/I_{ds}$. Similar to the reported CMOS designs, a large gate-area (W×L) is used to reduce the flicker noise contribution. For M7, M8, on the other hand, a minimized W/L is applied to bias the device into strong inversion with small $g_m/I_{ds}$, which increases the ratio of $gm_7/gm_1$, $gm_8/gm_2$ and reduces the thermal noise contribution of $M_7$,$M_8$. Since the cascoded $M_3$-$M_6$ have a negligible contribution to the total input-referred noise, the choice of the sizing for these transistors is based on gain requirements. Thus, the balance of the output resistance and intrinsic gain is carefully considered for $M_3$-$M_6$. As a result, a high $g_m/I_{ds}$ of 253 $V^{-1}$ is obtained for $M_1$,$M_2$, while a $g_m/I_{ds}$ of 35 $V^{-1}$ is used for $M_7$,$M_8$, resulting $gm_7/gm_1$, $gm_8/gm_2$=⅛.

To evaluate the performance improvement of the HTFET OTA, we design a Si FinFET OTA as a baseline with a similar topology and bias current (10 nA). A supply voltage of 1 V is required in Si FinFET OTA due to the overdrive voltage requirements of the stacked devices. SimilaRLy, M1,M2 operate in subthreshold regime while M7,8 are biased in strong inversion regime, using the sizes presented in Table 7. However, due to the limited gm/Ids and diminished overdrive voltage, gm1, gm2 and the ratio of $gm_1/gm_7$, $gm_2/gm_8$ are significantly decreased at such low-power level, which is detrimental to noise performance.

FIG. 40a shows the HTFET OTA gain v. frequency for a single channel as compared to the baseline Si FinFET OTA. Benefiting from its high $g_m/I_{ds}$ and the cascoding technique, an open-loop gain of 50 dB is achieved in the HTFET OTA at $V_{DD}$=0.5 V, while the Si FinFET OTA shows a degraded gain of 37 dB at $V_{DD}$=1 V due to extremely limited bias current. The output noise spectrum vs. frequency is shown in FIGS. 40b and 40c, where the thermal noise dominates the flicker noise which is suppressed owing to the large gate-area of the input pair.

The dominant noise contributor of each device and its contribution to the overall input-referred noise is shown in FIG. 41. In the Si FinFET OTA, $M_{7,8}$ contribute to a significant portion of the overall input-referred noise due to the degradation of $gm_{1,2}$ and $gm_{1,2}/gm_{7,8}$. On the other hand, an effective suppression of the thermal noise contribution from $M_7$,8 is achieved in the HTFET OTA, by taking advantage of the high $g_m/I_{ds}$ and low voltage operation. The desired open-loop gain, ultra-low power and competitive noise performance achieved by the HTFET telescopic OTA confirm its strong potential in neural amplifier designs.

Using capacitive feedback topology, we implement the close loop HTFET neural amplifier based on the presented telescopic OTA (See FIG. 42). To further eliminate the redundant dc bias circuitry, we use the dc output voltage of the OTA ($V_{out}$,dc) to bias the common voltage ($V_{common}$) of the input signal through the resistive divider network ($R_b$) at $V_{common}$=$V_{out}$. In the OTA simulation, the common dc voltage of the input signal, $V_{IN}$,dc, is set to ½$V_{out}$,dc. Hence, by setting $R_b$=R, the input signal can be biased at ½$V_{out}$,dc. A diode connected Si FinFET is used to construct the pseudo-resistor $R_b$ and R for the Si FinFET neural amplifier, where a W/L of 0.2 µm/8 µm is used for Ma1-Ma2 (See part (b) of FIG. 42). For the HTFET neural amplifier, shorted source-gate connections can be applied by taking advantage of the asymmetrical source/drain device, while an additional conduction path through Ma3-Ma4 is required due to the uni-directional device characteristics (See part (a) of FIG. 42). A W/L of 0.2 µm/6 µm is applied to Ma1-Ma4 in the HTFET neural amplifier. The values of the capacitors are selected as $C_2$=500 fF, and $C_1/C_2$=100 to provide a 40 dB mid-band gain. $C_L$ is varied from 500 fF to 2 pF to tune the pass band of the amplifier. For the Si FinFET neural amplifier, $C_2$=500 fF and $C_1/C_2$=50 are used, due to the degraded open-loop gain.

Figure 43C:
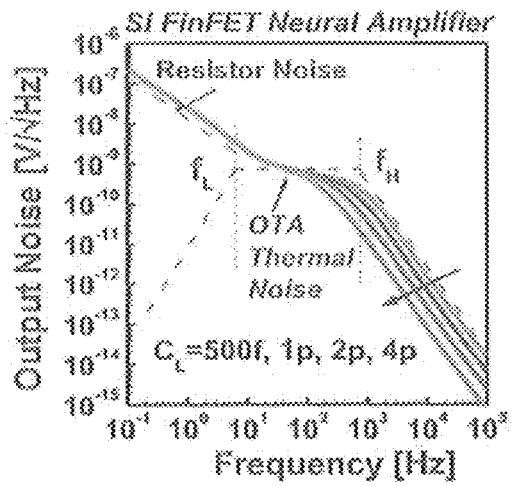
FIGS. 43c and 43d are output noise v. frequency comparisons between a Si FinFET neural amplifier and a HTFET neural amplifier, respectively.
Figure 43D:
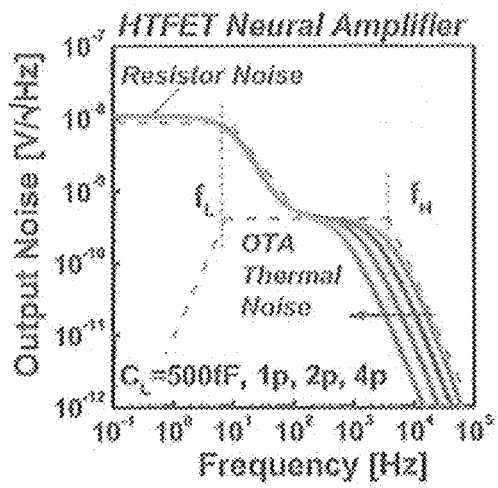

The gain and output noise v. frequency characteristics are shown in FIGS. 43c-d, comparing HTFET and Si FinFET neural amplifier designs at different load capacitors conditions ($f_H$ decreases as $C_L$ increases). A midband gain of 39 dB is achieved in the HTFET neural amplifier, as compared to 28 dB in the Si FinFET neural amplifier. This gain advantage of the HTFET neural amplifier arises from the improved gm originating from the steep SS induced high $g_m/I_{ds}$. The output thermal noise spectrum exhibits similar characteristics as in FIG. 35b, for both Si FinFET and HTFET neural amplifiers. For a frequency range below 10 Hz, the noise contribution from the pseudo resistor dominates the overall output noise, while the thermal noise of the OTA dominates the frequency range between $f_L$ and $f_H$. As discussed, the low cutoff frequency $f_L$ is determined by R and $C_2$, while $C_1/C_2$ is constant. Thus, the bandwidth of the designed neural amplifier can be tuned by varying R ($R_b$) and $C_2$ to satisfy the operational bandwidth requirement in different application domains.

Figure 44A:
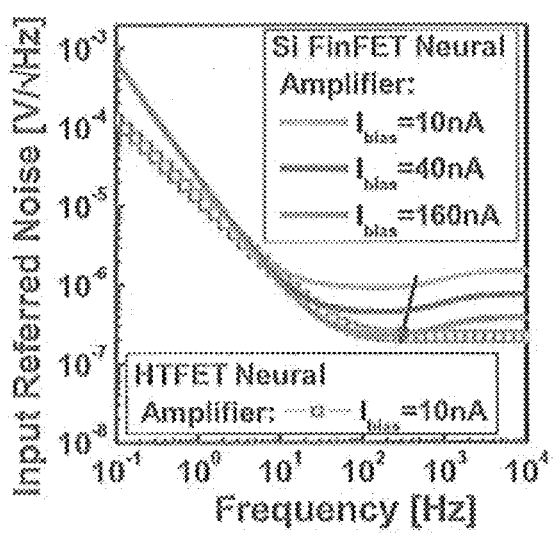
FIGS. 44a and 44b are input referred noise v. frequency comparisons and supply current v. bandwidth comparisons, respectively, between a Si FinFET neural amplifier and a HTFET neural amplifier.

The input-referred noise spectrum v. frequency for HTFET and Si FinFET neural amplifiers are shown in FIG. 44a. At the same $I_{bias}$ of 10 nA, the HTFET neural amplifier exhibits 5 times reduction of the input-referred noise within the pass band with respect to the Si FinFET neural amplifier. Moreover, reducing the input-referred noise of the Si FinFET neural amplifier can only be achieved by degrading its power performance. When increasing $I_{bias}$ by 4 times (40 nA) and 16 times (160 nA) while increasing all the transistor widths accordingly (4 times at $I_{bias}$=40 nA, 16 times at $I_{bias}$=160 nA), the input-referred noise of the Si FinFET neural amplifier is reduced by 2 times and 4 times, respectively. Such noise reduction with increased $I_{bias}$ is due to the increased $gM_1$,2 of the OTA at a fixed $g_m/I_{ds}$ (at a constant NEF). The Si FinFET neural amplifier shows comparable input-referred noise at $I_{bias}$=160 nA and $V_{DD}$=1V as the HTFET neural amplifier at $I_{bias}$=10 nA and $V_{DD}$=0.5V. Hence, an approximate 32 times power reduction over the Si FinFET design is achieved in the HTFET neural amplifier, considering the design target to obtain the same input-referred noise level.

The performance metrics of the HTFET and Si FinFET neural amplifiers at $C_L=2$ pF and $I_{bias}=10$ nA are summarized in Table 8 and compared with other designs [11-15].

By exploring the high $g_m/I_{ds}$ characteristics, the HTFET neural amplifier design with a shared telescopic OTA topology enable a nanowatt power-level operation, which also

TABLE 8

Summary of Performance and Comparison with Other Works

| | HTFET Amplifier (this work) | FinFET Amplifier (this work) | 11 | 12 | 13 | 14 | 15 |
|---|---|---|---|---|---|---|---|
| Technology | 20 nm HTFET (simulation) | 20 nm Si FinFET (simulation) | 18 µm CMOS (simulation) | 90 nm SiGe TFET (simulation) | 1.5 µm CMOS (measured) | .5 µm CMOS (measured) | 5 µm SOI BiCMOS (measured) |
| Bias Current | 10 nA | 10 nA | 2.84 µA | ~3 nA | 16 µA | 2.7 µA | 800 nA |
| Supply Voltage | 0.5 V | 1 V | 1.8 V | 1 V | +/−2.5 V | 2.8 V | 1 V |
| Power | 5 nW | 10 nW | 5.11 µW | 3.6 nW | 80 µW | 7.56 µW | 800 nW |
| Closed-loop Gain | 39.4 dB | 28.1 dB | 39.9 dB | 27.7 dB | 39.5 dB | 40.8 dB | 36.1 dB |
| Bandwidth ($f_L$-$f_H$) | 12 Hz-2.1 kHz ($C_L$ = 2 pF) | 4 Hz-529 Hz ($C_L$ = 2 pF) | 30 Hz-2.5 kHz (tunable) | 0.036 Hz-3.2 kHz (N/A) | 0.025 Hz-7.2 kHz ($C_L$ = 17 pF) | 45 Hz-5.32 kHz ($C_L$ = 9 pF) | 0.3 Hz-4.7 kHz (N/A) |
| Input-Referred Noise | 6.27 µVrms (10 Hz-1 kHZ) | 29.7 µVrms* (10 Hz-1 kHZ) | 1.30 µVrms (1 Hz-100 kHZ) | 3.1 µVrms** (N/A) | 2.2 µVrms (0.5 Hz-50 kHZ) | 3.06 µVrms (10 Hz-98 kHZ) | 3.6 µVrms (0.1 Hz-25 kHZ) |
| CMRR | 56 dB | 42 dB | 78 dB | 64 dB | >83 dB | 66 dB | — |
| PSRR | 70 dB | 58 dB | 57 dB | 55 dB | >85 dB | 75 dB | 5.5 dB |
| THD | 0.69% ( 2 m$V_{pp}$) | 0.67% (2 m$V_{pp}$) | — | — | 1% (16 m$V_{pp}$) | 1% (7.3 m$V_{pp}$) | 7.1% (1 m$V_{pp}$) |
| NEF | 0.64 | 5.2 | 1.94 | — | 4 | 2.67 | 1.9 |

*At $I_{bias}$ = 160 nA, integrated input-referred noise of the Si FinFET neural amplifier from 10 Hz to 1 kHz is 6.99 µVrms with corresponding 16x increase of transistor width.
**Tunnel diode noise models at a fano factor of 1 for shot noise were used for TFET noise analysis [16] withh thermal noise negelcted.
[11]: Shoaran et al 2012. Design techniques and analysis of high resolution neural recording systems targeting epilepsy focus localization. In IEEE EMBC.
[12]: Trivedi et al 2013. Exploring Tunnel-FET for ultra low power analog applications: A case study on operational transconductance amplifier. In ACM/EDAC/IEEE DAC.
[13]: Harrison, R.R. and Charles, C. 2003. A low-power low-noise CMOS amplifier for neural recording applications. IEEE JSSC.
[14]: Wattanapanitch, W., Fee, M., Sarpeshkar, R. 2007. An Energy-Efficient Micropower Neural Recording Amplifier. IEEE Trans. on Biomed. Circuits and Syst.
[15]: Zhang et al 2012. Design of Ultra-Low Power Biopotential Amplifiers for Biosignal Acquisition Applications. IEEE Trans. on Biomed. Circuits and Syst.

A bandwidth of 12 Hz (fL) to 2 kHz ($f_H$) and power consumption of 5 nW are achieved in the HTFET design with an input-referred noise of 6.27 µVrms integrated over 10 Hz to 1 kHz, which is close to the estimated minimum of 5.26 µVrms achieved by an ideal OTA at CL=2 pF and AM=40 dB. The Si FinFET neural amplifier, however, shows a bandwidth from 4 Hz to 529 Hz at the same $I_{bias}$ (10 nA), while $f_H$ is degraded due to the limited transconductance. The increased at nanowatt power levels imposes inevitable drawbacks on practical applications of the Si FinFET design. Both CMRR and PSRR are improved in the HTFET design compared to the Si FinFET design. A completive linearity performance of the HTFET and Si FinFET amplifiers, indicated by the total harmonic distortion (THD), is also achieved.

Figure 44B:
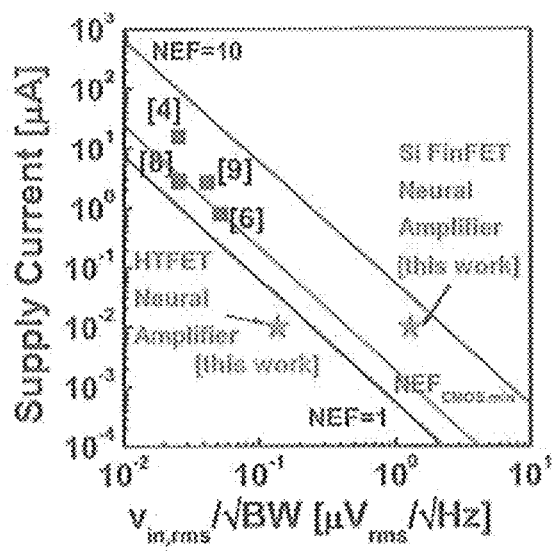

Compared to the reported CMOS designs, the HTFET neural amplifier exhibits superior power-noise performance (See FIG. 44b). A NEF of 0.64 (Table 8) is obtained in the HTFET neural amplifier owing to the steep SS, which outperforms the NEF of 5.18 in the baseline Si FinFET design. This low NEF achieved by the HTFET design outperforms the optimal NEF for both CMOS (NEFmin=2.02) and Bipolar (NEFmin=1) based designs. Such noisepower efficiency advantage of the HTFET neural amplifier is highly desired for noise-limited ultra-low power biosignal acquisition. Moreover, the new HTFET neural amplifier shows significant gain improvement compared to the SiGe TFET design, benefiting from the cascaded transistors and steeper SS from III-V HTFETs. The telescopic OTA topology employed in our design is also known to be more power-noise efficient compared to the symmetrical current-mirror OTA topology used with the SiGe TFET design. However, because of the different assumption of the Fano factor for shot noise and neglecting of the thermal and flicker noise contribution, the input-referred noise performance with the SiGe TFET design could not be compared.

provides a significant voltage gain improvement and noise reduction compared to the Si FinFET-based design. Using a comprehensive noise model, we analyzed the power-noise tradeoff in HTFET neural amplifier designs, which highlights advantages of the steep SS and low-$V_{DD}$ operation for mitigating the aggravated thermal noise impact from the power reduction. At a highly scaled bias current of 10 nA and supply voltage of 0.5 V, the HTFET neural amplifier design exhibits a midband gain of 40 dB, a −3 dB bandwidth from 12 Hz to 2 kHz, and an approximate 32 times power reduction over the baseline Si FinFET design at the same input-referred noise level. The performance evaluation further reveals the superior power-noise efficiency of the HTFET-based design, including a NEF of 0.64 which is significant lower than the theoretical NEF limits using CMOS or Bipolar technologies. The remarkable performance improvement and advantages in power-noise tradeoff confirm the emerging HTFET technology as a promising candidate for multichannel biosignal acquisition system designs, which also offers new perspectives to overcome the CMOS technology barrier in ultra-low power analog applications.

TFTE-Based SAR A/D Converter

Ultra-low-power circuit design techniques have brought in growing interest in power-constrained applications such as energy harvesting systems, sensor networks and biomedical implants, where the energy efficiency and area cost to convert analog signal to digital data have profound impact on the overall system performance. Tremendous progress has been made to leverage the power consumption, chip area and data conversion speed in analog-to-digital-converter (ADC) designs to enable the low-power mixed-signal/RF applications. For digital circuits in ADCs, technology scaling companied with the supply voltage ($V_{DD}$) reduction provides continuous improvement of energy efficiency. However, the diminished signal-to-noise ratio (SNR) at a lower $V_{DD}$ can be detrimental for analog circuits. Recently, the near-/sub-threshold CMOS technologies have been applied to ADC designs with digital assisted blocks to explore the optimal energy efficiency albeit with sacrificing certain degree of speed, matching, noise performance and area. However, the minimum energy achieved in current ADC designs is still limited by the energy efficiency of CMOS technology, especially in the low-resolution (low signal-to-noise and distortion ratio (SNDR)) regime, where the innovations of device technology are required to enable further energy reduction beyond CMOS limit. TFET technology can be potentially applied to overcome the growing challenge in energy efficiency using the conventional CMOS technology for ultra-low-power mixed-signal applications.

We present an energy-efficient a 6-bit III-V HTFET based successive approximation register (SAR) analog-to-digital converter (ADC) with 20 nm gate-length. Comparing with the Si FinFET ADC, the HTFET SAR ADC achieves approximately 3 times power consumption reduction and 6 times size reduction. Signal-to-noise and distortion ratio (SNDR) is 35.5 dB for the HTFET SAR ADC, which is 1.94 dB higher than the Si FinFET ADC due to the decreased quantization noise rising from the high on-current characteristic of HTFET at low supply voltage. The energy per conversion step for both HTFET and Si FinFET ADC designs are 0.51 fJ/conversion-step and 1.72 fJ/conversion-step, respectively, at a fixed supply voltage of 0.30 V.

We explored the advantages of 20 nm HTFET device characteristics in the mixed-signal domain, and designed an energy-efficient HTFET ADC operating below 0.50 V. We also performed performance benchmarking of the III-V HTFET 6-bit SAR ADC (HTFET SAR ADC) against the Si FinFET SAR ADC for ultra-low-power/energy-efficient systems. Among various ADC designs, we choose the SAR ADC topology due to its desired energy efficiency in low-to-moderate resolution regime and medium bandwidth application ranges, where low-power devices are desired for energy saving purpose. We also investigated the device noise impact on the HTFET SAR ADC performance compared with the Si FinFET SAR ADC.

In digital circuits, the dynamic power consumption $P_{Digital}$ is quadratic related to $V_{DD}$ as shown in Eq. (28), hence $V_{DD}$ scaling can enable the power reduction with the effective control of the off-state leakage power. Unlike the digital circuits, the analog circuit performance is primarily limited by the thermal noise kT/C (k is the Boltzmann's constant, T is the absolute temperature, C is the overall capacitance), which is inversely proportional to the current $I_{ds}$ at a given bias point (kT/C $\propto 1/I_{ds}$). The power dissipation in the SNR limited analog circuits can be expressed as Eq. (29) assuming the signal power is $(\beta \cdot V_{DD})^2$:

$$P_{Digital} \propto C \times V_{DD}^2 \times \alpha \times f_s \quad (28)$$

$$P_{Analog} \propto \frac{1}{\beta} \times \frac{1}{V_{DD}} \times \frac{1}{\frac{g_m}{I_{DS}}} \times kT \times SNR \times f_s \quad (29)$$

assuming:

$$f_s \propto \frac{g_m}{C}, \; SNR \propto \frac{(\beta V_{DD})^2}{kT/C}$$

where α is the activity factor, which indicates the ratio of the internal clock frequency $f_c$ over sampling frequency $f_s$, β is the ratio of signal peak voltage $V_{PP}$ to $V_{DD}$, $g_m$ is the transistor transconductance, and the transistor bias point is indicated by $g_m/I_{ds}$. Therefore, in a fixed design with constant $g_m/I_{ds}$ and $f_s$, diminishing $V_{DD}$ while maintaining SNR will worsen the power consumption in analog components.

Today's analog system designs normally employ digital components to assist the performance and functionality, for example, SAR ADCs. The total power consumption can be expressed as $P_{ADC}=P_{Analog}+P_{Digital}$, which leads to the total energy consumption EADC, as (at β=1):

$$E_{ADC} = \frac{P}{f_s} \propto \left( \frac{1}{V_{DD}} \frac{1}{\frac{g_m}{I_{DS}}} \times kT \times SNR \right) + (C \times V_{DD}^2 \times \alpha) \quad (30)$$

In CMOS technology, $g_m/I_{ds}$ has the maximum value of 40 V$^{-1}$ achieved in sub-threshold region as shown in Eq. (31-32):

$$g_{m,MOSFET} = \frac{I_{D0}}{nV_t}\left(1 - \exp\left(-\frac{V_{DS}}{V_t}\right)\right) \cdot \exp\left(\frac{V_{GS} - V_{th}}{nV_t}\right) \quad (31)$$

$$\frac{g_{m,MOSFET}}{I_{DS}} \propto \frac{1}{nV_t} < \frac{1}{26 \text{ mV}} \approx 40 \text{ V}^{-1} \quad (32)$$

where $V_{th}$ is the threshold voltage, Vt is the thermal voltage.

However, sub-threshold operation of CMOS can significantly reduce the transistor $f_T$, which limits the sampling frequency $f_s$ due to the requirement of $f_s<f_T/80$. The high resolution design (SNDR>60 dB) is limited by the noise-limited power efficiency and nonlinearity matching, while the low-resolution design (SNDR<60 dB) is limited by state-of-art CMOS technology. The limited $g_m/I_{ds}$ and practical trade-off of $g_m/I_{ds}$ v. $f_T$ pose the fundamental challenge for $V_{DD}$ reduction in ultra-low-power CMOS ADCs.

TFET overcomes the 60 mV/dec sub-threshold slope (SS) limit of a MOSFET due to the tunneling induced carrier injection mechanism. With improved tunneling probability and high on-current at a low $V_{DD}$ achieved by the III-V HTFET, $V_{DD}$ scaling can be further enabled to mitigate the challenge between the leakage power constrain and $V_{th}$ scaling in the TFET digital circuits. In our simulations, the Si FinFET was used as baseline for performance comparison.

As shown in FIG. 45, an average SS of 30 mV/dec (over 2 decades change of $I_{ds}$) and 7 times improvement of $I_{ds}$ at 0.30 V can be achieved in the modeled HTFET over Si FinFET at gate-length $L_g$=20 nm. The device parameters for our modeling for the HTFET and the baseline Si FinFET n-type devices were as follows:

Gate length ($L_g$)=20 nm
EOT (HfO$_2$)=0.7 nm
Body Thickness ($t_b$)=5 nm
Si FinFET S/D Doping=1×10$^{20}$ cm$^{-3}$
n-HTFET S (GaSb) Doping=4×10$^{19}$ cm$^{-3}$
n-HTFET D (InAs) Doping=2×10$^{17}$ cm$^{-3}$
HTFET: $E_{g,GaSb}$=0.845 eV, $E_{g,InAs}$=0.49 eV, $\Delta E_e$=0.439 eV
Gate Workfunction: 4.85 eV FIG. 46a shows the $g_m/I_{ds}$ v. $V_{gs}$ for HTFET and Si FinFET at $V_{ds}$=0.30 and 0.50 V, respectively. The steep slope of HTFET provides significant improvement of $g_m/I_{ds}$ to overcome the CMOS limit (40 V$^{-1}$) given:

$$\frac{g_{m,HTFET}}{I_{DS}} = \frac{\partial I_{DS}}{\partial V_{GS}}\frac{1}{I_{DS}} = \frac{\partial \ln I_{DS}}{\partial V_{GS}} = \frac{\ln 10}{SS} > 40 \text{ V}^{-1} \quad (33)$$

As discussed, high $g_m/I_{ds}$ of HTFET can mitigate the power increase with $V_{DD}$ scaling in analog components. Moreover, the trade-off between $g_m/I_{ds}$ (40 V$^{-1}$ achieved in sub-threshold regime) and $f_T$ (peak $f_T$ achieved in super-threshold regime) of CMOS can be further eliminated in HTFET due to the high $g_m/I_{ds}$ (energy efficiency) and desired $f_T$ ($f_s$ requirement) can be achieved simultaneously.

FIG. 46b shows the $f_T$ v. $g_m/I_{ds}$ comparing between HTFET and Si FinFET, where $f_T$ is calculated from gm/2π ($C_{gs}+C_{gd}$). $C_{gs}$ and $C_{gd}$ are the gate-source and the gate-drain capacitances, respectively. Therefore, HTFET can provide energy saving in both digital and analog components for low $V_{DD}$ in terms of circuit speed, drive strength and improved design space between operation point and bandwidth requirement, which is highly desirable for ultra-low power ADC design.

P-type TFET is required for complementary circuit design; however, a challenge in realizing III-V p-type HTFET still remains due to the low density of states (DOS) in the conduction band of III-Vs, which leads to a large portion of the temperature dependent part of the source Fermi function participating in tunneling and a temperature dependent SS. To compare the performance degradation due to the p-HTFET, we consider two p-type HTFET models in our study: (1) "pseudo" p-HTFET, assuming the symmetrical $I_d$-$V_{ds}$ characteristics as the n-HTFET for the best-case performance; (2) "real" p-HTFET, characteristics obtained from TCAD simulations with symmetrical structure. The p-HTFET device parameters were as follows:

Gate length ($L_g$)=20 nm
EOT (HfO$_2$)=0.7 nm
Body Thickness ($t_b$)=5 nm
p-HTFET S (InAs) Doping=5×10$^{18}$ cm$^{-3}$
p-HTFET D (GaSb) Doping=5×10$^{19}$ cm$^{-3}$
Gate Workfunction: 4.285 eV The "Real" p-HTFET shows degraded SS of 55 mV/dec over 2 decades of current change comparing with the n-HTFET at $V_{DD}$=0.30 V (See Table 9). To analyze the device noise effect on the SAR ADC performance (e.g., SNDR and power), we use the noise models for the HTFET and the baseline Si FinFET, including thermal, shot, and flicker noise. The noise models are added to HTFET models with real p-HTFETs as worst-case analysis. The device characteristics are summarized in Table 9. Here we estimated the effective $V_{th}$ of HTFET from the linear extrapolation of $I_{ds}$-$V_{gs}$ for and overdrive voltage and transistor sizing estimation in the analog component.

TABLE 9

| | n-HTFET | "real" p-HTFET | Si FinFET |
|---|---|---|---|
| Threshold Voltage |$V_{th}$| | 0.12 V | 0.13 V | 0.25 V |
| Subthreshold slope (SS) | 30 mV/dec | 55 mV/dec | 65 mV/dec |
| $\|g_{ds}\|$ ($\|V_{gs}\| = \|V_{ds}\| = 0.30$ V) | 177 μS/μm | 23.2 μS/μm | 8.97 μS/μm |
| $\|g_m\|$ ($\|V_{gs}\| = \|V_{ds}\| = 0.30$ V) | 1.57 mS/μm | 1.04 mS/μm | 0.18 mS/μm |
| $\|g_m/I_{ds}\|$ ($\|I_{ds}\| = 10$ μA/μm, $\|V_{ds}\| = 0.30$ V) | 43 V$^{-1}$ | 35 V$^{-1}$ | 27 V$^{-1}$ |

TABLE 9-continued

| | n-HTFET | "real" p-HTFET | Si FinFET |
|---|---|---|---|
| On-current $I_{on}$ ($V_{DD} = 0.30$ V) | 114 μA/μm | 52.7 μA/μm | 6.20 μA/μm |
| Off-current $I_{off}$ ($V_{DD} = 0.30$ V) | 2.4 nA/μm | 1.35 nA/μm | 3.3 nA/μm |
| $f_T$ ($V_{DD} = 0.30$ V) | 377 GHz | 331 GHz | 140 GHz |
| Noise Power $S_{Id}/i_D^2$ ($\|V_{gs}\| = \|V_{ds}\| = 0.30$ V) @ 10 GHz | 9.07e–15 Hz$^{-1}$ | 2.02e–14 Hz$^{-1}$ | 1.15e–13 Hz$^{-1}$ |

Circuit design using HTFET requires certain modifications due to the change in the device architecture and characteristics. The asymmetrical source/drain of HTFET results in the uni-directional conduction characteristic, which requires the modification of pass transistor logic, latches, flip-flops, etc. The low effective $V_{th}$ due to the steep SS of HTFET also requires re-design of the comparator reference voltage and bias current circuitry to fulfill the timing difference. Disclosed herein are the detailed design modifications, sizing strategies, and performance analyses of each digital and analog block for the HTFET 6-bit SAR ADC.

Figure 47A:
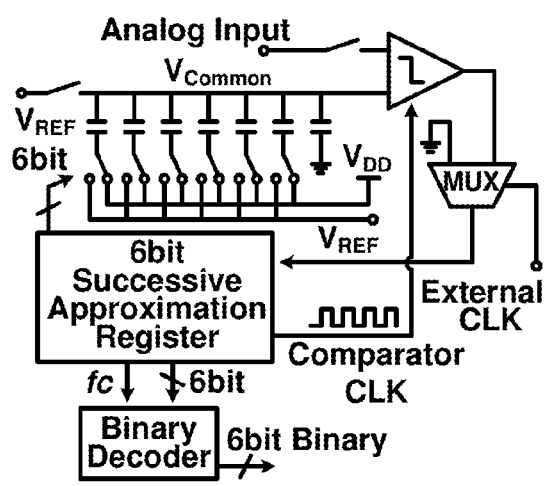
FIG. 47a is a principle block of a 6 bit SAR ADC.
Figure 47B:
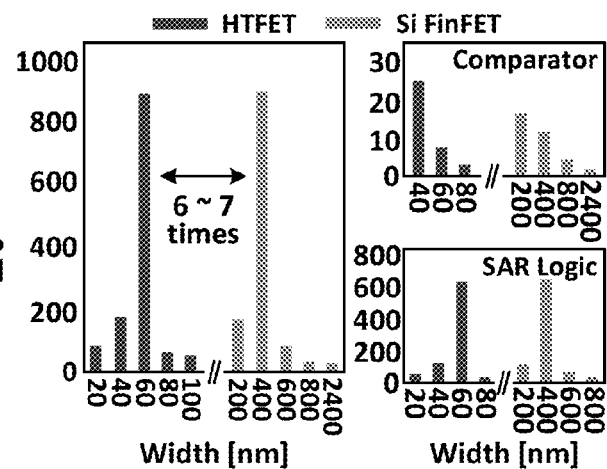
FIG. 47b shows transistor sizing comparisons of total transistor count v. device width and sizing strategy for certain analog and digital blocks.

FIG. 47a shows the principal blocks of HTFET 6-bit SAR ADC including the sample-and-hold (S/H) circuit, comparator, self-determined SAR control logic and switched capacitor array operating as the feedback digital-to-analog converter (DAC).

The key challenge of designing SAR ADC using Si FinFET at a low $V_{DD}$ is the accurate operation of the analog blocks (comparator and DAC) with the insufficient drive current at near-/sub-threshold. To meet the timing requirement in digital blocks and to compensate the voltage headroom reduction due to a low $V_{DD}$, we size-up Si FinFET 6~7 times wider than HTFET in most of the SAR ADC block design. Some sizing adjustment in certain transistors is applied to realize the circuit functionality.

The device models with/without the electrical noise (flicker, shot, and thermal) are described as the "non-ideal"/"ideal" models for both HTFET and Si FinFET, while the "real"/"pseudo" p-HTFETs are used in the "non-ideal"/"ideal" HTFET, respectively. To explore the HTFET benefits at a low $V_{DD}$, we focus on $V_{DD}$=0.30 V, 0.40 V and 0.50 V for circuit implementation at fixed $f_s$=10 MS/s.

A two-stage dynamic comparator in FIG. 48a was used due to its zero static biasing with double-gain stage to operate at a low $V_{DD}$. Due to the steep slope characteristic of HTFET at a low $V_{DD}$, the simulated input offset voltage of the HTFET comparator is only 0.9 mV, which is much less than 9.5 mV in the Si FinFET comparator. Nodes DN and DP are precharged "high" while Qb and Q stay "low". A rising clock edge triggers the tail transistor for discharging nodes DN and DP according to the differential input ($V_{IN-}$–$V_{IN+}$) while nodes Qb and Q determine the output.

FIG. 48b shows two orders of magnitude reduction in delay and less delay variation over a wide range of input voltage are observed in the HTFET comparator due to faster node voltage transition, which reduces the nonlinearity and the quantization error in ADC. With comparable off-state leakage for Si FinFET and HTFET, The Si FinFET comparator consumes higher dynamic power due to the increased capacitance from the up-sizing. Even though the enhanced on-state Miller capacitance effect of the HTFET in FIG. 48b causes slightly dynamic power increase, overall 3.5 times power reduction is achieved in the HTFET comparator over the Si FinFET comparator.

The feedback DAC is implemented with a binary-scaled charge-distribution topology. Digital bits ($D_0$-$D_5$) from SAR drive the bottom of capacitors to generate the output of DAC. An overall capacitance 76.6 fF is used in our design to meet the thermal noise (kT/C) limitation.

FIG. 47a and FIG. 49 show the SAR logic block as the main digital block, which generates the relevant control bits ($D_0$-$D_5$) from tracing the output of comparator. To avoid using an external frequency generator, SAR is constructed with D Flip-Flops (DFFs), and the clock-manage logic utilizes the enable signal from/to the comparator to generate internal clock signals. The binary decoder in FIG. 47a is used to convert binary-scaled control bits into binary codes. It accepts control bits and an internal synchronous clock signal $f_c$ (from SAR logic to generate the binary outputs).

Figures 50A, 50B:
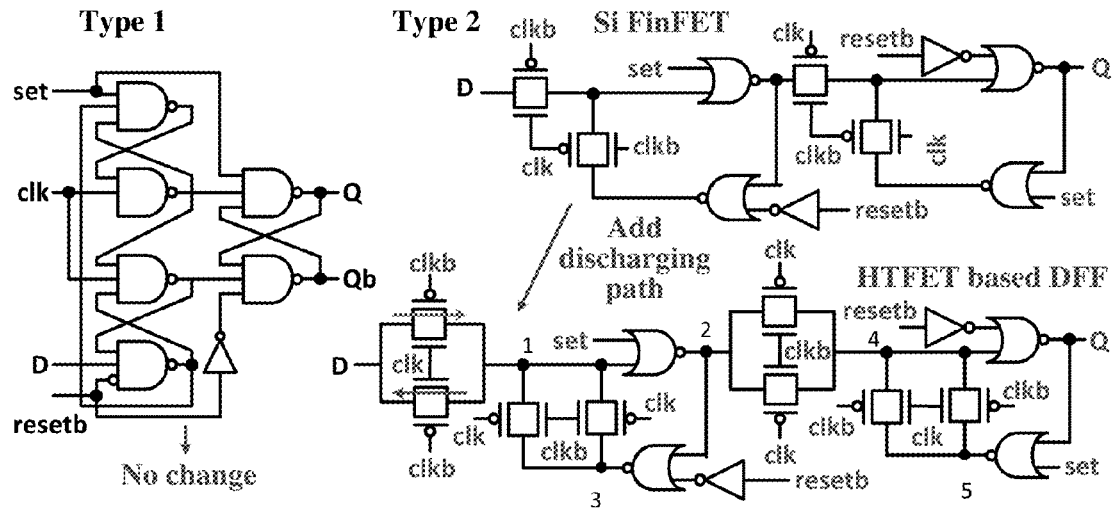
FIGS. 50a and 50b show a Type I DFF schematic without topology changes, and a Type II DFF schematic including additional transistor gates embodying the present invention, respectively.
Figures 51A, 51B:
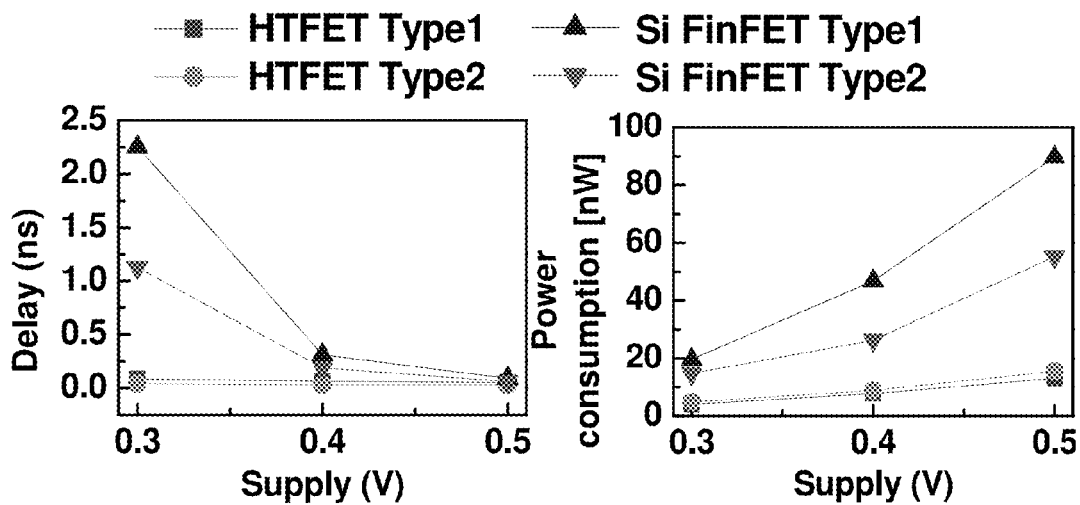
FIGS. 51a and 51b shows a comparison between two Type I and Type II HTFET DFFs and Type 1 and Type 2 Si FinFET DFFs with respect to delay and power consumption, respectively.

Since DFF is the main component of digital blocks in SAR logic, the power reduction of the HTFET DFF dominates the overall power reduction of ADC. Two types of DFF designs are evaluated for energy efficiency optimization for SAR logic as shown in FIGS. 50a and 50b. The HTFET logic gate DFF (Type 1) requires no design change, while the HTFET transmission gate DFF (Type 2) requires additional transistors for charging/dis-charging of internal nodes due to its uni-directional conduction. Still, the HTFET DFF outperforms the Si FinFET DFF with lower power and delay. Between two types of DFF designs, type 1 DFF was utilized in this ADC design because type 1 DFF exhibits balanced performance, as shown in FIGS. 51a and 51b, in terms of delay and power consumption. Due to the 20 times current improvement of HTFET over Si FINFET at the low $V_{DD}$ limit, both analog and digital blocks show 6 times reduction in transistor size and 3 times reduction in power consumption.

Figure 52A:
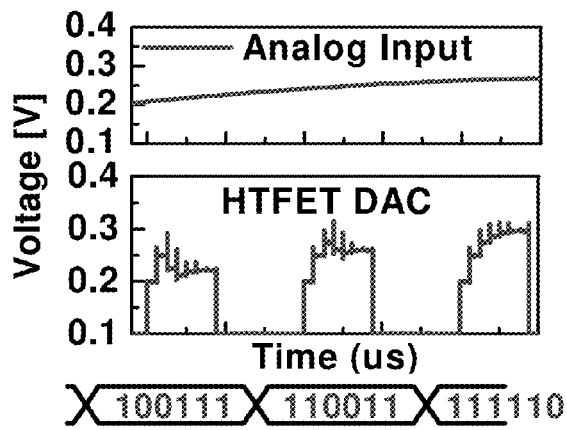
FIGS. 52a and 52b show analog input and DAC output waveform analyses and output digits evaluation comparisons between HTFET and Si FinFET ADCs (at $V_{DD}$=0.30V), respectively.
Figure 52B:
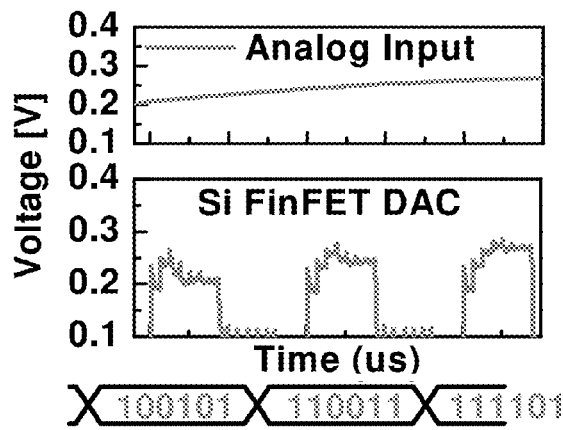
Figure 53A:
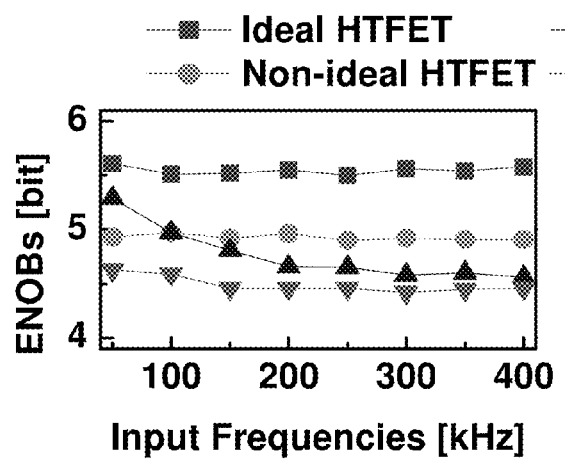
Figure 53B:
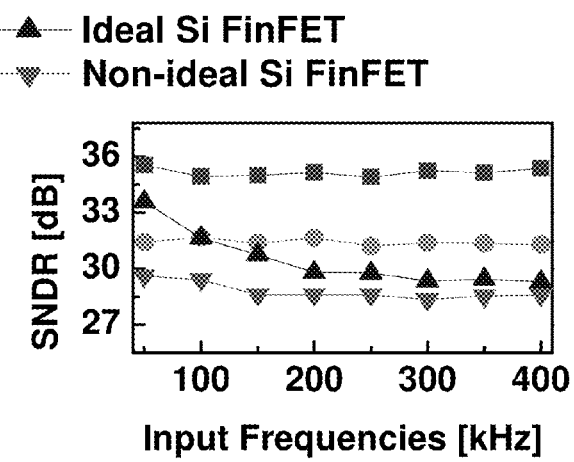

The single-ended SAR ADC design accepts an analog input ranging from 0 V to $V_{DD}$ as a full-scaled input voltage. FIGS. 52a and 52b present the input waveform and digitized DAC output of both HTFET and Si FinFET ADCs at 0.30 V, where the HTFET ADC shows clear transitions of voltage steps as compared to Si FinFET ADC. An improved effective number of bits (ENOB) and SNDR with respect to the analog input frequency and supply voltage are achieved in the HTFET ADC for both ideal and non-ideal cases as shown in FIGS. 53a-d, due to the improved device drive strength at a low $V_{DD}$ as compared to the Si FinFET design. The HTFET ADC shows higher ENOB and SNDR compared to Si FinFET ADC. A continuous degradation with respect to the input frequency is observed for the Si FinFET design, due to the increased quantization errors with the increased nonlinearity. Degradations of SNDR and ENOB in non-ideal cases are observed for both Si FinFET and HTFET designs as compared with ideal cases, rising from the existence of electrical noise and increased quantization errors. Since flicker noise is dominant in megahertz frequency range (where white noise can be neglected), the reduced flicker noise in HTFET leads to a slower degradation of ENOB and SNDR at lower input frequency as compared to the Si FinFET ADC.

Energy per conversion-step has been widely used as figure of merit (FoM) of ADCs. As shown in FIG. 53d, a FoM of 0.51 fJ/conversion-step is achieved in the HTFET ADC at 0.30 V, which is 3.4 times lower than 1.72 fJ/conversion-step of the Si FinFET ADC. FIG. 54 presents the differential nonlinearity (DNL) and the integral nonlinearity (INL) performance. The HTFET ADC shows the maximum +0.90/−2.1 LSB (DNL) and +1.0/−2.5 LSB (INL), which are 35.2% (DNL) and 5.2% (INL) lower compared to the Si FinFET ADC. This comes from the improved bit decisions of the HTFET comparator at very low input offset, as well as improved linearity due to the high drive current strength of HTFET. It is consistent with FIG. 52, where the output of DAC of HTFET shows reduced nonlinearity during sampling and amplification. The static nonlinearity can be further improved with the calibration block and differential auto-zeroing DAC topology for the reduction of offset. The performance metrics are summarized in Table 10 at different $V_{DD}$.

TABLE 10

|  | HTFET SAR ADC | | | Si FinFET SAR ADC | | |
| --- | --- | --- | --- | --- | --- | --- |
| $V_{DD}$ [V] | 0.30 | 0.40 | 0.50 | 0.30 | 0.40 | 0.50 |
| Power [μW] | 0.25 | 0.51 | 0.90 | 0.67 | 1.52 | 3.15 |
| SNDR_ideal [dB] | 35.5 | 35.8 | 36.8 | 33.6 | 34.3 | 35.7 |
| SNDR_non-ideal [dB] | 31.4 | 33.5 | 34.6 | 28.6 | 30.9 | 33.5 |
| ENOB_ideal [bit] | 5.61 | 5.65 | 5.83 | 5.29 | 5.40 | 5.64 |
| ENOB_non-ideal [bit] | 4.93 | 5.29 | 5.46 | 4.46 | 4.83 | 5.26 |
| FoM_ideal [fJ/conversionstep] | 0.51 | 1.02 | 1.58 | 1.72 | 3.60 | 6.32 |
| FoM_non-ideal [fJ/conversion-step] | 0.43 | 0.71 | 1.03 | 1.65 | 3.04 | 5.26 |
| Ideal P/fs [×$10^6$] | 6.01 | 12.4 | 21.8 | 16.4 | 37.0 | 76.6 |
| Non-ideal P/fs [×$10^6$] | 3.19 | 6.76 | 11.0 | 8.84 | 21.0 | 49.0 |

Figure 55:
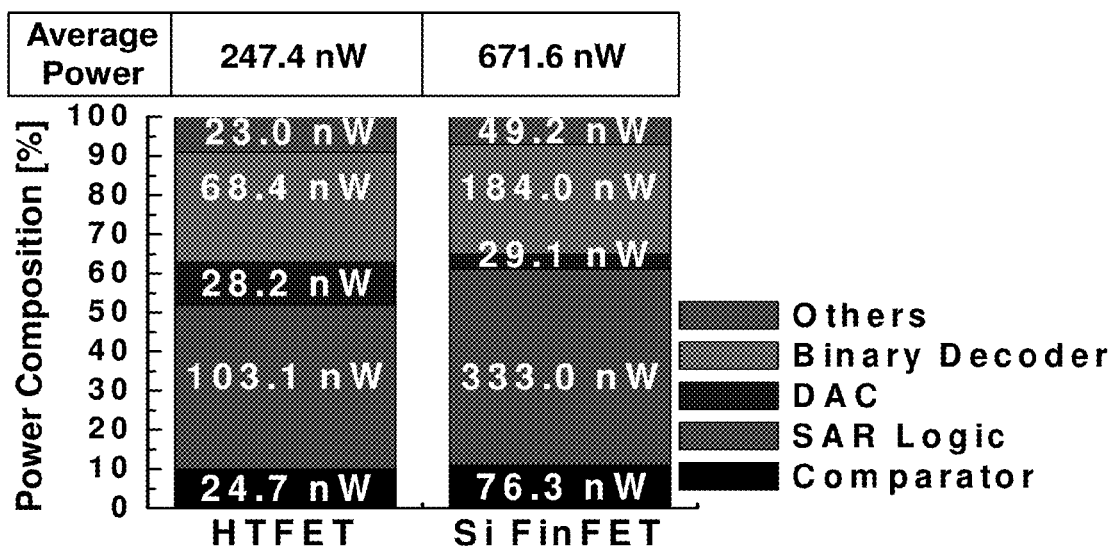
FIG. 55 shows HTFET ADC and Si FinFET SAR ADC power analyses for analog and digital blocks at $V_{DD}$=0.30 V.
Figure 56:
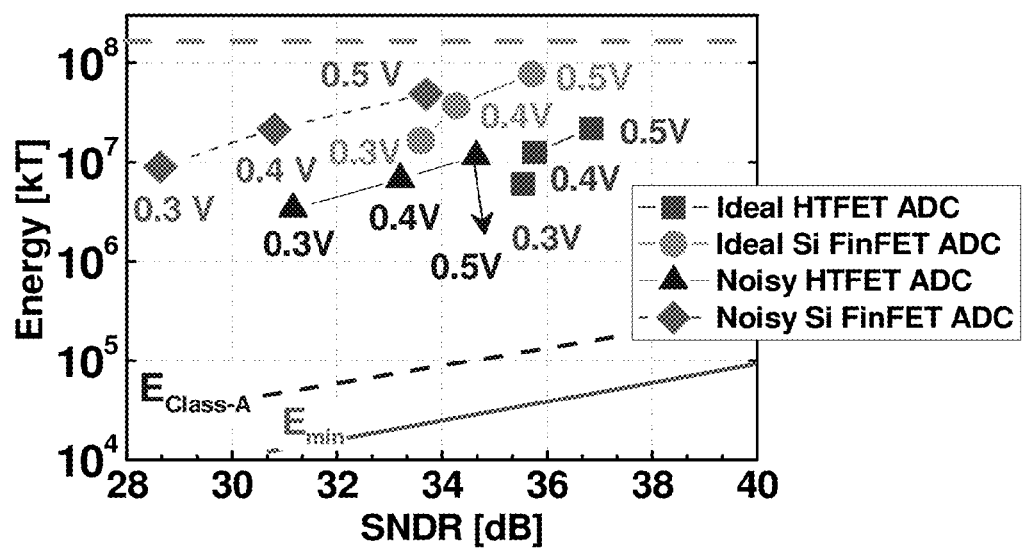
FIG. 56 shows energy (P/$f_s$) metrics for HTFET and Si FinFET ADCs.

Power analysis (See FIG. 55) shows 3 times power reduction in majority of the digital and analog blocks in the HTFET over the Si FinFET ADCs, with SAR logic block being the most power hungry component. Energy (P/$f_s$) metrics for HTFET and Si FinFET ADCs are presented in FIG. 56. The energy for both ADC designs is lower than the current technology boundary due to scaling and device performance improvement (for the Si FinFET and the HTFET). The energy consumption is between 16.4×$10^6$ kT and 76.6×$10^6$ kT in the range of 33.5 and 35.7 dB of SNDR, respectively, for the Si FinFET ADC design. The HTFET ADC shows remarkable reduction in energy ranging from 6.08×$10^6$ to 21.8×$10^6$ kT with higher a SNDR range of 35.6-36.4 dB, resulting from resizing of devices and higher $g_m/I_{ds}$ at a low $V_{DD}$. The HTFET ADC design offers promise for further energy reduction capability and SNDR improvement toward the noise limit with improved energy efficiency.

RF-Powered System Using TFTET-Based Devices

FIG. 57 shows the structure of an RF-powered system that may be generated with the steep-slope TFET components described above. When steep-slope TFETs are used in the design of RF-powered systems, both the PCE of power harvesters and the power-efficiency of signal processing blocks can be improved significantly. Such improvements can enable new wireless applications such as, for example, insect behavior monitoring, implantable medical devices and swarms of computational sensors.

The RF-powered system may include a power harvesting and management block, an analog/RF front end and digital processing/storage block, and at least one sensor. The DC-DC converter may be used to boost the output voltage of the rectifier, the low dropout regulator (LDO) may be used to keep the supply voltage stable and less noisy, and the on-chip energy storage (e.g., a capacitor) may be used to enable transient large current. Various configurations of the components of the management block may be used to achieve desired functionalities and/or accommodate desired applications.

The second block of the RF-powered system may include some blocks that are necessary only in specific applications. For example, the receiver, demodulator, amplifier, and the data storage depend on the function of the system. Back-scattering-based transmitters are widely used to guarantee low-power consumption, reaching <10 pJ/bit. When generating the local clock, a trade-off exists between the large tuning range, high phase noise of ring oscillators and the large area, small tuning range, relatively higher power of LC oscillators. Recent works exploit the RF input signal as a reference frequency to generate a different carrier frequency to transmit the data, which avoids the use of a local crystal oscillator, achieves highly integrated low-cost wireless transceivers, and also eliminates the "self-jamming" problem presented to RFID readers by the backscattering solution.

Figure 58:
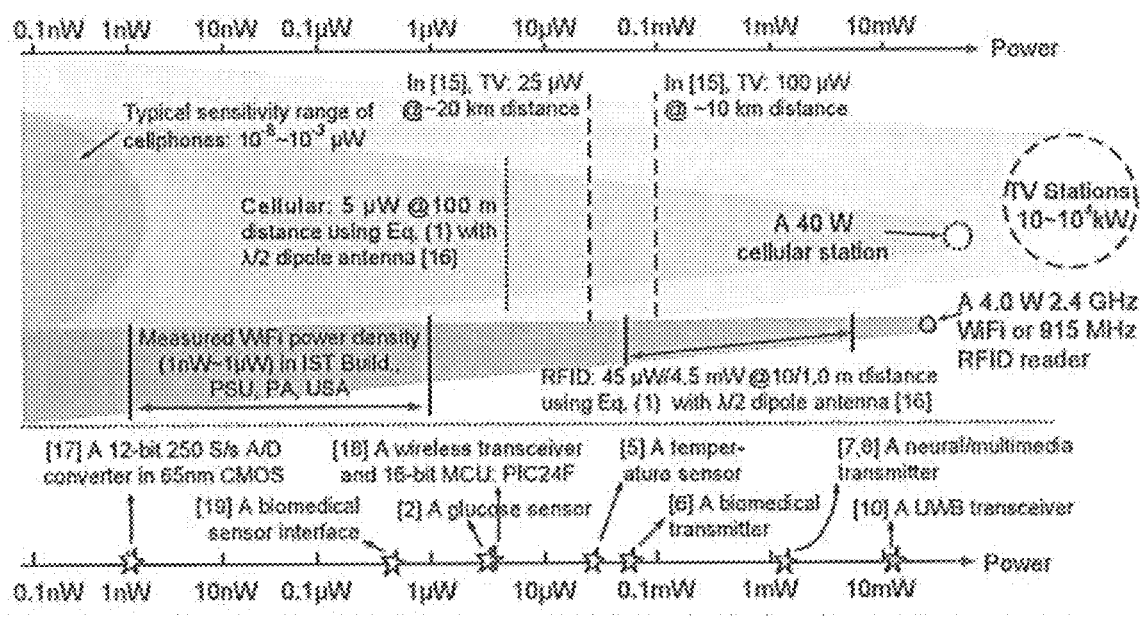

FIG. 58 summarizes sensed ambient RF power densities typically encountered in comparison with typical circuit power consumptions (assuming ideal impedance match between the antenna and the power harvesting circuit). Existing RF-powered systems have limited operational range and computational capability due to the limited ambient RF power that can be harvested from the ambient environment. One of the reasons for this is the low PCE of energy scavenging components of the RF-powered system when attempting to harvest power from the limited ambient RF power. For example, with a wireless several-watt RF signal transmitter, existing RFID tags typically have an operational range of only a few meters. Furthermore, their sensing, identification, and/or transmission functions may have to be abridged due to the limited ambient RF power.

In recent years, many RF-powered applications have emerged, including battery chargers, wideband transceivers, and various sensing systems with temperature sensors, pressure sensors, neural sensors, and glucose sensors. (See Table 11).

These systems harvest power from RF signals in the ultra-high frequency (UHF) band, and the consumed power ranges from a few micro watts for low-power biomedical sensors to higher than ten milliwatts for a high-speed UWB transceiver with a data rate up to 112 Mbps. The operational ranges of the systems in Table 11 are restricted by the system power consumption and low power-harvesting efficiency. In order to calculate the harvested power by the receiver antenna Pr from RF signals, the Friis free-space transmission equation gives Pr at a distance d, with the transmitted power Pt:

$$P_r = P_t \cdot G_t \cdot G_r \cdot \eta_{harvester} \cdot (\lambda/4\pi d)^2 \quad (34)$$

From Equation (38), it can be easily derived that if the power-harvesting efficiency is doubled and the power consumed is halved, the operation range doubles, where Gt and Gr are the antenna gains with respect to an isotropic radiator of the transmitting and receiving antennas respectively, $\lambda$ is the wavelength, and $\eta_{harvester}$ is the PCE of the power harvester consisting of impedance matching network and RF-to-DC rectifier. It is assumed that the impedance matching is ideal to make sure the power obtained by the antenna is absoR$_b$ed by the subsequent rectifier, which converts RF input signal to DC output voltage. Note that the received power Pr decreases with the square of the frequency and the distance d. Also, the ideal size of a certain type of antenna is proportional to $\lambda$. If it cannot be satisfied by some size restricted applications, the harvested power would be less.

By employing components configured with steep-slope TFETs within the power harvester and management block and/or digital processing and storage block, the applicability of the RF-powered system may be widened due to the mitigating effects of the impact of insufficient harvested power. For example using any one of the TFET-based rectifier and the TFET-based DC-DC charge pump converter may significantly increase the power harvesting capabilities of the RF-powered system. Additionally, using any one of the TFET-based amplifier and TFET-based SAR ADC converter may significantly increase the power efficiency of signal processing within the RF-powered system.

The exemplary embodiments of the present invention are not limited to the above-described examples and emphasized aspects but, rather, may appear in a large number of modifications that lie within the scope of handling by a person skilled in the art. It will be apparent to those skilled in the art that numerous modifications and variations of the

TABLE 11

| Year of publication | 2012 | 2012 | 2010 | 2011 | 2012 | 2014 | 2013 | 2011 |
|---|---|---|---|---|---|---|---|---|
| System function | Glucose sensor | Battery charging | Temperature sensor | Biomedical transmitter | Neural/EMG telemetry | Wireless transceiver | Audio/Image transmission | Wireless transceiver |
| RF signal sensitivity | 15 cm @ 10 W EIRP | / | −12 dBm | −6 dBm @ 918 MHz | 1.5 mm @ 4 W EIRP | −17.1 dBm | 4 m @ 4 W EIRP | 14 dBm @ 900 MHz |
| Carrier frequency | 1.8 GHz | 950 MHz | 900 MHz | 918 MHz, 306 MHz | 915 MHz | 915 MHz 2.45 GHz | 915 MHz | 7.9 GHz |
| Modulation scheme | FM-LSK | / | EPC | OOK | BPSK | FSK/OOK | BPSK | UWB |
| Process | 0.13 μm CMOS | 0.18 μm CMOS | 0.13 μm CMOS | 0.13 μm CMOS | 0.35 μm CMOS | 90 nm CMOS | PCB | 0.13 μm CMOS |
| Power consumption | 3 μW | / | 16-33 μW | 50.6 μW | 1.23 mW | 0.85 mW | 1.23 mW | 10.9 mW |
| Energy harvesting efficiency | 20% (peak) | 40% @ −11 dBm Input | 36.6% | 20-30% | 20.6% | / | 20.6% | / |
| Data rate | / | / | / | 4 Mbps | 5 Mbps | 5 Mbps | 5 Mbps | 112 Mbps | described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range, including the end points.

What is claimed is:

1. An RF powered system, comprising:
  a power harvesting and management block configured to receive an RF signal, including an impedance matching component configured to maximize power transfer from the received RF signal, a rectifier component configured to convert alternating current generated by the RF signal to direct current, a DC-DC converter component configured to boost output voltage of the rectifier component, and a voltage regulator configured to provide a constant output voltage, wherein the rectifier component comprises a stage including:
    a first rectifier TFET having a source, a gate, and a drain;
    a second rectifier TFET having a source, a gate, and a drain;
    a third rectifier TFET having a source, a gate, and a drain; and,
    a fourth rectifier TFET having a source, a gate, and a drain;
    wherein the first rectifier TFET is a N-type TFET;
    wherein the second rectifier TFET is a P-type TFET;
    wherein the third rectifier TFET is a N-type TFET;
    wherein the fourth rectifier TFET is a P-type TFET;
    wherein the source of the first rectifier TFET, the source of the second rectifier TFET, the gate of the third rectifier TFET, and the gate of the fourth rectifier TFET are connected at a first rectifier node;
    wherein the gate of the first rectifier TFET, the gate of the second rectifier TFET, the source of the third rectifier TFET and the source of the fourth rectifier TFET are connected at a second rectifier node;
    wherein the drain of the first rectifier TFET and the drain of the third rectifier TFET are connected at a third rectifier node; and,
    wherein the drain of the second rectifier TFET and the drain of the fourth rectifier TFET are connected at a fourth rectifier node; and,
  an analog/RF front end and digital storage/processing block configured to receive at least one of the RF signal via a receiver and sensor signal from a sensor, process at least one of the RF signal and the sensor signal, and transmit the at least one processed RF signal and sensor signal via a transmitter.

2. The RF-powered system recited in claim 1, wherein the analog/RF front end and digital storage/processing block is configured to receive the constant output voltage as a supply voltage.

3. The RF-powered system recited in claim 1, wherein at least one TFET is a HTFET.

4. The RF powered system recited in claim 1, wherein the DC-DC converter component comprises:
  a first DC-DC TFET, a second DC-DC TFET, a third DC-DC TFET, and a fourth DC-DC TFET, each having a source, a gate, and a drain;
  wherein the first DC-DC TFET and the second DC-DC TFET are N-type TFETs, and the third DC-DC TFET and the fourth DC-DC TFET are P-type TFETs;
  wherein the source of the first DC-DC TFET, the gate of the second DC-DC TFET, the source of the third DC-DC TFET, and a top plate of a first capacitor are connected to a first DC-DC node;
  wherein the gate of the first DC-DC TFET, the source of the fourth DC-DC TFET, and the source of the second DC-DC TFET are connected to a top plate of a second capacitor by way of a second DC-DC node;
  wherein the drain of the first DC-DC TFET and the drain of the second DC-DC TFET are connected to a third DC-DC node configured to receive an input voltage; and,
  wherein the drain of the third DC-DC TFET and the drain of the fourth DC-DC TFET are connected to a fourth DC-DC node configured to deliver an output voltage.

5. The RF powered system recited in claim 4, wherein the first and second capacitors are configured to connect to a two-phase generator.

6. An RF powered system, comprising:
  a power harvesting and management block configured to receive an RF signal, including an impedance matching component configured to maximize power transfer from the received RF signal, a rectifier component configured to convert alternating current generated by the RF signal to direct current, a DC-DC converter component configured to boost output voltage of the rectifier component, and a voltage regulator configured to provide a constant output voltage;
  an analog/RF front end and digital storage/processing block configured to receive at least one of the RF signal via a receiver and sensor signal from a sensor, process at least one of the RF signal and the sensor signal, and transmit the at least one processed RF signal and sensor signal via a transmitter, wherein the analog/RF front end and digital storage/processing block includes an amplifier component comprising:
    a first amplifier TFET, a second amplifier TFET, a third amplifier TFET, a fourth amplifier TFET, a fifth amplifier TFET, a sixth amplifier TFET, a seventh amplifier TFET, an eighth amplifier TFET, a ninth amplifier TFET, and a tenth TFET amplifier TFET, each having a source, a gate, and a drain;
    wherein the first amplifier TFET, the second amplifier TFET, the third amplifier TFET, the fourth amplifier TFET, the ninth amplifier TFET, and the tenth amplifier TFET are N-type TFETs, and the fifth amplifier TFET, the sixth amplifier TFET, the seventh amplifier TFET, and the eighth amplifier TFET are P-type TFETs;
    wherein the sources of the first amplifier TFET and the tenth amplifier TFET are connected to ground;
    wherein the sources of the first amplifier TFET and the second amplifier TFET and the drain of the ninth amplifier TFET are connected at a first amplifier node;
    wherein the gate of the first amplifier TFET is connected to a positive input port V+ and the gate of the second amplifier TFET is connected to a negative input port V−;
    wherein the gates of the third amplifier TFET and the fourth amplifier TFET are connected at a second amplifier node with a reference voltage Vb1;
    wherein the source of the third amplifier TFET is connected to the drain of the first amplifier TFET and the source of the fourth amplifier TFET is connected to the drain of the second amplifier TFET;

wherein the drains of the third amplifier TFET and the fifth amplifier TFET, and the gates of the fifth amplifier TFET, the sixth amplifier TFET, the seventh amplifier TFET, and the eighth amplifier TFET are connected at a third amplifier node;

wherein the drains of the sixth amplifier TFET and the fourth amplifier TFET are connected at a fourth amplifier node;

wherein the drain of the seventh amplifier TFET is connected to the source of the fifth amplifier TFET, and the drain of the eighth amplifier TFET is connected to the source of the sixth amplifier TFET;

wherein the sources of the seventh amplifier TFET and the eighth amplifier TFET are connected to a power supply $V_{DD}$; and, wherein the gate of the tenth amplifier TFET, the drain of the tenth amplifier TFET, and the gate of the ninth amplifier TFET are connected to receive a biasing current source at a fifth amplifier node.

7. The RF-powered system recited in claim 6, wherein the analog/RF front end and digital storage/processing block is configured to receive the constant output voltage as a supply voltage.

8. The RF-powered system recited in claim 6, wherein at least one TFET is a HTFET.

9. The RF-powered system recited in claim 6, further comprising a multi-channel recording architecture including at least one channel connected in parallel with the amplifier component, the at least one channel comprising:

an eleventh amplifier TFET, a twelfth amplifier TFET, a thirteenth amplifier TFET, and a fourteenth amplifier TFET, each having a source, a gate, and a drain;

wherein the eleventh amplifier TFET and the twelfth amplifier TFET are P-type TFETs;

wherein the thirteenth amplifier TFET and the fourteenth amplifier TFET are N-type TFETs;

wherein the eleventh amplifier TFET, the twelfth amplifier TFET, the thirteenth amplifier TFET, and the fourteenth amplifier TFET are connected in series, wherein the drain of the eleventh amplifier TFET is connected to the source of the twelfth amplifier TFET, the drain of the twelfth amplifier TFET is connected to the drain of the thirteenth amplifier TFET, and the source of the thirteenth amplifier TFET is connected to the drain of the fourteenth amplifier TFET; and, wherein the parallel connection between the at least one channel and the amplifier component is made by:

a connection between the source of the eleventh amplifier TFET and the source of the eighth amplifier TFET; and, a connection between the source of the fourteenth amplifier TFET and the source of the second amplifier TFET.

10. The RF-powered system recited in claim 6 further comprising a capacitive feedback topology with a pseudo resistor, the pseudo resister comprising:

a first pseudo-resistor TFET, a second pseudo-resistor TFET, a third pseudo-resistor TFET, and a fourth pseudo-resistor TFET, each having a source, a gate, and a drain;

wherein each TFET is an N-type TFET;

wherein the first pseudo-resistor TFET is connected in series with the second pseudo-resistor TFET, and the third pseudo-resistor TFET is connected in series with the fourth pseudo-resistor TFET;

wherein the first pseudo-resistor TFET and the second pseudo-resistor TFET are in parallel with the third pseudo-resistor TFET and the fourth pseudo-resistor TFET;

wherein the source of the first pseudo-resistor TFET is connected to the drain of the third pseudo-resistor TFET, and the drain of the first pseudo-resistor TFET is connected to the source of the second pseudo-resistor TFET;

wherein the drain of the second pseudo-resistor TFET is connected to the source of the fourth pseudo-resistor TFET, and the drain of the fourth pseudo-resistor TFET is connected to the source of the third pseudo-resistor TFET; and, wherein the first, second, third, and fourth pseudo-resistor TFETs are configured to exhibit a shorted source-gate connection.

11. The RF-powered system recited in claim 6, wherein the analog/RF front end and digital storage/processing block includes SAR D/C converter component comprising a logical circuit including:

a master stage, comprising:

a first transmission gate comprising an N-type TFET in parallel with a P-type TFET, the first transmission gate having an input for D-data-input, an input for clock, an input for clock-bar, and an output coupled to a first SAR node;

a second transmission gate comprising an N-type TFET in parallel with a P-type TFET, the second transmission gate having discharging path for the first SAR node, an input for clock, an input for clock-bar, and an input coupled to the first SAR node;

a first Nor gate with a first input coupled to the first SAR node, a second input with a master-set-input, and an output coupled to a second SAR node;

a second Nor gate with a first input coupled to the second SAR node, a second input coupled to an output of a master inverter, and an output coupled to a third SAR node, wherein the master inverter has an input for a slave reset-input-bar;

a third transmission gate comprising an N-type TFET in parallel with a P-type TFET, the third transmission gate having an input coupled to the third SAR node, an input for a clock, an input for clock-bar, and an output coupled to the first SAR node; and, a fourth transmission gate comprising an N-type TFET in parallel with a P-type TFET, the fourth transmission gate having an input coupled to the first SAR node, an input for clock, an input for clock-bar, and an output coupled to the third SAR node; and, a slave stage, comprising:

a fifth transmission gate comprising an N-type TFET in parallel with a P-type TFET, the fifth transmission gate having an input coupled to the second SAR node, an input for clock, an input for clock-bar, and an output coupled to a fourth SAR node;

a sixth transmission gate comprising an N-type TFET in parallel with a P-type TFET, the sixth transmission gate having input coupled to the fourth SAR node, an input for clock, an input for clock-bar, and an output coupled to the second SAR node;

a third Nor gate with a first input coupled to Q-output, a second input with a slave-set-input, and an output coupled to a fifth SAR node;

a fourth Nor gate with a first input coupled to the fourth SAR node, a second input coupled to an output of a slave inverter, and an output coupled to Q-output, wherein the slave inverter has an input for a slave reset-input-bar;

a seventh transmission gate comprising an N-type TFET in parallel with a P-type TFET, the seventh transmission gate having an input coupled to the fifth SAR node, an input for clock, an input for clock-bar, and an output coupled to the fourth SAR node; and, an eighth transmission gate comprising an N-type TFET in parallel with a P-type TFET, the eighth transmission gate having an input coupled to the first SAR node, an input for clock, an input for clock-bar, and an output coupled to the fifth SAR node.

12. An RF powered system, comprising:

a power harvesting and management block configured to receive an RF signal, including an impedance matching component configured to maximize power transfer from the received RF signal, a rectifier component configured to convert alternating current generated by the RF signal to direct current, a DC-DC converter component configured to boost output voltage of the rectifier component, and a voltage regulator configured to provide a constant output voltage;

wherein the rectifier component comprises a stage including:

a first rectifier TFET having a source, a gate, and a drain;

a second rectifier TFET having a source, a gate, and a drain;

a third rectifier TFET having a source, a gate, and a drain; and, a fourth rectifier TFET having a source, a gate, and a drain;

wherein the first rectifier TFET is a N-type TFET;

wherein the second rectifier TFET is a P-type TFET;

wherein the third rectifier TFET is a N-type TFET;

wherein the fourth rectifier TFET is a P-type TFET;

wherein the source of the first rectifier TFET, the source of the second rectifier TFET, the gate of the third rectifier TFET, and the gate of the fourth rectifier TFET are connected at a first rectifier node;

wherein the gate of the first rectifier TFET, the gate of the second rectifier TFET, the source of the third rectifier TFET and the source of the fourth rectifier TFET are connected at a second rectifier node;

wherein the drain of the first rectifier TFET and the drain of the third rectifier TFET are connected at a third rectifier node; and, wherein the drain of the second rectifier TFET and the drain of the fourth rectifier TFET are connected at a fourth rectifier node; and, wherein the DC-DC converter component comprises:

a first DC-DC TFET, a second DC-DC TFET, a third DC-DC TFET, and a fourth DC-DC TFET, each having a source, a gate, and a drain;

wherein the first DC-DC TFET and the second DC-DC TFET are N-type TFETs, and the third DC-DC TFET and the fourth DC-DC TFET are P-type TFETs;

wherein the source of the first DC-DC TFET, the gate of the second DC-DC TFET, the source of the third DC-DC TFET, and a top plate of a first capacitor are connected to a first DC-DC node;

wherein the gate of the first DC-DC TFET, the source of the fourth DC-DC TFET, and the source of the second DC-DC TFET are connected to a top plate of a second capacitor by way of a second DC-DC node;

wherein the drain of the first DC-DC TFET and the drain of the second DC-DC TFET are connected to a third DC-DC node configured to receive an input voltage; and, wherein the drain of the third DC-DC TFET and the drain of the fourth DC-DC TFET are connected to a fourth DC-DC node configured to deliver an output voltage and, an analog/RF front end and digital storage/processing block configured to receive at least one of the RF signal via a receiver and sensor signal from a sensor, process at least one of the RF signal and the sensor signal, and transmit the at least one processed RF signal and sensor signal via a transmitter, wherein the analog/RF front end and digital storage/processing block includes an amplifier component and a SAR D/C converter component;

wherein the amplifier component comprises:

a first amplifier TFET, a second amplifier TFET, a third amplifier TFET, a fourth amplifier TFET, a fifth amplifier TFET, a sixth amplifier TFET, a seventh amplifier TFET, an eighth amplifier TFET, a ninth amplifier TFET, and a tenth TFET amplifier TFET, each having a source, a gate, and a drain;

wherein the first amplifier TFET, the second amplifier TFET, the third amplifier TFET, the fourth amplifier TFET, the ninth amplifier TFET, and the tenth amplifier TFET are N-type TFETs, and the fifth amplifier TFET, the sixth amplifier TFET, the seventh amplifier TFET, and the eighth amplifier TFET are P-type TFETs;

wherein the sources of the first amplifier TFET and the tenth amplifier TFET are connected to ground;

wherein the sources of the first amplifier TFET and the second amplifier TFET and the drain of the ninth amplifier TFET are connected at a first amplifier node;

wherein the gate of the first amplifier TFET is connected to a positive input port V+ and the gate of the second amplifier TFET is connected to a negative input port V−;

wherein the gates of the third amplifier TFET and the fourth amplifier TFET are connected at a second amplifier node with a reference voltage Vb1;

wherein the source of the third amplifier TFET is connected to the drain of the first amplifier TFET and the source of the fourth amplifier TFET is connected to the drain of the second amplifier TFET;

wherein the drains of the third amplifier TFET and the fifth amplifier TFET, and the gates of the fifth amplifier TFET, the sixth amplifier TFET, the seventh amplifier TFET, and the eighth amplifier TFET are connected at a third amplifier node;

wherein the drains of the sixth amplifier TFET and the fourth amplifier TFET are connected at a fourth amplifier node;

wherein the drain of the seventh amplifier TFET is connected to the source of the fifth amplifier TFET, and the drain of the eighth amplifier TFET is connected to the source of the sixth amplifier TFET;

wherein the sources of the seventh amplifier TFET and the eighth amplifier TFET are connected to a power supply $V_{DD}$; and, wherein the gate of the tenth amplifier TFET, the drain of the tenth amplifier TFET, and the gate of the ninth amplifier TFET are connected to receive a biasing current source at a fifth amplifier node;

wherein the SAR D/C converter component comprises a logical circuit including:
a master stage, comprising:
a first transmission gate comprising an N-type TFET in parallel with a P-type TFET, the first transmission gate having an input for D-data-input, an input for clock, an input for clock-bar, and an output coupled to a first SAR node;
a second transmission gate comprising an N-type TFET in parallel with a P-type TFET, the second transmission gate having discharging path for the first SAR node, an input for clock, an input for clock-bar, and an input coupled to the first SAR node;
a first Nor gate with a first input coupled to the first SAR node, a second input with a master-set-input, and an output coupled to a second SAR node;
a second Nor gate with a first input coupled to the second SAR node, a second input coupled to an output of a master inverter, and an output coupled to a third SAR node, wherein the master inverter has an input for a slave reset-input-bar;
a third transmission gate comprising an N-type TFET in parallel with a P-type TFET, the third transmission gate having an input coupled to the third SAR node, an input for a clock, an input for clock-bar, and an output coupled to the first SAR node; and,
a fourth transmission gate comprising an N-type TFET in parallel with a P-type TFET, the fourth transmission gate having an input coupled to the first SAR node, an input for clock, an input for clock-bar, and an output coupled to the third SAR node; and,
a slave stage, comprising:
a fifth transmission gate comprising an N-type TFET in parallel with a P-type TFET, the fifth transmission gate having an input coupled to the second SAR node, an input for clock, an input for clock-bar, and an output coupled to a fourth SAR node;
a sixth transmission gate comprising an N-type TFET in parallel with a P-type TFET, the sixth transmission gate having input coupled to the fourth SAR node, an input for clock, an input for clock-bar, and an output coupled to the second SAR node;
a third Nor gate with a first input coupled to Q-output, a second input with a slave-set-input, and an output coupled to a fifth SAR node;
a fourth Nor gate with a first input coupled to the fourth SAR node, a second input coupled to an output of a slave inverter, and an output coupled to Q-output, wherein the slave inverter has an input for a slave reset-input-bar;
a seventh transmission gate comprising an N-type TFET in parallel with a P-type TFET, the seventh transmission gate having an input coupled to the fifth SAR node, an input for clock, an input for clock-bar, and an output coupled to the fourth SAR node; and,
an eighth transmission gate comprising an N-type TFET in parallel with a P-type TFET, the eighth transmission gate having an input coupled to the first SAR node, an input for clock, an input for clock-bar, and an output coupled to the fifth SAR node.

13. The RF-powered system recited in claim 12, wherein the analog/RF front end and digital storage/processing block is configured to receive the constant output voltage as a supply voltage.

14. The RF-powered system recited in claim 12, wherein at least one TFET is a HTFET.

15. The RF powered system recited in claim 12, wherein the first and second capacitors are configured to connect to a two-phase generator.

16. The RF-powered system recited in claim 12, further comprising multi-channel recording architecture including at least one channel connected in parallel with the amplifier component, the at least one channel comprising:
an eleventh amplifier TFET, a twelfth amplifier TFET, a thirteenth amplifier TFET, and a fourteenth amplifier TFET, each having a source, a gate, and a drain;
wherein the eleventh amplifier TFET and the twelfth amplifier TFET are P-type TFETs;
wherein the thirteenth amplifier TFET and the fourteenth amplifier TFET are N-type TFETs;
wherein the eleventh amplifier TFET, the twelfth amplifier TFET, the thirteenth amplifier TFET, and the fourteenth amplifier TFET are connected in series, wherein the drain of the eleventh amplifier TFET is connected to the source of the twelfth amplifier TFET, the drain of the twelfth amplifier TFET is connected to the drain of the thirteenth amplifier TFET, and the source of the thirteenth amplifier TFET is connected to the drain of the fourteenth amplifier TFET; and,
wherein the parallel connection between the at least one channel and the amplifier component is made by a connection between the source of the eleventh amplifier TFET and the source of the eighth amplifier TFET, a connection between the source of the fourteenth amplifier TFET and the source of the second amplifier TFET.

17. The RF-powered system recited in claim 12 further comprising a capacitive feedback topology with a pseudo resistor, the pseudo resister comprising:
a first pseudo-resistor TFET, a second pseudo-resistor TFET, a third pseudo-resistor TFET, and a fourth pseudo-resistor TFET, each having a source, a gate, and a drain;
wherein each TFET is an N-type TFET;
wherein the first pseudo-resistor TFET is connected in series with the second pseudo-resistor TFET, and the third pseudo-resistor TFET is connected in series with the fourth pseudo-resistor TFET;
wherein the first pseudo-resistor TFET and the second pseudo-resistor TFET are in parallel with the third pseudo-resistor TFET and the fourth pseudo-resistor TFET;
wherein the source of the first pseudo-resistor TFET is connected to the drain of the third pseudo-resistor TFET, and the drain of the first pseudo-resistor TFET is connected to the source of the second pseudo-resistor TFET;
wherein the drain of the second pseudo-resistor TFET is connected to the source of the fourth pseudo-resistor TFET, and the drain of the fourth pseudo-resistor TFET is connected to the source of the third pseudo-resistor TFET; and,
wherein the first, second, third, and fourth pseudo-resistor TFETs are configured to exhibit a shorted source-gate connection.

18. The RF-powered system recited in claim 12, further comprising a plurality of rectifier stages connected in parallel with each other.

19. The RF-powered system recited in claim 16, wherein at least one TFET is a HTFET.

20. The RF-powered system recited in claim 17, wherein at least one TFET is a HTFET.

\* \* \* \* \*